United States Patent
Park

(10) Patent No.: US 12,469,829 B2
(45) Date of Patent: Nov. 11, 2025

(54) DISPLAY DEVICE AND METHOD OF MANUFACTURING THE SAME

(71) Applicant: Samsung Display Co., LTD., Yongin-si (KR)

(72) Inventor: Jong Beom Park, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 543 days.

(21) Appl. No.: 17/952,039

(22) Filed: Sep. 23, 2022

(65) Prior Publication Data
US 2023/0260973 A1  Aug. 17, 2023

(30) Foreign Application Priority Data

Jan. 24, 2022 (KR) .................. 10-2022-0009871
Mar. 14, 2022 (KR) .................. 10-2022-0031694

(51) Int. Cl.
*H01L 25/075* (2006.01)
*H10H 20/01* (2025.01)
*H10H 20/857* (2025.01)

(52) U.S. Cl.
CPC ....... *H01L 25/0753* (2013.01); *H10H 20/857* (2025.01); *H10H 20/0364* (2025.01)

(58) Field of Classification Search
CPC .............. H01L 25/0753; H10H 20/857; H10H 20/0364; H10H 20/01
See application file for complete search history.

(56) References Cited

U.S. PATENT DOCUMENTS

| | | | |
|---|---|---|---|
| 11,056,630 B2 * | 7/2021 | Hong | H10H 29/49 |
| 2002/0130983 A1 * | 9/2002 | Konishi | G02F 1/13458 |
| | | | 349/43 |
| 2020/0259056 A1 * | 8/2020 | Hong | H01L 25/167 |
| 2022/0052080 A1 * | 2/2022 | Kim | H01L 25/167 |
| 2022/0208945 A1 * | 6/2022 | Lee | H10K 59/1315 |
| 2022/0208946 A1 * | 6/2022 | Kim | H01L 25/167 |
| 2022/0208951 A1 * | 6/2022 | Yoo | H10K 59/12 |
| 2022/0209183 A1 * | 6/2022 | Jeon | H10K 59/18 |
| 2022/0209186 A1 * | 6/2022 | Shim | H10K 50/844 |

(Continued)

FOREIGN PATENT DOCUMENTS

| | | | |
|---|---|---|---|
| KR | 10-2020-0081728 A | | 7/2020 |
| KR | 10-2020-0145809 A | | 12/2020 |

(Continued)

*Primary Examiner* — Victor A Mandala
(74) *Attorney, Agent, or Firm* — Womble Bond Dickinson (US) LLP

(57) ABSTRACT

A display device is provided. The display device includes a substrate including a first surface, a second surface opposite to the first surface, a first chamfered surface extending from one side of the first surface, a second chamfered surface extending from one side of the second surface, and a first side surface between the first chamfered surface and the second chamfered surface, a first pad on the first surface of the substrate, and an upper connection wiring on the first surface of the substrate, between the substrate and the first pad, electrically connected to the first pad, and including a first contact portion electrically connected to the first pad, and a first peeling portion extending from the first contact portion in a direction toward the first chamfered surface, and having a width that is less than a width of the first contact portion.

20 Claims, 36 Drawing Sheets

(56) References Cited

U.S. PATENT DOCUMENTS

| | | | |
|---|---|---|---|
| 2022/0238465 A1* | 7/2022 | Hosaka | H01L 25/0657 |
| 2023/0005962 A1* | 1/2023 | Lee | H01L 25/0753 |
| 2023/0238399 A1* | 7/2023 | Choi | H10D 86/60 |
| 2023/0238495 A1* | 7/2023 | Choi | H01L 25/0753 |
| | | | 257/79 |
| 2023/0268474 A1* | 8/2023 | Jeong | H10D 86/60 |
| | | | 257/79 |
| 2023/0326932 A1* | 10/2023 | Son | H10D 86/60 |
| 2023/0335700 A1* | 10/2023 | Hsu | H10H 20/857 |
| 2024/0021627 A1* | 1/2024 | Kim | H01L 24/06 |
| 2024/0038953 A1* | 2/2024 | Nakamitsu | H10H 20/857 |
| 2024/0153967 A1* | 5/2024 | Son | H01L 25/0753 |
| 2024/0170497 A1* | 5/2024 | Gong | H10H 29/10 |
| 2024/0347541 A1* | 10/2024 | Du | H10D 86/60 |

FOREIGN PATENT DOCUMENTS

| | | |
|---|---|---|
| KR | 10-2261929 B1 | 6/2021 |
| KR | 10-2021-0085596 A | 7/2021 |

* cited by examiner

Fig. 1
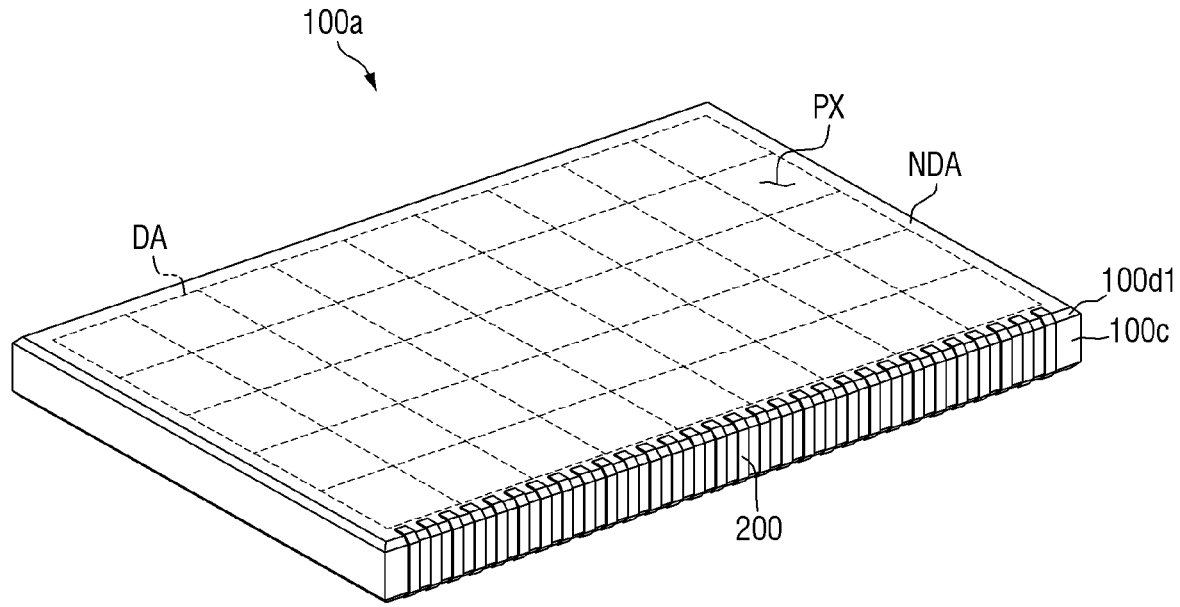
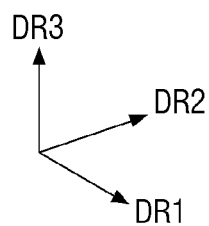
100: 100a, 100c, 100d1

Fig. 3
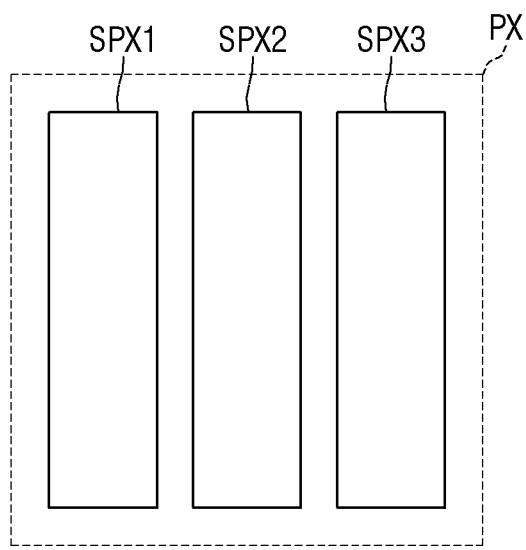
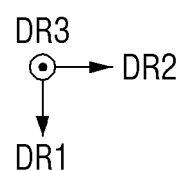

Fig. 4
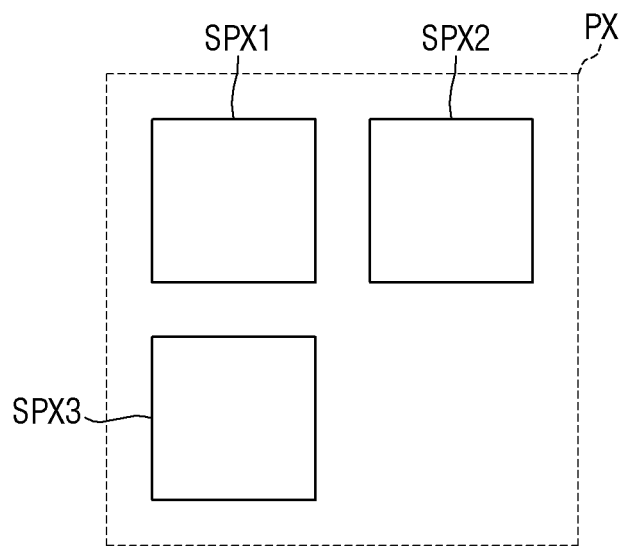
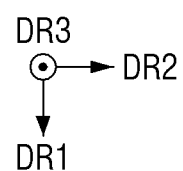

Fig. 27
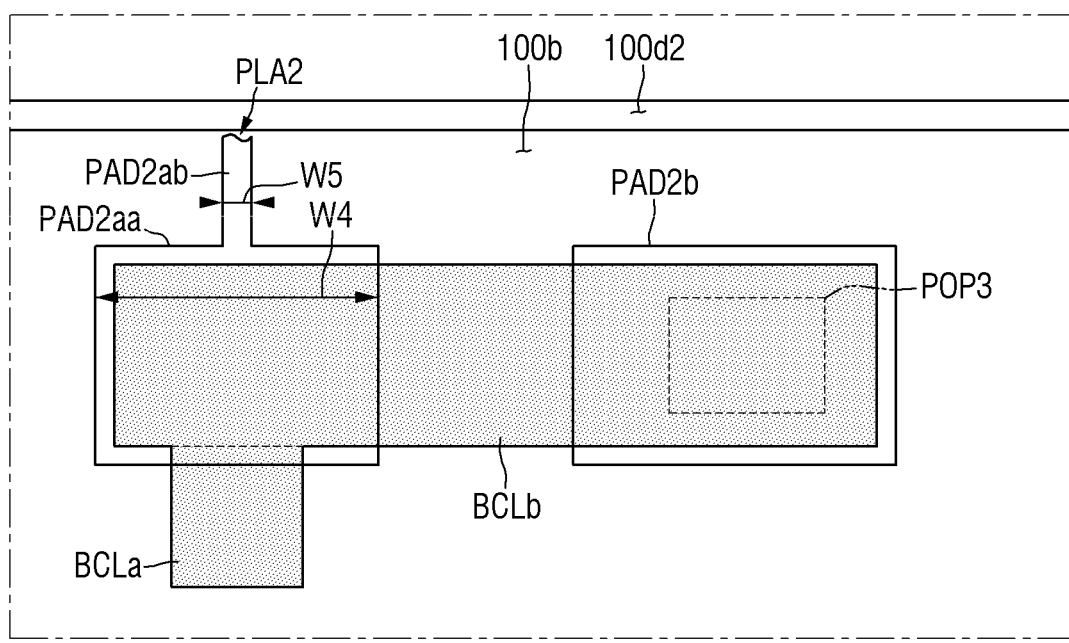
PAD2: PAD2a, PAD2b
PAD2a: PAD2aa, PAD2ab
BCL: BCLa, BCLb
200: 210, 230, 240b
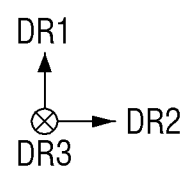

DISPLAY DEVICE AND METHOD OF MANUFACTURING THE SAME

CROSS-REFERENCE TO RELATED APPLICATION

This application claims priority to, and the benefit of, Korean Patent Application No. 10-2022-0031694 filed on Mar. 14, 2022 and No. 10-2022-0009871 filed on Jan. 24, 2022 in the Korean Intellectual Property Office, the disclosure of both of which being incorporated herein by reference in its entirety.

BACKGROUND

1. Field

The disclosure relates to a display device and a method of manufacturing the same.

2. Description of the Related Art

Electronic devices, such as smartphones, tablet personal computers (PCs), digital cameras, laptop computers, navigation devices, and smart televisions which provide images to users, include a display device for displaying an image.

The display device includes a display area capable of expressing various colors while operating in units of pixels or sub-pixels, and a bezel area in which wirings for driving pixels or sub-pixels are located.

Recently, a demand for a bezel-less technology for removing or reducing the bezel area to thereby increase or maximize the display area of the display device is increasing, and in response to this, research and development of a side wiring forming technology for forming wirings on a side surface of a substrate is steadily conducted.

SUMMARY

Aspects of the disclosure provide a display device with improved device reliability.

Aspects of the disclosure also provide a method of manufacturing the display device with improved device reliability.

It should be noted that aspects of the disclosure are not limited to the above-described aspects, and other aspects of the disclosure will be apparent to those skilled in the art from the following descriptions.

According to one or more embodiments of the disclosure a display device includes, a substrate including a first surface, a second surface opposite to the first surface, a first chamfered surface extending from one side of the first surface, a second chamfered surface extending from one side of the second surface, and a first side surface between the first chamfered surface and the second chamfered surface, a first pad on the first surface of the substrate, and an upper connection wiring on the first surface of the substrate, between the substrate and the first pad, electrically connected to the first pad, and including a first contact portion electrically connected to the first pad, and a first peeling portion extending from the first contact portion in a direction toward the first chamfered surface, and having a width that is less than a width of the first contact portion.

The first peeling portion may extend toward a boundary between the first surface and the first chamfered surface.

The display device may further include flip-chip type micro light-emitting diode (LED) elements on the first surface of the substrate.

The first surface may include a display area in which pixels are located, and a pad area positioned on one side of the display area, in which the first pad is located, and more adjacent to the first chamfered surface than the display area, wherein the upper connection wiring further includes a first wiring portion extending from the first contact portion in a direction toward the display area and electrically connected to the pixels.

The display device may further include first peeling portions that include the first peeling portion and that are spaced apart from each other.

The display device may further include a bottom connection wiring including a second peeling portion extending in the direction in which the first peeling portion extends.

The display device may further include a second pad on the second surface, and a side wiring on the first surface, the first chamfered surface, the first side surface, the second chamfered surface, and the second surface, and configured to electrically connect the first pad and the second pad.

The second pad may include a first portion overlapping the side wiring, and a second portion that is spaced apart from the first portion and does not overlap the side wiring, wherein the first portion of the second pad includes a second contact portion in contact with the side wiring, and a second peeling portion extending from the second contact portion in a direction toward the second chamfered surface, and having a width that is less than a width of the second contact portion.

The display device may further include a bottom connection wiring between the second pad and the second surface of the substrate, and electrically connecting the first portion and the second portion of the second pad.

According to one or more embodiments of the disclosure, a tiled display device includes display devices, and a seam part between the display devices, wherein a first display device among the display devices includes a substrate including a first surface, a second surface opposite to the first surface, a first chamfered surface extending from one side of the first surface, a second chamfered surface extending from one side of the second surface, and a first side surface connecting the first chamfered surface and the second chamfered surface, a light-emitting element on the first surface, a first pad on the first surface and spaced from the light-emitting element, and an upper connection wiring on the first surface between the substrate and the first pad, configured to electrically connect the first pad and the light-emitting element, and including a first contact portion electrically connected to the first pad, and a first peeling portion extending from the first contact portion in a direction toward the first chamfered surface and having a width that is less than a width of the first contact portion.

The light-emitting element may include a flip-chip type micro light-emitting diode (LED) element.

The substrate may include glass.

The first display device may further include a side wiring that is on the first surface, the second surface, and the first side surface of the substrate, and that is connected to the first pad.

The first display device may further include a bottom connection wiring on the second surface of the substrate, and a flexible film connected to the bottom connection wiring through a conductive adhesive member, and wherein the side wiring is connected to the bottom connection wiring.

The display devices may be arranged in matrix form.

According to one or more embodiments of the disclosure a display device manufacturing method includes preparing a mother substrate in which a scribing line defining cell areas is defined, forming an upper connection wiring pattern on an upper surface of the cell areas, forming a first pad on, and electrically connected to, the upper connection wiring pattern, scribing one of the cell areas from the mother substrate to obtain a cell substrate, and forming a chamfered surface by processing an edge of the cell substrate, wherein the upper connection wiring pattern includes a first contact portion electrically connected to the first pad, and a first peeling portion pattern extending from the first contact portion in a direction toward the scribing line and having a width that is less than a width of the first contact portion.

The forming of the chamfered surface may include forming a first peeling pattern at an end of the first peeling portion pattern by processing the end of the first peeling portion pattern.

The forming of the first peeling pattern at the end of the first peeling portion pattern may be performed concurrently with the processing of the edge of the cell substrate.

The forming of the upper connection wiring pattern and the forming the first pad may include forming a second pad pattern on a bottom surface of the cell areas of the mother substrate, wherein the second pad pattern includes a second peeling portion pattern extending in a direction toward the scribing line.

The forming of the chamfered surface may further include forming a second peeling pattern at an end of the second peeling portion pattern by processing the end of the second peeling portion pattern.

BRIEF DESCRIPTION OF THE DRAWINGS

The above and other aspects and features of the disclosure will become more apparent by describing embodiments thereof in detail with reference to the attached drawings, in which:

FIG. 1 is a perspective view illustrating a front surface of a display device according to one or more embodiments;

FIG. 3 is a view schematically illustrating a structure of a pixel of the display device according to one or more embodiments;

FIG. 4 is a view schematically illustrating a structure of a pixel of a display device according to one or more other embodiments;

FIGS. 18 to 28 are a flow chart and views for describing a method of manufacturing the display device according to one or more embodiments;

DETAILED DESCRIPTION

Figure 2:
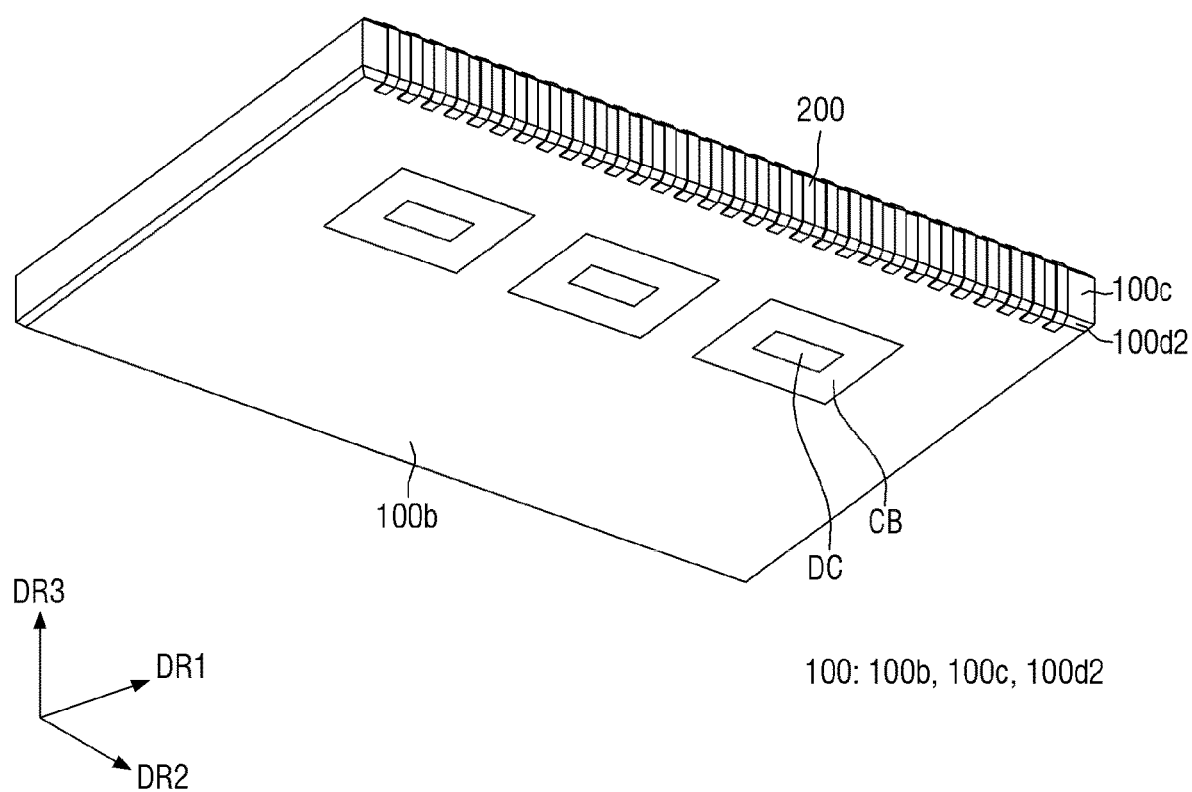
FIG. 2 is a perspective view illustrating a rear surface of the display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view illustrating a front surface of a display device according to one or more embodiments. FIG. 2 is a perspective view illustrating a rear surface of the display device according to one or more embodiments.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. The first direction DR1 may be understood to mean a vertical direction in the drawing, the second direction DR2 may be understood to mean a horizontal direction in the drawing, and the third direction DR3 may be understood to mean an upper and lower direction in the drawing, that is, a thickness direction. In the specification below, unless otherwise specified, the term "direction" may refer to both opposite directions toward both sides extending along the direction. In addition, when it is suitable to distinguish both "directions extending to both sides, the two directions are divided into one side and the other side, and will be referred to as one side and the other side of the direction, respectively. With reference to FIG. 1, a direction in which an arrow is directed is referred to as one side, and a direction opposite to the one side is referred to as the other side.

Hereinafter, for convenience of description, in describing surfaces of a display device 10 or each member constituting the display device 10, one surface facing one side in a direction in which an image is displayed, that is, one side of the third direction DR3 is referred to as an upper surface, and the other surface opposite to the one surface is referred to as a bottom surface. However, the disclosure is not limited thereto, and the one surface and the other surface of the member may also be referred to as a front surface and a rear surface, respectively, or may be referred to as a first surface or a second surface, respectively. Further, in describing a relative position of each member of the display device 10, one side in the third direction DR3 may be referred to as an upper portion, and the other side in the third direction DR3 may be referred to as a lower portion.

Referring to FIGS. 1 and 2, the display device 10 according to one or more embodiments may be applied to a portable electronic device, such as a mobile phone, a smartphone, a tablet personal computer (PC), a mobile communication terminal, an electronic organizer, an electronic book, a portable multimedia player (PMP), a navigation device, or an ultra-mobile PC. Alternatively, the display device 10 according to one or more embodiments may be applied as a display part of a television, a laptop computer, a monitor, a billboard, or an Internet-of-Things (IoT) device.

The display device 10 may be formed in a planar shape similar to a quadrangular shape. For example, as shown in FIG. 1, the display device 10 may have a planar shape that is similar to a quadrangular shape having short sides in the first direction DR1 and long sides in the second direction DR2. A corner at which the short side in the first direction DR1 meets the long side in the second direction DR2 may be rounded to have a certain curvature or formed at a right angle. The planar shape of the display device 10 is not limited to the quadrangular shape but may be formed similar to another polygonal shape, a circular shape, or an elliptical shape.

The display device 10 may include a display area DA in which a screen is on one side surface (hereinafter, referred to as an upper surface) in the third direction DR3, and a non-display area NDA, which is an area other than the display area DA and in which no image is displayed. For example, the non-display area NDA may be located on a portion of the upper surface of the display device 10, both side surfaces (hereinafter, referred to as side surfaces) of the display device 10 in the second direction DR2, both side surfaces of the display device 10 in the first direction DR1, and the other side surface (hereinafter, referred to as a bottom surface) of the display device 10 in the third direction DR3, but the disclosure is not limited thereto. In some embodiments, the non-display area NDA may be located to surround an edge of the display area DA, but the disclosure is not limited thereto. Meanwhile, the display area DA and the non-display area NDA of the display device 10 may also be applied to a substrate 100 to be described below.

According to one or more embodiments, the display device 10 may include the substrate 100, a plurality of pixels PX, a plurality of side wirings 200, and drivers, wherein each of the drivers may include a circuit board CB and a display driving circuit DC.

The substrate 100 may serve as a base of the display device 10. In some embodiments, the substrate 100 may be a rigid substrate having rigidity and may include glass, but the disclosure is not limited thereto. For example, the substrate 100 may also be a flexible substrate having flexibility and may include polyimide. Hereinafter, for convenience of description, it will be mainly described that the substrate 100 is a rigid substrate and includes glass.

The substrate 100 may have a three-dimensional shape similar to a rectangular parallelepiped, and may have a shape in which corners formed by an upper surface and side surfaces of the rectangular parallelepiped and corners formed by a bottom surface and the side surfaces thereof are bent. In other words, the substrate 100 may have a three-dimensional shape similar to a rectangular parallelepiped, and have a shape in which edges of the upper surface and the bottom surface are bent. In FIGS. 1 and 2, a case in which a chamfered surface is formed on each of both sides of the upper surface and the bottom surface of the substrate 100 in the first direction DR1 and the second direction DR2 is shown. In some embodiments, in the substrate 100, surfaces whose corners are bent (e.g., chamfered surfaces) may be formed on both sides of the upper and bottom surfaces in the first direction DR1 and the second direction DR2, but the disclosure is not limited thereto. For example, the chamfered surface may be formed only on one side of each of the upper and bottom surfaces of the substrate 100 in the first direction DR1. Hereinafter, for convenience of description, it will be mainly described that the chamfered surface is formed on each of both sides of the upper and bottom surfaces of the substrate 100 in the first direction DR1 and in the second direction DR2.

The substrate 100 may include a first surface 100a, a second surface 100b, a plurality of chamfered surfaces, and a plurality of side surfaces.

The first surface 100a may be the upper surface of the substrate 100. The first surface 100a may have a rectangular shape having short sides in the first direction DR1 and long sides in the second direction DR2.

The second surface 100b may be a surface that is opposite to the first surface 100a in the third direction DR3. The second surface 100b may be the bottom surface of the substrate 100. The second surface 100b may have a rectangular shape having short sides in the first direction DR1 and long sides in the second direction DR2.

The plurality of side surfaces may be surfaces located between the first surface 100a and the second surface 100b, and may be side surfaces of the substrate 100 in both the first direction DR1 and the second direction DR2. For convenience of description, among the plurality of side surfaces, the side surface located on one side of the first direction DR1 is referred to as a first side surface 100c, the side surface located on one side of the second direction DR2 is referred to as a second side surface, the side surface located on the other side of the first direction DR1 is referred to as a third side surface, and the side surface located on the other side of the second direction DR2 is referred to as a fourth side surface.

The plurality of chamfered surfaces refer to surfaces that are located between the first surface 100a and the plurality of side surfaces, and between the second surface 100b and the plurality of side surfaces, and are cut diagonally to reduce or prevent the likelihood of chipping defects occurring in the plurality of side wirings 200. Due to the plurality of chamfered surfaces, a bending angle of each of the plurality of side wirings 200 may be gentle (e.g., relatively oblique) so that it is possible to reduce or prevent the likelihood of chipping and cracks occurring in the plurality of side wirings 200. For convenience of description, among the plurality of chamfered surfaces, the chamfered surface located between the first surface 100a and the first side surface 100c is referred to as a first chamfered surface 100d1, the chamfered surface located between the second surface 100b and the first side surface 100c is referred to as a second chamfered surface 100d2, the chamfered surface located between the first surface 100a and the second side surface is referred to as a third chamfered surface, the chamfered surface located between the second surface 100b and the second side surface is referred to as a fourth chamfered surface, the chamfered surface located between the first surface 100a and the third side surface is referred to as a fifth chamfered surface, the chamfered surface located between the second surface 100b and the third side surface is referred to as a sixth chamfered surface, the chamfered surface located between the first surface 100a and the fourth side surface is referred to as a seventh chamfered surface, and the chamfered surface located between the second surface 100b and the fourth side surface is referred to as an eighth chamfered surface.

For example, the first chamfered surface 100d1 may extend from one side of the first surface 100a in the first direction DR1, the second chamfered surface 100d2 may extend from one side of the second surface 100b in the first direction DR1, and the first side surface 100c may connect the first chamfered surface 100d1 and the second chamfered surface 100d2. The third chamfered surface may extend from one side of the first surface 100a in the second direction DR2, the fourth chamfered surface may extend from one side of the second surface 100b in the second direction DR2, and the second side surface may connect the third chamfered surface and the fourth chamfered surface. The fifth chamfered surface may extend from the other side of the first surface 100a in the first direction DR1, the sixth chamfered surface may extend from the other side of the second surface 100b in the first direction DR1, and the third side surface may connect the fifth chamfered surface and the sixth chamfered surface. The seventh chamfered surface may extend from the other side of the first surface 100a in the second direction DR2, the eighth chamfered surface may extend from the other side of the second surface 100b in the second direction DR2, and the fourth side surface may connect the seventh chamfered surface and the eighth chamfered surface.

The plurality of pixels PX may be located on the first surface 100a of the substrate 100, and may display an image. The plurality of pixels PX may be arranged in a matrix form in the first direction DR1 and the second direction DR2. A structure of the plurality of pixels PX will be described below in detail.

Each of the plurality of side wirings 200 serves to connect a first pad PAD1 (see FIG. 7) located on the first surface 100a and a second pad PAD2 (see FIG. 8) located on the second surface 100b. The first pads PAD1 may be connected to data wirings that are connected to the plurality of pixels PX located on the first surface 100a of the substrate 100. The plurality of side wirings 200 may be arranged to be spaced apart from each other in the second direction DR2.

The plurality of side wirings 200 may be located on the first surface 100a (e.g., on a portion of the first surface 100a), on the second surface 100b (e.g., on a portion of the second surface 100b), on at least two chamfered surfaces among the plurality of chamfered surfaces, and on at least one side surface among the plurality of side surfaces. For example, as shown in FIGS. 1 and 2, the plurality of side wirings 200 may be located on the first surface 100a, the second surface 100b, the first chamfered surface 100d1, the second chamfered surface 100d2, and the first side surface 100c to connect the first pads PAD1 located on one side of the first surface 100a of the substrate 100 in the first direction DR1 to the second pads PAD2 located on one side of the second surface 100b in the first direction DR1. A shape of each of the plurality of side wirings 200 will be described below in detail.

In some embodiments, the plurality of side wirings 200 may be located only on one side of the substrate 100 in the first direction DR1, but the disclosure is not limited thereto. For example, the plurality of side wirings 200 may also be located on the other side of the substrate 100 in the first direction DR1, and one side or the other side of the substrate 100 in the second direction DR2. In this case, the first pads PAD1 located on the first surface 100a of the substrate 100 may also be additionally located on the other side of the substrate 100 in the first direction DR1, and on one side or the other side of the substrate 100 in the second direction DR2. In addition, the second pads PAD2 located on the second surface 100b of the substrate 100 may also be additionally located on the other side of the substrate 100 in the first direction DR1, and on one side or the other side of the substrate 100 in the second direction DR2. Hereinafter, for convenience of description, it will be mainly described that the plurality of side wirings 200 are located only on one side of the substrate 100 in the first direction DR1.

The circuit boards CB may be located on the second surface 100b of the substrate 100. Each of the circuit boards CB may be connected to third pads PAD3 (see FIG. 8) located on the second surface 100b of the substrate 100 using a conductive adhesive member, such as an anisotropic conductive film. As described below, because the third pads PAD3 are electrically connected to the second pads PAD2, respectively, the circuit board CB may be electrically connected to the first pads PAD1 through the side wirings 200. Each of the circuit boards CB may be a flexible printed circuit board, a printed circuit board, or a flexible film, such as a chip on film.

The display driving circuit DC may generate data voltages and may supply the data voltages to the data wirings, which extend from the pixels PX, through the circuit board CB, the third pads PAD3, the second pads PAD2, the plurality of side wirings 200, and the first pads PAD1. The display driving circuit DC may be formed as an integrated circuit (IC) and may be attached on the circuit board CB. Alternatively, the display driving circuit DC may be directly attached to the second surface 100b of the substrate 100 by a chip on glass (COG) method.

As described above, because the flexible film, which is bent along the side surface of the substrate 100, may be omitted by connecting the first pads PAD1 located on the first surface 100a to the second pads PAD2 located on the second surface 100b using the plurality of side wirings 200, a bezel-less display device 10 in which the non-display area NDA is reduced or minimized may be implemented.

Hereinafter, a structure of the pixel PX of the display device 10 according to one or more embodiments will be described.

Figure 5:
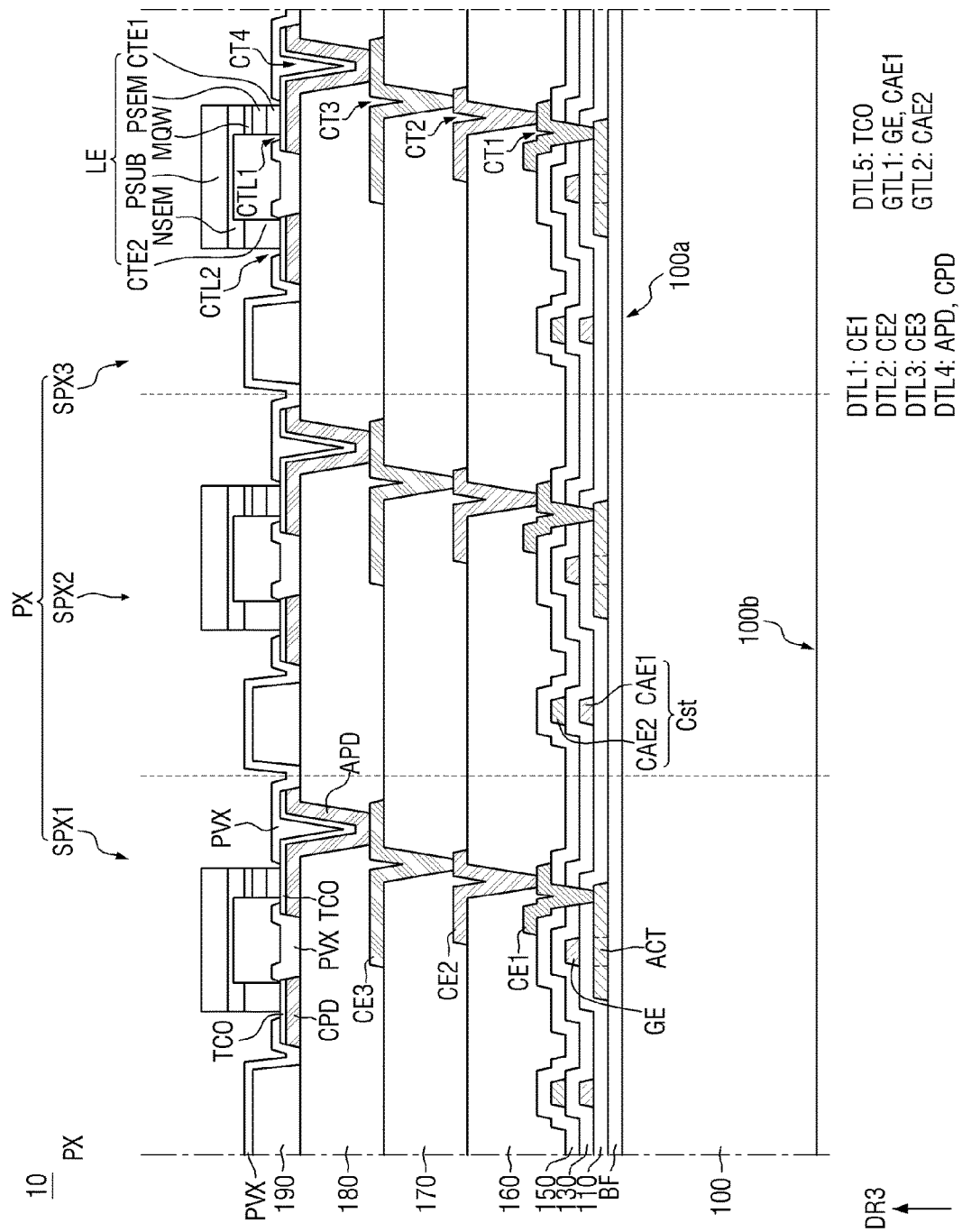
FIG. 5 is a structural view schematically illustrating a cross-sectional structure of the pixel according to one or more embodiments.

FIG. 3 is a view schematically illustrating a structure of the pixel of the display device according to one or more embodiments. FIG. 4 is a view schematically illustrating a structure of a pixel of a display device according to one or more other embodiments. FIG. 5 is a structural view schematically illustrating a cross-sectional structure of the pixel according to one or more embodiments.

Referring to FIGS. 3 and 4, each of the pixels PX may include a plurality of sub-pixels. In FIGS. 3 and 4, each of the pixels PX is illustrated as including three sub-pixels SPX1, SPX2, and SPX3, that is, a first sub-pixel SPX1, a second sub-pixel SPX2, and a third sub-pixel SPX3, but the number of sub-pixels is not limited thereto. Each of the first sub-pixel SPX1, the second sub-pixel SPX2, and the third sub-pixel SPX3 may be connected to one data wiring among the data wirings and at least one scan wiring among scan wirings.

Each of the first sub-pixel SPX1, the second sub-pixel SPX2, and the third sub-pixel SPX3 may have a rectangular, square, or rhombus planar shape. For example, each of the first sub-pixel SPX1, the second sub-pixel SPX2, and the third sub-pixel SPX3 may have a rectangular planar shape having long sides in the first direction DR1 and short sides in the second direction DR2, as shown in FIG. 3. Alternatively, each of the first sub-pixel SPX1, the second sub-pixel SPX2, and the third sub-pixel SPX3 may have a square or rhombus planar shape including sides having the same length in the first direction DR1 and the second direction DR2 as shown in FIG. 4.

The first sub-pixel SPX1, the second sub-pixel SPX2, and the third sub-pixel SPX3 may be arranged in the second direction DR2. The first sub-pixel SPX1 and any one of the second sub-pixel SPX2 and the third sub-pixel SPX3 may be arranged in the second direction DR2, while the first sub-pixel SPX1 and the other one of the second sub-pixel SPX2 and the third sub-pixel SPX3 may be arranged in the first direction DR1. For example, as shown in FIG. 4, the first sub-pixel SPX1 and the second sub-pixel SPX2 may be arranged in the second direction DR2, and the first sub-pixel SPX1 and the third sub-pixel SPX3 may be arranged in the first direction DR1.

The first sub-pixel SPX1 may emit first light, the second sub-pixel SPX2 may emit second light, and the third sub-pixel SPX3 may emit third light. In this case, the first light may be light of a red wavelength band, the second light may be light of a green wavelength band, and the third light may be light of a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm, but the embodiments of the present specification are not limited thereto.

Each of the first sub-pixel SPX1, the second sub-pixel SPX2, and the third sub-pixel SPX3 may include an inorganic light-emitting element having an inorganic semiconductor as a light-emitting element LE (see FIG. 5) that emits light. For example, the inorganic light-emitting element may be a flip-chip type micro light-emitting diode (LED), but the disclosure is not limited thereto.

As shown in FIGS. 3 and 4, an area of the first sub-pixel SPX1, an area of the second sub-pixel SPX2, and an area of the third sub-pixel SPX3 may be substantially the same, but the disclosure is not limited thereto. For example, the area of the first sub-pixel SPX1, the area of the second sub-pixel SPX2, and the area of the third sub-pixel SPX3 may be different from each other.

Referring to FIG. 5, each of the plurality of sub-pixels SPX1, SPX2, and SPX3 forming the pixel PX may include a plurality of conductive layers, a plurality of insulating layers, and a plurality of light-emitting elements LE. The plurality of conductive layers and the plurality of insulating layers may form a transistor layer that transmits an electrical signal to the light-emitting element LE.

The plurality of sub-pixels located on the substrate 100 include an active layer ACT, a first gate metal layer GTL1, a second gate metal layer GTL2, a first data metal layer DTL1, a second data metal layer DTL2, a third data metal layer DTL3, a fourth data metal layer DTL4, and a fifth data metal layer DTL5 as the plurality of conductive layers. In addition, the plurality of pixels PX include a buffer layer BF, a gate insulating layer 110, a first interlayer insulating layer 130, a second interlayer insulating layer 150, and an upper via layer as the plurality of insulating layers, wherein the upper via layer includes a first via layer 160, a second via layer 170, a third via layer 180, and a fourth via layer 190.

The substrate 100 serves as a base of the display device 10, and may be a base substrate or a base member for supporting the plurality of pixels PX. As described above, the substrate 100 may be a rigid substrate made of a glass material.

The buffer layer BF may be located on the upper surface of the substrate 100, that is, on the first surface 100a. The buffer layer BF may serve to reduce or prevent air or moisture penetrating into element layers constituting the pixel PX. The buffer layer BF may be formed of a plurality of inorganic films that are alternately stacked. For example, the buffer layer BF may be formed as multiple films in which one or more inorganic films among a silicon nitride layer, a silicon oxynitride layer, a silicon oxide layer, a titanium oxide layer, and an aluminum oxide layer are alternately stacked. According to one or more embodiments, the buffer layer BF may be omitted.

The active layer ACT may be located on the buffer layer BF. The active layer ACT may include a silicon semiconductor, such as polycrystalline silicon, single crystal silicon, low-temperature polycrystalline silicon, and amorphous silicon, or may include an oxide semiconductor.

The active layer ACT may include a channel area, a first area located on one side of the channel area, and a second area located on the other side of the channel area. The channel area of the active layer ACT may be an area overlapping a gate electrode GE, to be described below, in the third direction DR3. The first area and the second area of the active layer ACT may be areas that do not overlap the gate electrode GE. The first area and the second area may be areas having conductivity by doping a silicon semiconductor or an oxide semiconductor with ions.

The gate insulating layer 110 may be located on the active layer ACT. The gate insulating layer 110 may be formed of an inorganic film, for example, a silicon nitride layer, a silicon oxynitride layer, a silicon oxide layer, a titanium oxide layer, or an aluminum oxide layer.

The first gate metal layer GTL1 may be located on the gate insulating layer 110. The first gate metal layer GTL1 may include the gate electrode GE and a first capacitor electrode CAE1 of each sub-pixel. The gate electrode GE may form a thin-film transistor, which is configured to drive the pixel PX, together with the active layer ACT. The first gate metal layer GTL1 may be formed as a single layer or multi-layer made of any one of molybdenum (Mo), aluminum (Al), chromium (Cr), gold (Au), titanium (Ti), nickel (Ni), neodymium (Nd), and copper (Cu), or an alloy thereof.

The first interlayer insulating layer 130 may be located on the first gate metal layer GTL1. The first interlayer insulating layer 130 may be formed of an inorganic film, for example, a silicon nitride layer, a silicon oxynitride layer, a silicon oxide layer, a titanium oxide layer, or an aluminum oxide layer.

The second gate metal layer GTL2 may be located on the first interlayer insulating layer 130. The second gate metal layer GTL2 may include a second capacitor electrode CAE2. The second capacitor electrode CAE2 may overlap the first capacitor electrode CAE1 in the third direction DR3 and form a capacitor Cst. The second gate metal layer GTL2 may be formed as a single layer or multi-layer made of any one of molybdenum (Mo), aluminum (Al), chromium (Cr), gold (Au), titanium (Ti), nickel (Ni), neodymium (Nd), and copper (Cu), or an alloy thereof.

The second interlayer insulating layer 150 may be located on the second gate metal layer GTL2. The second interlayer insulating layer 150 may be formed of an inorganic film, for example, a silicon nitride layer, a silicon oxynitride layer, a silicon oxide layer, a titanium oxide layer, or an aluminum oxide layer.

The first data metal layer DTL1 including a first connection electrode CE1 and the data wiring may be located on the second interlayer insulating layer 150. The first data metal layer DTL1 may be formed as a single layer or multi-layer made of any one of molybdenum (Mo), aluminum (Al), chromium (Cr), gold (Au), titanium (Ti), nickel (Ni), neodymium (Nd), and copper (Cu), or an alloy thereof.

The first connection electrode CE1 may be connected to the first area or the second area of the active layer ACT through a first contact hole CT1 passing through the first interlayer insulating layer 130 and the second interlayer insulating layer 150. The first via layer 160, which is configured to planarize steps due to the active layer ACT, the first gate metal layer GTL1, the second gate metal layer GTL2, and the first data metal layer DTL1, may be located on the first data metal layer DTL1. The first via layer 160 may be formed of an organic film including an acrylic resin, an epoxy resin, a phenolic resin, a polyamide resin, a polyimide resin, or the like. The second data metal layer DTL2 may be located on the first via layer 160.

The second data metal layer DTL2 may include a second connection electrode CE2. The second connection electrode CE2 may be connected to the first connection electrode CE1 through a second contact hole CT2 passing through a first insulating layer and the first via layer 160. The second data metal layer DTL2 may be formed as a single layer or multi-layer made of any one of molybdenum (Mo), aluminum (Al), chromium (Cr), gold (Au), titanium (Ti), nickel (Ni), neodymium (Nd), and copper (Cu), or an alloy thereof.

The second via layer 170 may be located on the second data metal layer DTL2. The second via layer 170 may be formed of an organic film including an acrylic resin, an epoxy resin, a phenolic resin, a polyamide resin, a polyimide resin, or the like.

The third data metal layer DTL3 may be located on the second via layer 170. The third data metal layer DTL3 may include a third connection electrode CE3. The third connection electrode CE3 may be connected to the second connection electrode CE2 through a third contact hole CT3 passing through a second insulating layer and the second via layer 170. The third data metal layer DTL3 may be formed as a single layer or multi-layer made of any one of molybdenum (Mo), aluminum (Al), chromium (Cr), gold (Au), titanium (Ti), nickel (Ni), neodymium (Nd), and copper (Cu), or an alloy thereof.

The third via layer 180 may be located on the third data metal layer DTL3. The third via layer 180 may be formed of an organic film including an acrylic resin, an epoxy resin, a phenolic resin, a polyamide resin, a polyimide resin, or the like.

The fourth data metal layer DTL4 may be located on the third via layer 180. The fourth data metal layer DTL4 may include an anode pad electrode APD and a cathode pad electrode CPD. The anode pad electrode APD may be connected to the third connection electrode CE3 through a fourth contact hole CT4 passing through a third insulating layer and the third via layer 180. The cathode pad electrode CPD may receive a first power supply voltage, which may be a low potential voltage. The fourth data metal layer DTL4 may be formed as a single layer or multi-layer made of any one of molybdenum (Mo), aluminum (Al), chromium (Cr), gold (Au), titanium (Ti), nickel (Ni), neodymium (Nd), and copper (Cu), or an alloy thereof.

The fifth data metal layer DTL5 may be located on each of the anode pad electrode APD and the cathode pad electrode CPD. The fifth data metal layer DTL5 may include a transparent conductive layer TCO for increasing adhesion between the fourth data metal layer DTL4 and a first contact electrode CTE1 and a second contact electrode CTE2 of the light-emitting element LE. The fifth data metal layer DTL5 may be formed of a transparent conductive oxide, such as indium tin oxide (ITO) and indium zinc oxide (IZO).

The fourth via layer 190 may be further located on the third via layer 180. The fourth via layer 190 may be located in each separation space between the plurality of sub-pixels. In other words, the fourth via layer 190 may be partially located on the third via layer 180 without being entirely located on the third via layer 180. That is, the fourth via layer 190 may serve as a pixel defining film that defines the sub-pixels. The fourth via layer 190 may be formed of an organic film including an acrylic resin, an epoxy resin, a phenolic resin, a polyamide resin, a polyimide resin, or the like.

An upper protective layer PVX may be located on the third via layer 180, the fifth data metal layer DTL5, and the fourth via layer 190. The upper protective layer PVX may cover a portion of the transparent conductive layer TCO located on the anode pad electrode APD and an edge of the transparent conductive layer TCO located on the cathode pad electrode CPD, and may cover upper and side surfaces of the fourth via layer 190 and an upper surface of the third via layer 180, which is exposed by the fourth via layer 190. The upper protective layer PVX may be formed of an inorganic film, for example, a silicon nitride layer, a silicon oxynitride layer, a silicon oxide layer, a titanium oxide layer, or an aluminum oxide layer.

A first element contact hole CTL1 and a second element contact hole CTL2, respectively exposing a portion of the transparent conductive layer TCO located on the anode pad electrode APD and a portion of the transparent conductive layer TCO located on the cathode pad electrode CPD, may be formed in the upper protective layer PVX. The first element contact hole CTL1 may expose a portion of the transparent conductive layer TCO located on the anode pad electrode APD, and the second element contact hole CTL2 may expose a portion of the transparent conductive layer TCO located on the cathode pad electrode CPD.

Each of the plurality of sub-pixels SPX1, SPX2, and SPX3 may include one light-emitting element LE. Each of the light-emitting elements LE may be located on the portion of the transparent conductive layer TCO located on the anode pad electrode APD and on the portion of the transparent conductive layer TCO located on the cathode pad electrode CPD, which are respectively exposed by the first element contact hole CTL1 and the second element contact hole CTL2 formed in the upper protective layer PVX. In FIG. 5, the light-emitting element LE is illustrated as being a flip-chip type micro-LED in which the first contact electrode CTE1 and the second contact electrode CTE2 are located to face the anode pad electrode APD and the cathode pad electrode CPD, respectively.

The light-emitting element LE may be an inorganic light-emitting element made of an inorganic material, such as GaN. A length of the light-emitting element LE in each of the first direction DR1, the second direction DR2, and the third direction DR3 may be several to several hundreds of micrometers. For example, the length of the light-emitting element LE in each of the first direction DR1, the second direction DR2, and the third direction DR3 may be about 100 µm or less.

The light-emitting elements LE may be formed by growing on a semiconductor substrate, such as a silicon wafer. Each of the light-emitting elements LE may be directly transferred from the silicon wafer onto the anode pad electrode APD and the cathode pad electrode CPD of the substrate 100. Alternatively, each of the light-emitting elements LE may be transferred onto the anode pad electrode APD and the cathode pad electrode CPD of the substrate 100 by an electrostatic method using an electrostatic head, or a stamp method using an elastic polymer material, such as polydimethylsiloxane (PDMS) or silicon as a transfer substrate.

Each of the light-emitting elements LE may be a light-emitting structure including a base substrate PSUB, an n-type semiconductor NSEM, an active layer MQW, a p-type semiconductor PSEM, the first contact electrode CTE1, and the second contact electrode CTE2.

The base substrate PSUB of the light-emitting element LE may be a sapphire substrate, but the disclosure is not limited thereto.

The n-type semiconductor NSEM of the light-emitting element LE may be located on one surface of the base substrate PSUB. For example, the n-type semiconductor NSEM may be located on a lower surface of the base substrate PSUB. The n-type semiconductor NSEM may be made of GaN doped with an n-type conductive dopant, such as Si, Ge, Sn, or the like.

The active layer MQW of the light-emitting element LE may be located on a portion of one surface of the n-type semiconductor NSEM. The active layer MQW may include a material having a single or multiple quantum well structure. When the active layer MQW includes a material having a multiple quantum well structure, the active layer MQW may have a structure in which a plurality of well layers and a plurality of barrier layers are alternately stacked. In this case, the well layer may be formed of InGaN, and the barrier layer may be formed of GaN or AlGaN, but the disclosure is not limited thereto.

Alternatively, the active layer MQW may have a structure in which semiconductor materials having large band gap energy and semiconductor materials having small band cap energy are alternately stacked, and may include Group III to V semiconductor materials depending on a wavelength band of emitted light.

The p-type semiconductor PSEM may be located on one surface of the active layer MQW. The p-type semiconductor PSEM may be formed of GaN doped with a p-type conductive dopant, such as Mg, Zn, Ca, Se, Ba, or the like.

The first contact electrode CTE1 may be located on the p-type semiconductor PSEM, and the second contact electrode CTE2 may be located on another portion of the one surface of the n-type semiconductor NSEM. The other portion of the one surface of the n-type semiconductor NSEM, in which the second contact electrode CTE2 is located, may be located to be spaced apart from the portion of the one surface of the n-type semiconductor NSEM in which the active layer MQW is located.

The first contact electrode CTE1 and the anode pad electrode APD may be bonded to each other through a conductive adhesive member, such as an anisotropic conductive film (ACF) or an anisotropic conductive paste (ACP). Alternatively, the first contact electrode CTE1 and the anode pad electrode APD may be bonded to each other by a soldering process.

Hereinafter, an arrangement relationship between the pixel PX and the side wiring 200 and an arrangement relationship between the side wiring 200 and the driver will be described.

Figure 6:
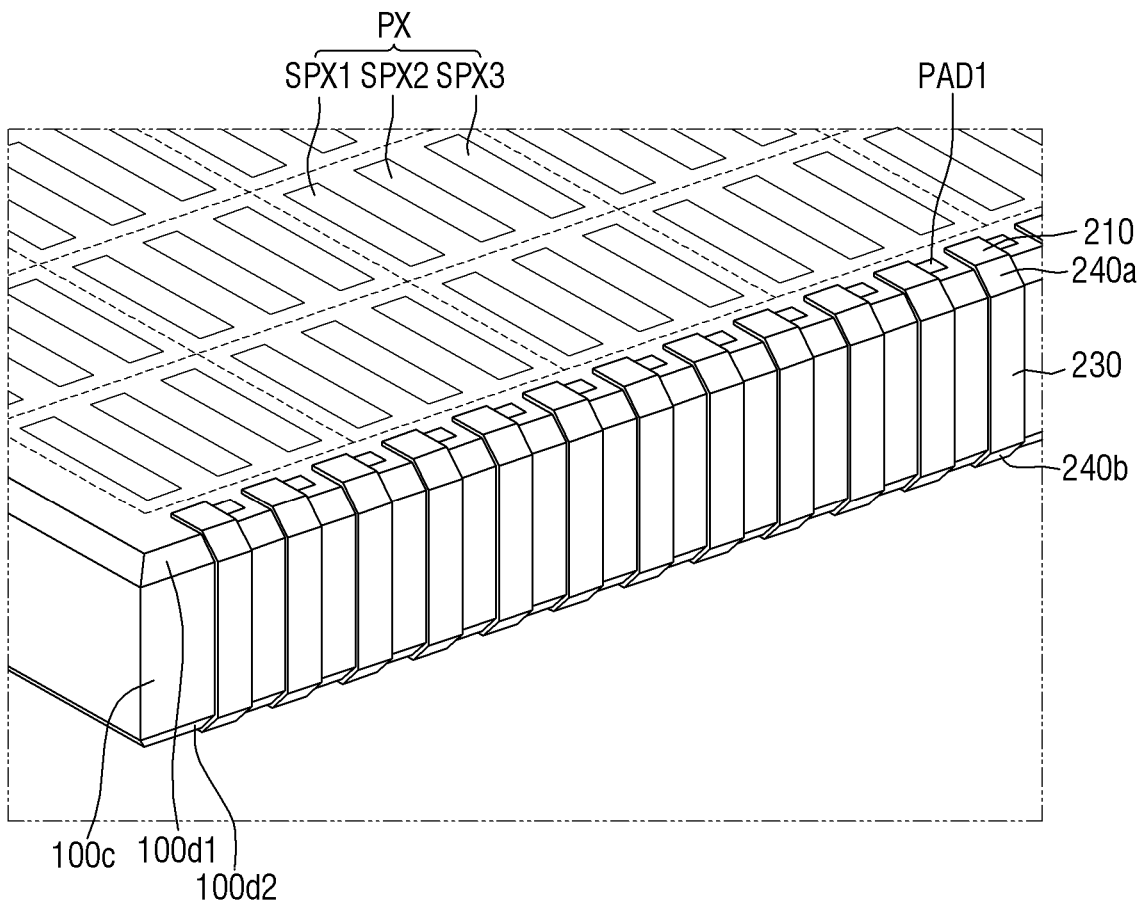
FIG. 6 is a perspective view illustrating an arrangement relationship between a pixel and a side wiring of the display device according to one or more embodiments.
Figure 7:
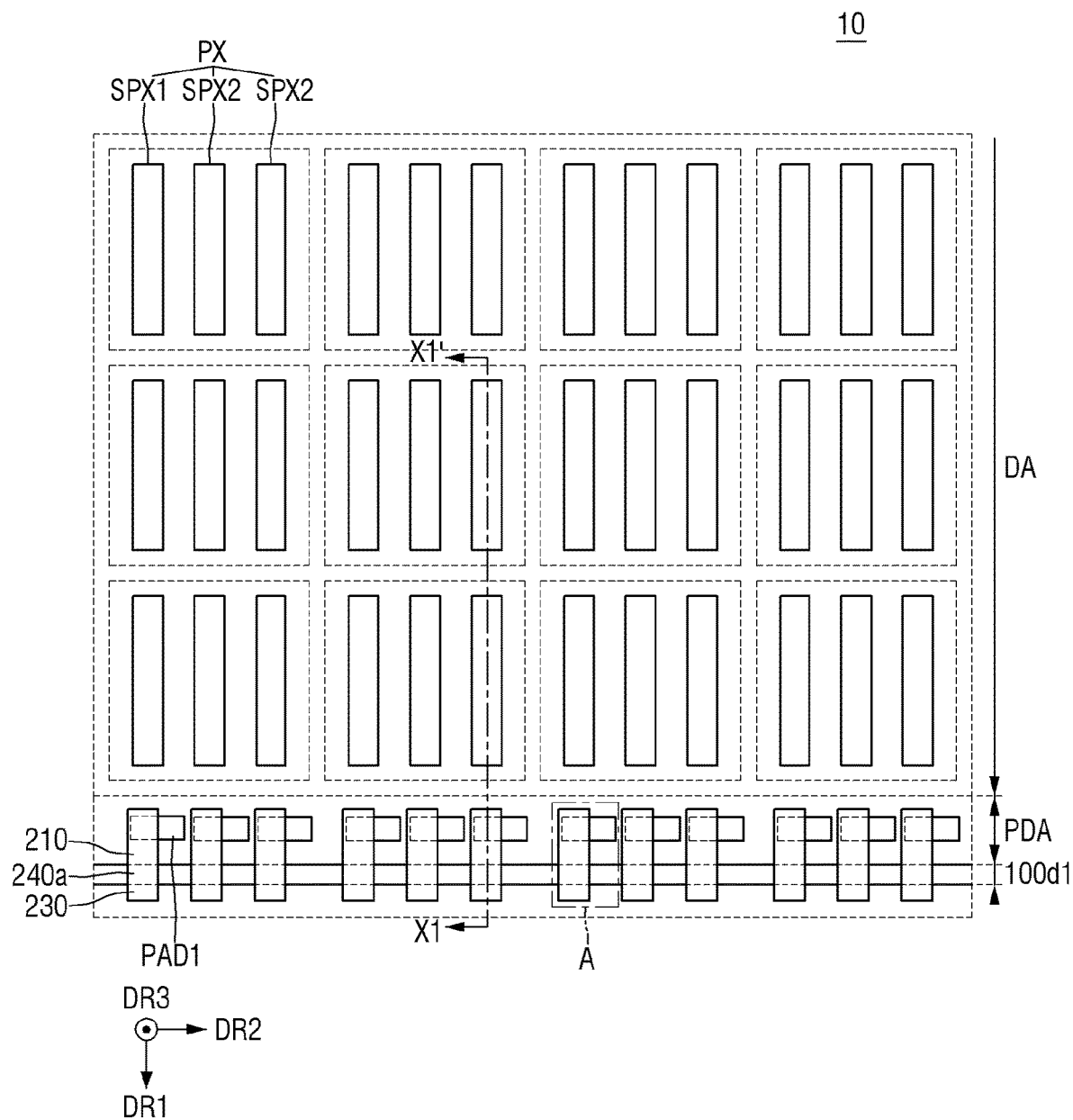
FIG. 7 is a plan view illustrating the arrangement relationship between the pixel and the side wiring of the display device according to one or more embodiments.
Figure 8:
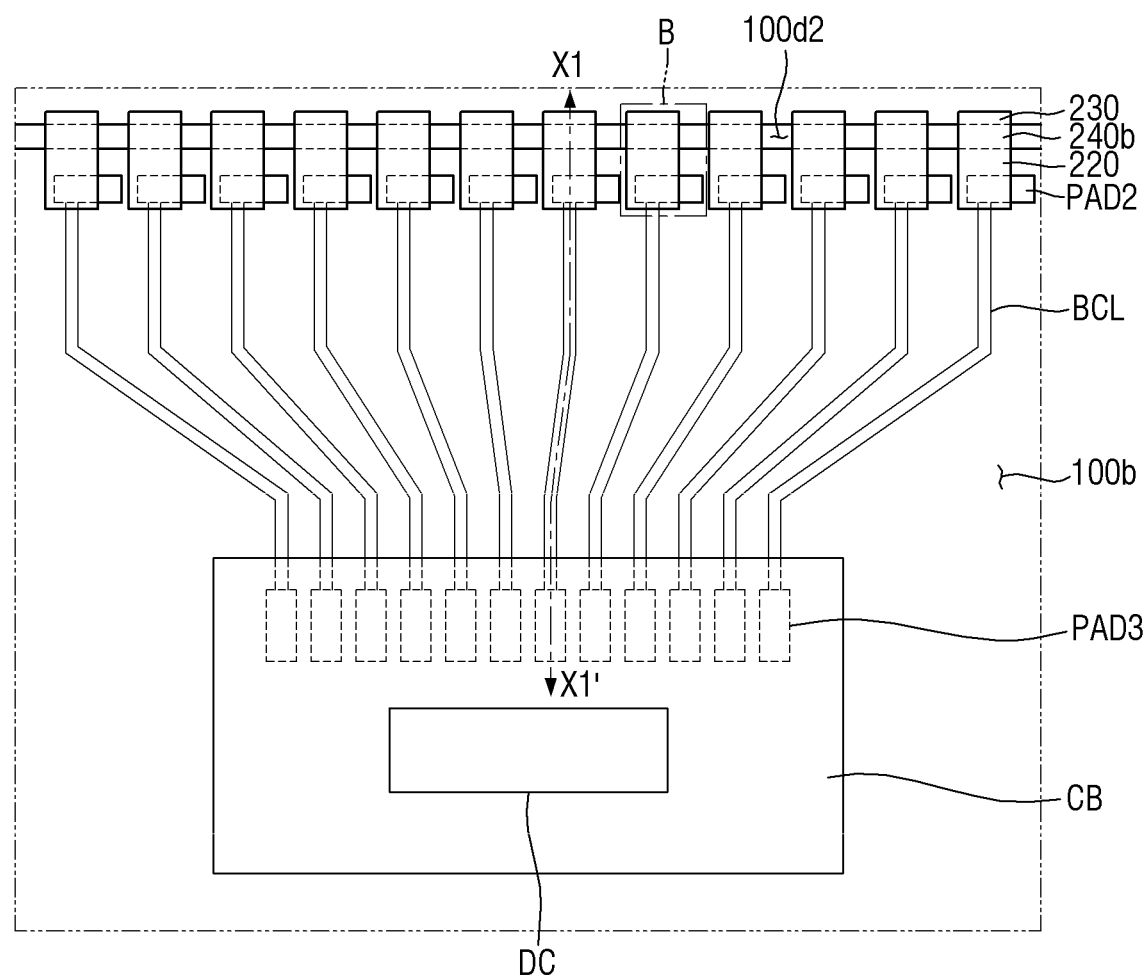
FIG. 8 is a rear view illustrating the arrangement relationship between the side wiring and a driver of the display device according to one or more embodiments.

FIG. 6 is a perspective view illustrating the arrangement relationship between the pixel and the side wiring of the display device according to one or more embodiments. FIG. 7 is a plan view illustrating the arrangement relationship between the pixel and the side wiring of the display device according to one or more embodiments. FIG. 8 is a rear view illustrating the arrangement relationship between the side wiring and the driver of the display device according to one or more embodiments.

Referring to FIGS. 6 to 8, the display device 10 further includes a plurality of first pads PAD1, a plurality of second pads PAD2, a plurality of third pads PAD3, and a plurality of bottom connection wirings BCL.

The plurality of first pads PAD1 may serve to transmit an electrical signal of the driver to each of the plurality of pixels PX. The first pads PAD1 may be located on the first surface 100a of the substrate 100. The first pads PAD1 may be located at an edge of one side of the first surface 100a of the substrate 100 in the first direction DR1, in other words, in a pad area PDA. The pad area PDA may be a portion of the non-display area NDA, and may refer to the non-display area NDA located at an edge of one side of the display area DA in the first direction DR1. The first pads PAD1 may be arranged in the second direction DR2.

The plurality of second pads PAD2 may serve to transmit an electrical signal of the driver to the first pads PAD1 through the side wirings 200. The second pads PAD2 may be located on the second surface 100b of the substrate 100. The second pads PAD2 may be located at an edge of one side of the second surface 100b of the substrate 100 in the first direction DR1. The second pads PAD2 may be arranged in the second direction DR2.

Each of the plurality of first pads PAD1 and the plurality of second pads PAD2 may have a shape extending in the second direction DR2. Accordingly, as described below, the side wiring 200 may expose a portion of each of the plurality of first pads PAD1 and a portion of each of the plurality of second pads PAD2. In other words, a width of the side wiring 200 in the second direction DR2 may be less than a width of each of the plurality of first pads PAD1 in the second direction DR2 and/or less than a width of each of the plurality of second pads PAD2 in the second direction DR2. In other words, each of the plurality of first pads PAD1 and each of the plurality of second pads PAD2 may protrude from the side wiring 200 in the second direction DR2 (e.g., in plan view).

The plurality of third pads PAD3 may serve to transmit an electrical signal generated from the driver to the second pads PAD2 through the bottom connection wirings BCL. The third pads PAD3 may be located on the second surface 100b of the substrate 100. The third pads PAD3 generally may be more adjacent to a central portion of the second surface 100b of the substrate 100 than the second pads PAD2. The third pads PAD3 may be arranged in the second direction DR2. The third pads PAD3 may be arranged to correspond to terminals formed in the driver. In other words, the third pads PAD3 may be arranged to correspond to the terminals formed on the circuit board CB of the driver. To connect more third pads PAD3 to the circuit board CB, a gap between the third pads PAD3 adjacent to each other in the second direction DR2 may be less than a gap between the second pads PAD2 adjacent to each other in the second direction DR2.

The plurality of bottom connection wirings BCL may serve to respectively connect the second pads PAD2 to the third pads PAD3. Because the gap between the second pads PAD2 adjacent to each other in the first direction DR1 and the gap between the third pads PAD3 adjacent to each other in the first direction DR1 are different from each other, the bottom connection wiring BCL may be bent at least one time. The bottom connection wiring BCL may be integrally formed with the second pad PAD2 and the third pad PAD3. The second pad PAD2, the third pad PAD3, and the bottom connection wiring BCL may each be formed as a single layer or multi-layer that is made of one of molybdenum (Mo), aluminum (Al), chromium (Cr), gold (Au), titanium (Ti), nickel (Ni), neodymium (Nd), and copper (Cu) or an alloy thereof.

The side wiring 200 may include a first flat portion 210, a first inclined portion 240*a*, a connection portion 230, a second inclined portion 240*b*, and a second flat portion 220.

The first flat portion 210 of the side wiring 200 may be a portion located on the first surface 100*a* of the substrate 100, for example, in the pad area PDA of the first surface 100*a*. The first flat portion 210 may be located on the first pad PAD1 to partially cover the first pad PAD1. The first flat portion 210 may be electrically connected to the first pad PAD1. As described above, the first pad PAD1 may protrude (e.g., in plan view) from the first flat portion 210 of the side wiring 200 in the second direction DR2. A description thereof will be provided below.

The first inclined portion 240*a* of the side wiring 200 may be a portion located on the first chamfered surface 100*d*1 of the substrate 100. The first inclined portion 240*a* may form an inclination along a direction in which the first chamfered surface 100*d*1 is inclined. The first inclined portion 240*a* may be located between the first flat portion 210 and the connection portion 230.

The connection portion 230 of the side wiring 200 may be a portion located on the first side surface 100*c* of the substrate 100. The connection portion 230 may be located between the first inclined portion 240*a* and the second inclined portion 240*b*.

The second inclined portion 240*b* of the side wiring 200 may be a portion located on the second chamfered surface 100*d*2 of the substrate 100. The second inclined portion 240*b* may form an inclination along a direction in which the second chamfered surface 100*d*2 is inclined. The second inclined portion 240*b* may be located between the second flat portion 220 and the connection portion 230.

The second flat portion 220 of the side wiring 200 may be a portion located on the second surface 100*b* of the substrate 100. The second flat portion 220 may be located on the second pad PAD2 to partially cover the second pad PAD2. The second flat portion 220 may be electrically connected to the second pad PAD2. As described above, the second pad PAD2 may protrude (e.g., in plan view) from the second flat portion 220 of the side wiring 200 in the second direction DR2. A description thereof will be provided below.

The side wiring 200 may include a metal powder including metal particles, such as silver (Ag) and copper (Cu), and a polymer, such as an acrylic resin or an epoxy resin. The metal powder allows the side wiring 200 to have conductivity, and the polymer may serve as a binder that connects the metal particles.

The side wiring 200 may be formed by printing a metal paste including metal particles, a monomer, and a solution onto the substrate 100 using a silicon pad and then sintering the metal paste using a laser. In a sintering process, as the monomer reacts to the polymer by the heat of the laser, the metal particles may be closely adhered to each other and agglomerated to lower a specific resistance of the side wiring 200.

Hereinafter, a structure of the edge of one side of the display device 10 in the first direction DR1, in which a boundary between the display area DA and the pad area PDA is formed, in other words, an arrangement structure of the first pad PAD1, the second pad PAD2, the third pad PAD3, and the pixel PX will be described.

Figure 9:
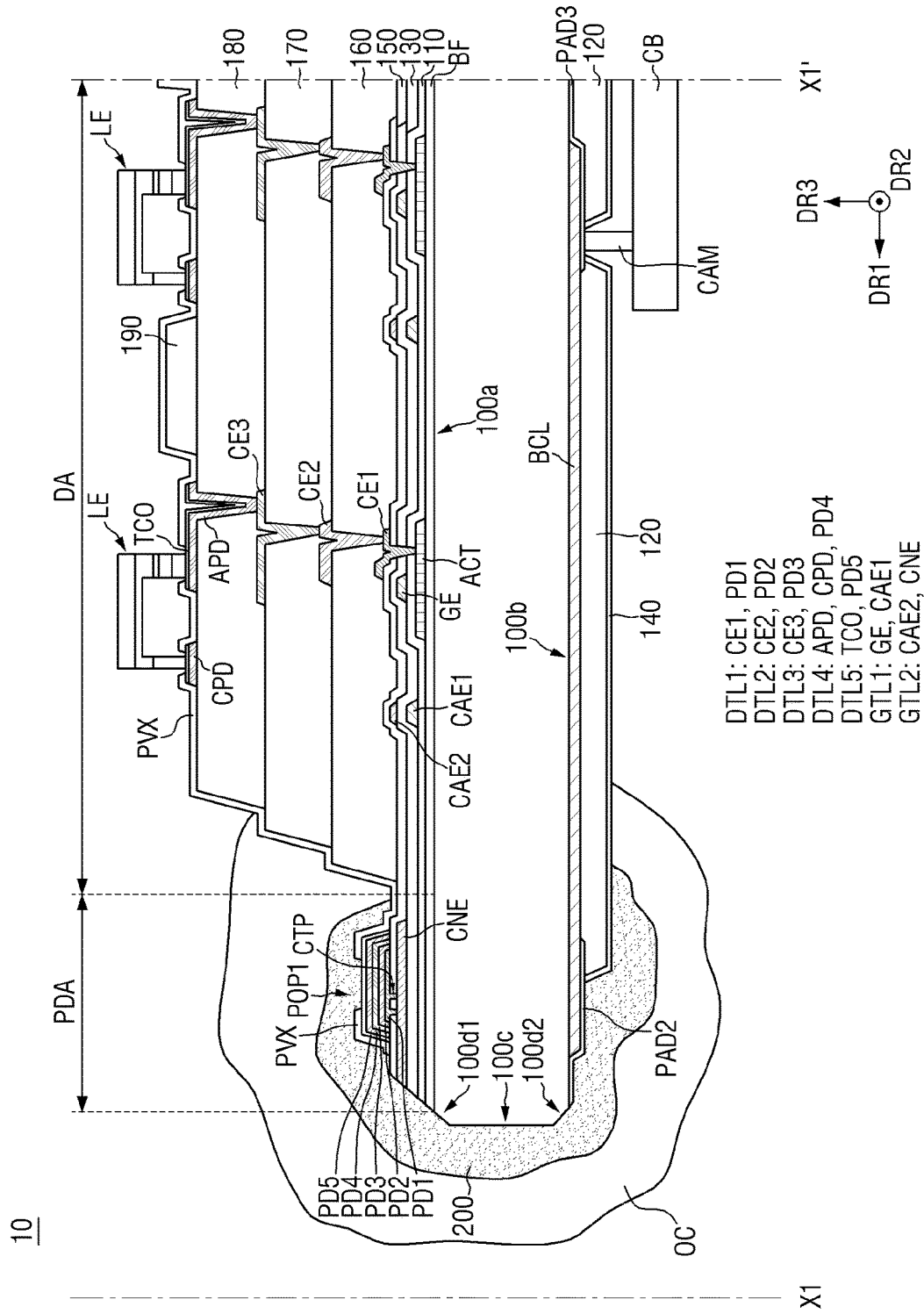
FIG. 9 is a cross-sectional view illustrating a cross section taken along the line X1-X1' of FIGS. 7 and 8.

FIG. 9 is a cross-sectional view illustrating a cross section taken along the line X1-X1' of FIGS. 7 and 8.

Referring to FIG. 9, the first pad PAD1 may be located adjacent to, but spaced apart from, the pixel PX located at the outermost portion, and the second pad PAD2 may be located on the second surface 100*b* of the substrate 100.

For convenience of description, among the plurality of sub-pixels located in the display area DA, the sub-pixel located closest to the pad area PDA is referred to as an outermost pixel. The outermost pixel is a sub-pixel located at an edge of one side of the display area DA in the first direction DR1. The sub-pixel adjacent to the outermost pixel is located only on the other side of the outermost pixel in the first direction DR1 (e.g., away from the one side of the display area DA). Accordingly, the fourth via layer 190 might not be located on one side of the outermost pixel in the first direction DR1, and may be located on the other side of the outermost pixel in the first direction DR1.

Because a structure of the outermost pixel is the same as the structure of the sub-pixel described above with reference to FIG. 5, a description thereof will be omitted.

In the pad area PDA, the first data metal layer DTL1 may further include a first upper pad electrode PD1, the second data metal layer DTL2 may further include a second upper pad electrode PD2, the third data metal layer DTL3 may further include a third upper pad electrode PD3, the fourth data metal layer DTL4 may further include a fourth upper pad electrode PD4, and the fifth data metal layer DTL5 may further include a fifth upper pad electrode PD5.

The first pad PAD1 may include the first upper pad electrode PD1, the second upper pad electrode PD2, the third upper pad electrode PD3, the fourth upper pad electrode PD4, and the fifth upper pad electrode PD5. The second upper pad electrode PD2 may be located on the first upper pad electrode PD1, the third upper pad electrode PD3 may be located on the second upper pad electrode PD2, the fourth upper pad electrode PD4 may be located on the third upper pad electrode PD3, and the fifth upper pad electrode PD5 may be located on the fourth upper pad electrode PD4. An upper surface of the first upper pad electrode PD1 may be in direct contact with a bottom surface of the second upper pad electrode PD2, an upper surface of the second upper pad electrode PD2 may be in direct contact with a bottom surface of the third upper pad electrode PD3, an upper surface of the third upper pad electrode PD3 may be in direct contact with a bottom surface of the fourth upper pad electrode PD4, and an upper surface of the fourth upper pad electrode PD4 may be in direct contact with a bottom surface of the fifth upper pad electrode PD5.

The second upper pad electrode PD2 may be located on the first upper pad electrode PD1 to completely cover the upper and side surfaces of the first upper pad electrode PD1, the third upper pad electrode PD3 may be located on the second upper pad electrode PD2 to completely cover the upper and side surfaces of the second upper pad electrode PD2, the fourth upper pad electrode PD4 may be located on the third upper pad electrode PD3 to completely cover the upper and side surfaces of the third upper pad electrode PD3, and the fifth upper pad electrode PD5 may be located on the fourth upper pad electrode PD4 to completely cover the upper and side surfaces of the fourth upper pad electrode PD4.

Figure 10:
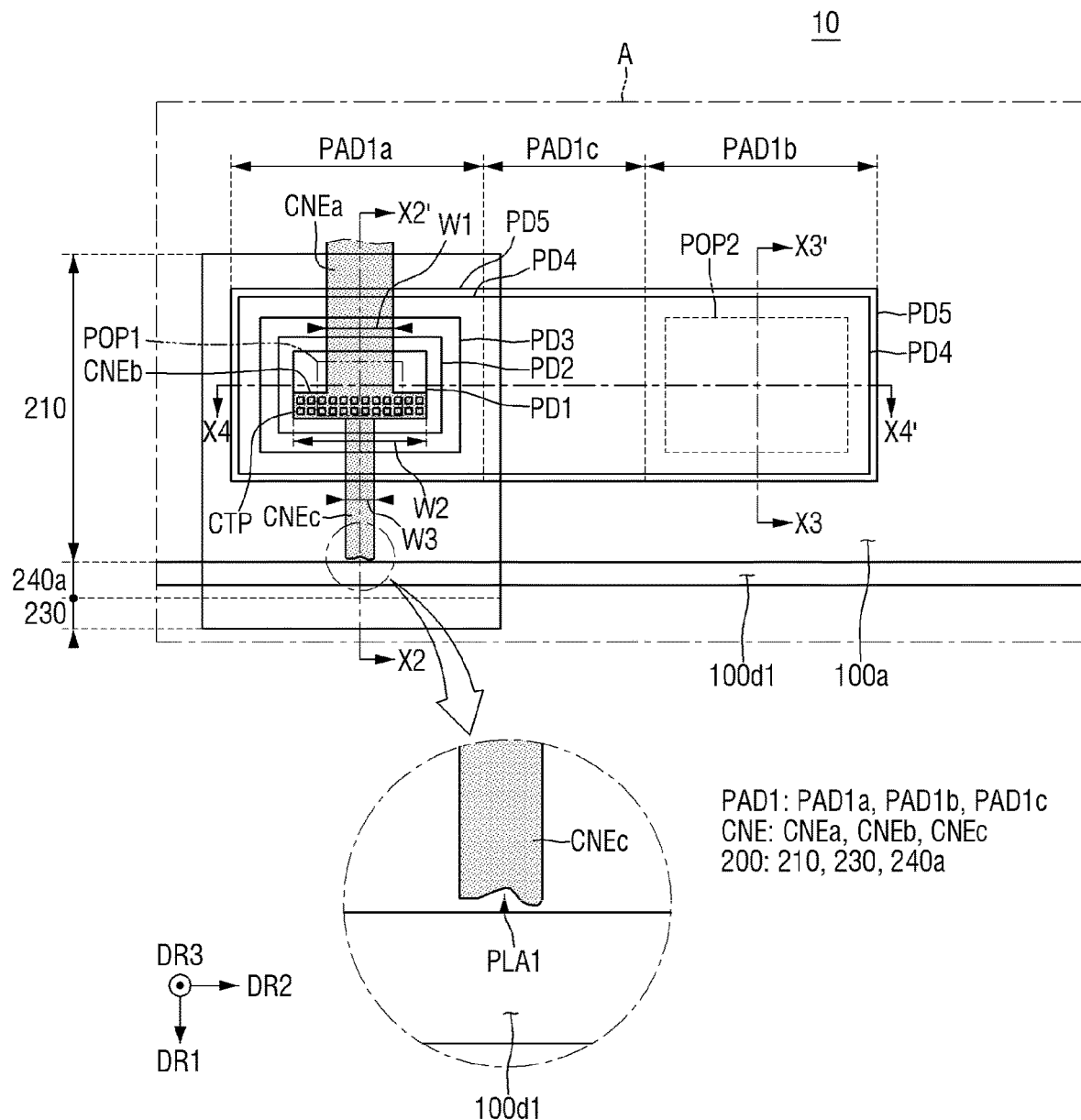
FIG. 10 is a layout diagram illustrating a structure of a first pad and an upper connection wiring.

In other words, as shown in FIG. 10, a planar area of the fifth upper pad electrode PD5 may be greater than a planar area of the fourth upper pad electrode PD4, the planar area of the fourth upper pad electrode PD4 may be greater than a planar area of the third upper pad electrode PD3, the planar area of the third upper pad electrode PD3 may be greater than a planar area of the second upper pad electrode PD2, and the planar area of the second upper pad electrode PD2 may be greater than a planar area of the first upper pad electrode PD1. A detailed description thereof will be described below.

The first upper pad electrode PD1 of the first pad PAD1 may be located on the second interlayer insulating layer 150. The first upper pad electrode PD1 may be electrically connected to an upper connection wiring CNE located on the first interlayer insulating layer 130 through a pad contact hole CTP passing through the second interlayer insulating layer 150. The upper connection wiring CNE may be electrically connected to the data wiring described above.

The bottom connection wiring BCL may be located on the second surface 100b of the substrate 100 to extend in the first direction DR1. The bottom connection wiring BCL may be formed of a single layer or multi-layer made of any one of molybdenum (Mo), aluminum (Al), chromium (Cr), gold (Au), titanium (Ti), nickel (Ni), neodymium (Nd), and copper (Cu), or an alloy thereof.

The second pad PAD2 may be located on the second surface 100b of the substrate 100. The second pad PAD2 may be located on one side of the bottom connection wiring BCL in the first direction DR1, and the third pad PAD3 may be located on the other side of the bottom connection wiring BCL in the first direction DR1. Each of the second pad PAD2 and the third pad PAD3 may be formed of a transparent conductive oxide, such as indium tin oxide (ITO) and indium zinc oxide (IZO).

A lower via layer 120 may be located on the second surface 100b of the substrate 100. For example, the lower via layer 120 may be located on the other side surface of the bottom connection wiring BCL in the third direction DR3. The lower via layer 120 may partially cover the second pad PAD2 and the third pad PAD3, but may expose at least some of the second pad PAD2 and the third pad PAD3. The portion of the second pad PAD2 exposed by the lower via layer 120 may be in direct contact with, and electrically connected to, the second flat portion 220 of the side wiring 200, and the portion of the third pad PAD3 exposed by the lower via layer 120 may be electrically connected to the circuit board CB by a conductive adhesive member CAM. The conductive adhesive member CAM may be an anisotropic conductive film or an anisotropic conductive paste.

The lower via layer 120 may be formed of an organic film including an acrylic resin, an epoxy resin, a phenolic resin, a polyamide resin, a polyimide resin, or the like.

A lower protective layer 140 may cover the lower via layer 120. For example, the lower protective layer 140 may be located on the lower via layer 120 and may not be located on the second pad PAD2 and the third pad PAD3. In other words, the second pad PAD2 and the third pad PAD3 may each include a portion exposed by the lower protective layer 140. The lower protective layer 140 may be formed of an inorganic film, for example, a silicon nitride layer, a silicon oxynitride layer, a silicon oxide layer, a titanium oxide layer, or an aluminum oxide layer.

The side wiring 200 may be located on, or in proximity to, the first surface 100a, the first chamfered surface 100d1, the first side surface 100c, the second chamfered surface 100d2, and the second surface 100b of the substrate 100. The side wiring 200 may be located on the first pad PAD1 located at an edge of one side of the first surface 100a of the substrate 100 in the first direction DR1, and may be electrically connected to the first pad PAD1. The side wiring 200 may be located on the second pad PAD2 located at an edge of one side of the second surface 100b of the substrate 100 in the first direction DR1, and may be connected to the second pad PAD2. The side wiring 200 may be in contact with the first chamfered surface 100d1, the first side surface 100c, and the second chamfered surface 100d2 of the substrate 100.

An overcoat layer OC may be located on the first surface 100a, the first chamfered surface 100d1, the first side surface 100c, the second chamfered surface 100d2, and the second surface 100b of the substrate 100. The overcoat layer OC may be located to cover the side wiring 200. The overcoat layer OC may be formed of an organic film including an acrylic resin, an epoxy resin, a phenolic resin, a polyamide resin, a polyimide resin, or the like.

Meanwhile, the first via layer 160, the second via layer 170, and the third via layer 180 extending in the first direction DR1 in the display area DA may not extend in the vicinity of the boundary between the display area DA and the pad area PDA.

A first pad opening POP1 exposing an upper surface of the fifth upper pad electrode PD5 of the first pad PAD1 may be formed in the upper protective layer PVX. The first flat portion 210 of the side wiring 200 may be electrically connected to the first pad PAD1 through the first pad opening POP1.

Hereinafter, a structure of the first pad PAD1 and the upper connection wiring CNE electrically connected to the first pad PAD1 will be described in detail.

Figure 11:
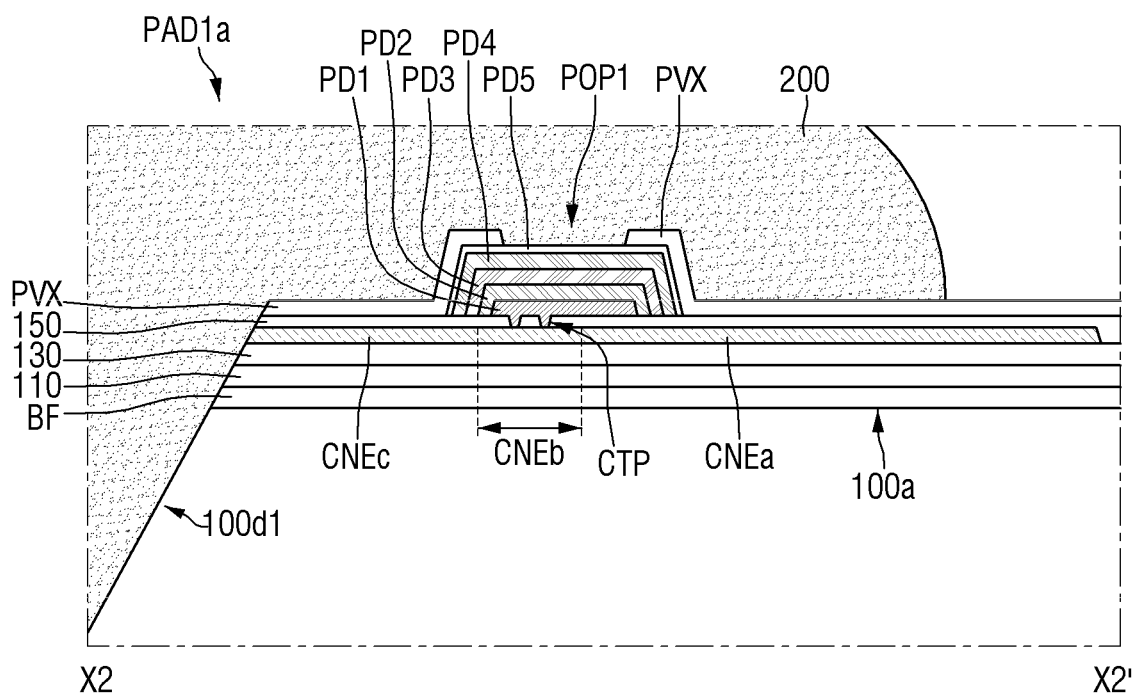
FIG. 11 is a cross-sectional view illustrating a cross section taken along the line X2-X2' of FIG. 10.
Figure 12:
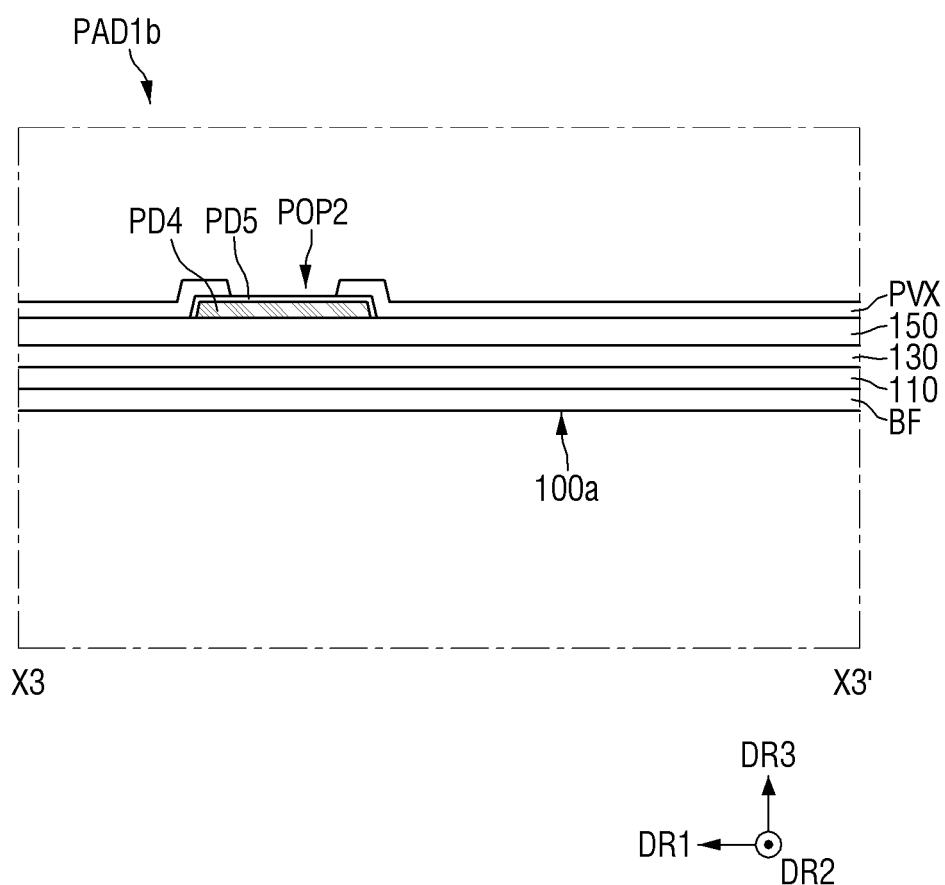
FIG. 12 is a cross-sectional view illustrating a cross section taken along the line X3-X3' of FIG. 10.
Figure 13:
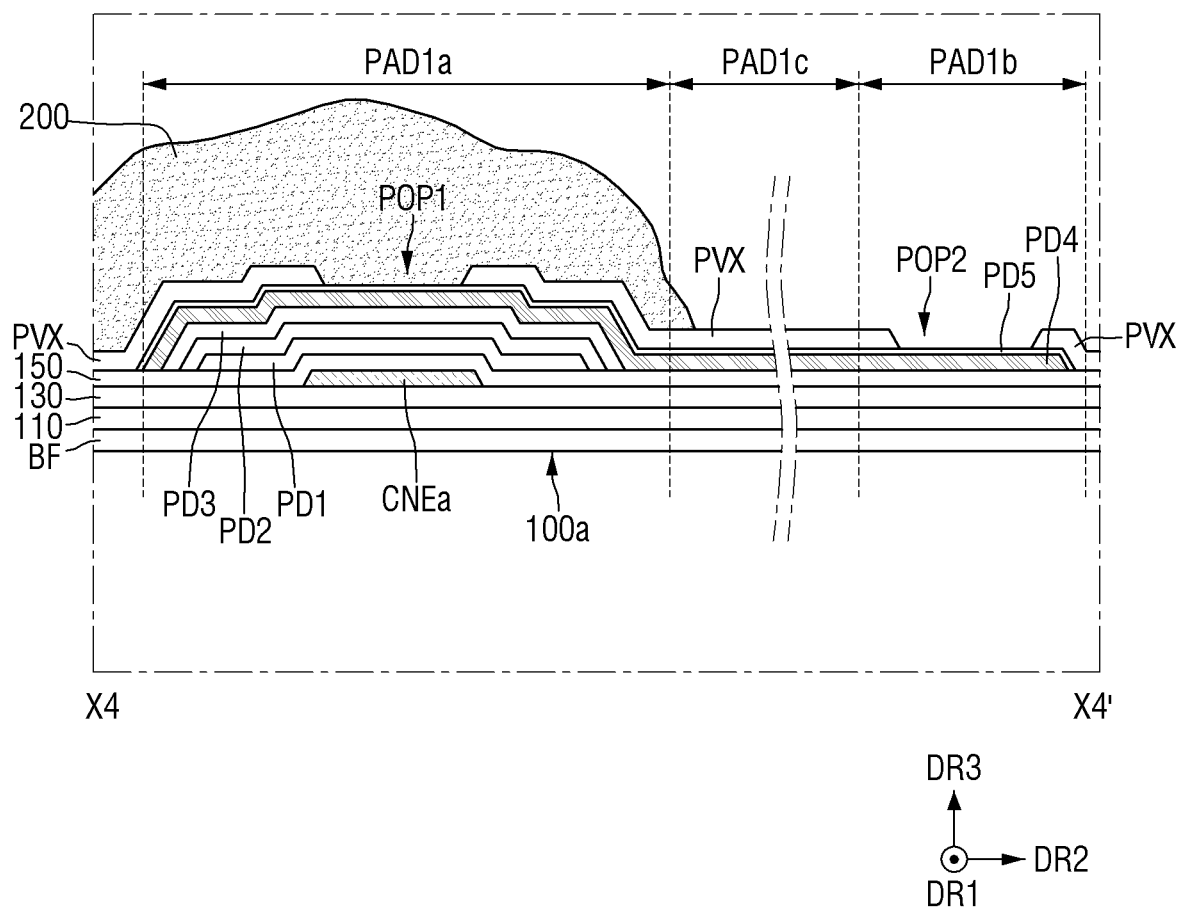
FIG. 13 is a cross-sectional view illustrating a cross section taken along the line X4-X4' of FIG. 10.

FIG. 10 is a layout diagram illustrating a structure of the first pad and the upper connection wiring. FIG. 11 is a cross-sectional view illustrating a cross section taken along the line X2-X2' of FIG. 10. FIG. 12 is a cross-sectional view illustrating a cross section taken along the line X3-X3' of FIG. 10. FIG. 13 is a cross-sectional view illustrating a cross section taken along the line X4-X4' of FIG. 10.

Referring to FIGS. 10 to 13, the first pad PAD1 may include a first area PAD1a overlapping the side wiring 200 in the third direction DR3, a second area PAD1b not overlapping the side wiring 200 in the third direction DR3, and a third area PAD1c connecting the first area PAD1a and the second area PAD1b.

As described above, the first pad PAD1 may include the first upper pad electrode PD1, the second upper pad electrode PD2, the third upper pad electrode PD3, the fourth upper pad electrode PD4, and the fifth upper pad electrode PD5. The planar area of the second upper pad electrode PD2 is greater than the planar area of the first upper pad electrode PD1, and the planar area of the third upper pad electrode PD3 is greater than the planar area of the second upper pad electrode PD2, and the planar area of the fourth upper pad electrode PD4 is greater than the planar area of the third upper pad electrode PD3, and the planar area of the fifth upper pad electrode PD5 is greater than the planar area of the fourth upper pad electrode PD4. In some embodiments, the first upper pad electrode PD1, the second upper pad electrode PD2, the third upper pad electrode PD3, the fourth upper pad electrode PD4, and the fifth upper pad electrode PD5 may each have a rectangular planar shape, but the disclosure is not limited thereto.

The first upper pad electrode PD1, the second upper pad electrode PD2, the third upper pad electrode PD3, the fourth upper pad electrode PD4, and the fifth upper pad electrode PD5 may be located in the first area PAD1a of the first pad PAD1, and the first upper pad electrode PD1, the second upper pad electrode PD2, and the third upper pad electrode PD3 might not be located in the second area PAD1b and the third area PAD1c of the first pad PAD1. For example, the fourth upper pad electrode PD4 and the fifth upper pad electrode PD5 may extend in the second direction DR2 in the second area PAD1b and the third area PAD1c of the first pad PAD1. The first upper pad electrode PD1, the second upper pad electrode PD2, and the third upper pad electrode PD3 may be located only in the first area PAD1a of the first pad PAD1.

As shown in FIG. 11, the first pad opening POP1, which is in contact with or partially filled by the side wiring 200, may be formed in the first area PAD1a of the first pad PAD1. As shown in FIG. 12, a second pad opening POP2, to which an inspection device (e.g., for checking whether the first pad PAD1 and the plurality of pixels PX are electrically connected) may be connected, may be formed in the second area PAD1b. As shown in FIG. 13, because the third area PAD1c of the first pad PAD1 connects the first area PAD1a and the second area PAD1b, whether the first pad PAD1 and the plurality of pixels PX are electrically connected may be checked using the inspection device.

The upper connection wiring CNE may include a first contact portion CNEb in contact with the first pad PAD1, a first peeling portion CNEc extending from the first contact portion CNEb toward one side of the first direction DR1, and a first wiring portion CNEa extending from the first contact portion CNEb toward the other side of the first direction DR1.

As shown in FIG. 11, the first contact portion CNEb of the upper connection wiring CNE may be electrically connected to the first upper pad electrode PD1 by the pad contact hole CTP passing through the second interlayer insulating layer 150. In some embodiments, the pad contact hole CTP may be biased toward one side of the first upper pad electrode PD1 in the first direction DR1, but the disclosure is not limited thereto.

The first peeling portion CNEc of the upper connection wiring CNE may be a pattern protruding from one side of the first contact portion CNEb in the first direction DR1 and extending in a direction toward the first chamfered surface 100d1, that is, in the first direction DR1 toward one side of the first direction DR1. As shown in FIG. 10, an irregular first peeling pattern PLA1 may be formed at an end of one side of the first peeling portion CNEc in the first direction DR1 as a result of the process of forming the first chamfered surface 100d1 in a display device manufacturing method, which will be described below. In other words, the first peeling pattern PLA1 may be a pattern formed by tearing off a portion of the first peeling portion CNEc and may have an irregular shape. In FIG. 10, the first peeling pattern PLA1 is illustrated as having a wave shape having a plurality of uneven portions, but the shape of the first peeling pattern PLA1 is not limited thereto.

The first wiring portion CNEa of the upper connection wiring CNE may be a pattern protruding from the other side of the first contact portion CNEb in the first direction DR1 and extending toward the other side of the first direction DR1. The first wiring portion CNEa may transmit an electrical signal received from the side wiring 200 to the plurality of pixels PX. In some embodiments, the first wiring portion CNEa may extend to the display area DA beyond the pad area PDA and may be electrically connected to the plurality of pixels PX, but the disclosure is not limited thereto. For example, the first wiring portion CNEa may be in contact with a separate element layer, and may transmit the electrical signal to the plurality of pixels PX through the element layer.

A width W2 of the first contact portion CNEb in the second direction DR2 may be greater than a width W1 of the first wiring portion CNEa in the second direction DR2. This may increase a contact area between the first contact portion CNEb and the first upper pad electrode PD1. Meanwhile, a width W3 of the first peeling portion CNEc in the second direction DR2 is less than the width W2 of the first contact portion CNEb in the second direction DR2. This may be to reduce or minimize the peeling of the upper connection wiring CNE by reducing or minimizing friction that acts to form the first chamfered surface 100d1 in a display device manufacturing process, which will be described below. A detailed description thereof will be described below.

Hereinafter, a structure of the second pad PAD2 and the bottom connection wiring BCL, which is electrically connected to the second pad PAD2, will be described in detail.

Figure 14:
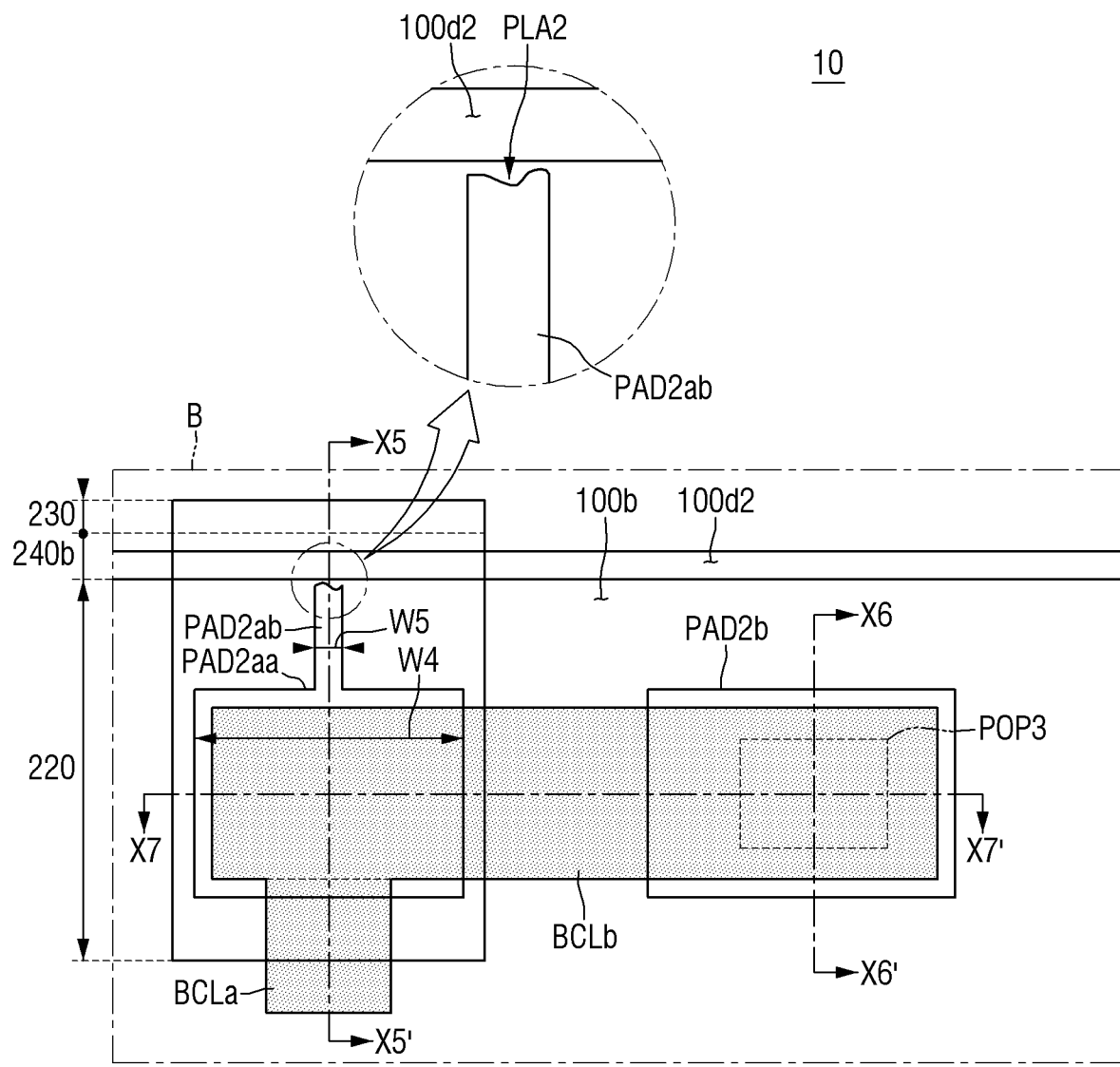
FIG. 14 is a layout diagram illustrating a structure of a second pad and a bottom connection wiring.
Figure 15:
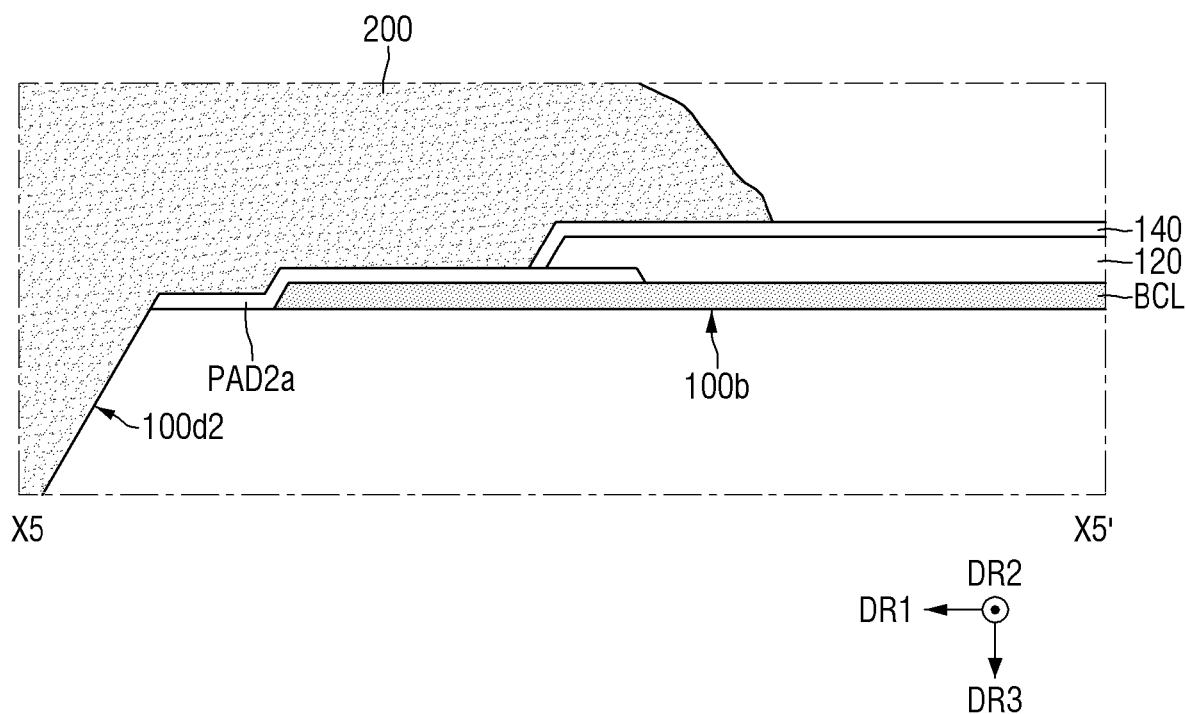
FIG. 15 is a cross-sectional view illustrating a cross section taken along the line X5-X5' of FIG. 14.
Figure 16:
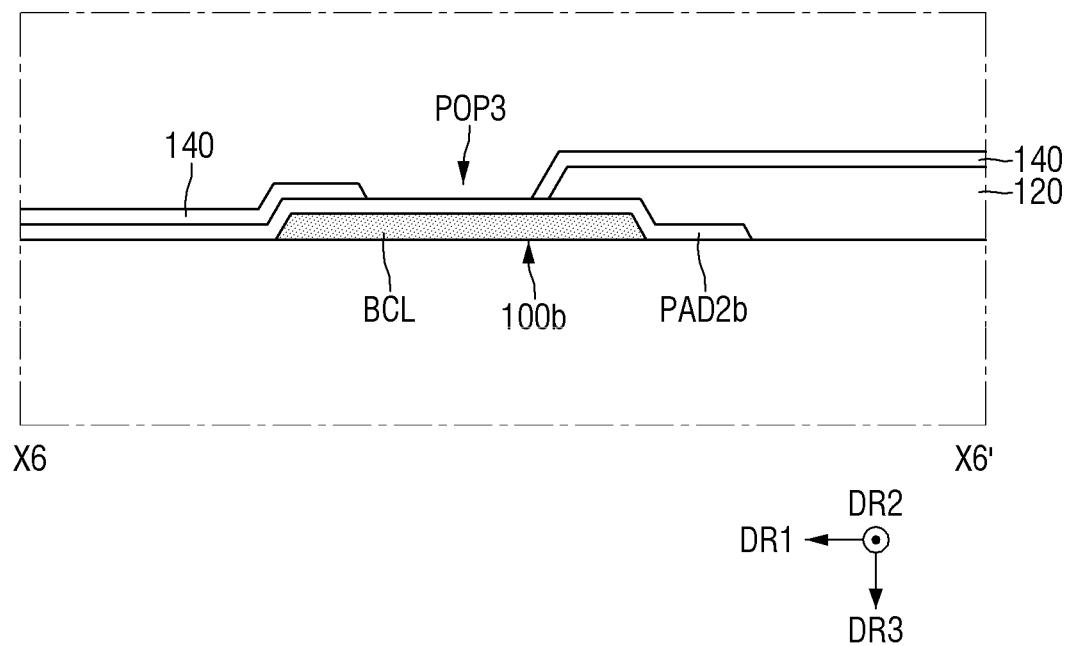
FIG. 16 is a cross-sectional view illustrating a cross section taken along the line X6-X6' of FIG. 14.
Figure 17:
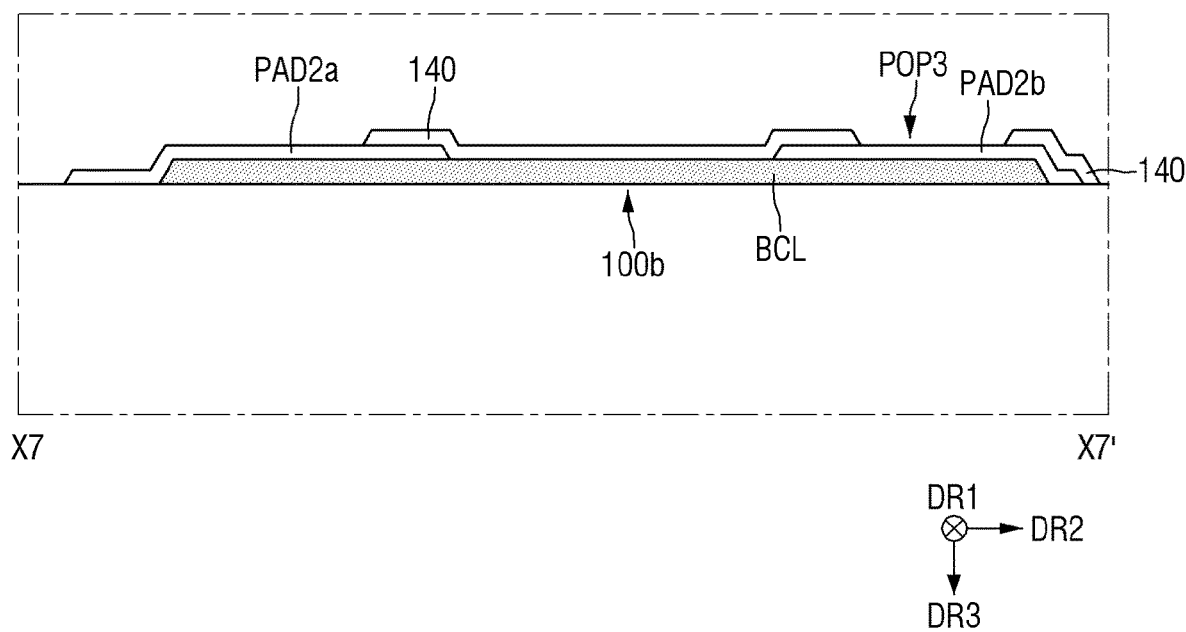
FIG. 17 is a cross-sectional view illustrating a cross section taken along the line X7-X7' of FIG. 14.

FIG. 14 is a layout diagram illustrating the structure of the second pad and the bottom connection wiring. FIG. 15 is a cross-sectional view illustrating a cross section taken along the line X5-X5' of FIG. 14. FIG. 16 is a cross-sectional view illustrating a cross section taken along the line X6-X6' of FIG. 14. FIG. 17 is a cross-sectional view illustrating a cross section taken along the line X7-X7' of FIG. 14.

Referring to FIGS. 14 to 17, the bottom connection wiring BCL may include a second wiring portion BCLa, which is connected to the driver, and a pad electrode portion BCLb covered by (e.g., at least partially covered by) the second pad PAD2.

The pad electrode portion BCLb of the bottom connection wiring BCL may be a portion overlapping each of portions PAD2a and PAD2b of the second pad PAD2, which will be described below and electrically connected to the second pad PAD2. As shown in FIG. 17, the pad electrode portion BCLb may electrically connect a first portion PAD2a and a second portion PAD2b of the second pad PAD2. In some embodiments, the pad electrode portion BCLb may have a rectangular planar shape having long sides in the second direction DR2 and short sides in the first direction DR1, but the disclosure is not limited thereto.

The second wiring portion BCLa of the bottom connection wiring BCL may be a portion protruding from the other side of the pad electrode portion BCLb in the first direction DR1 and extending in a direction toward the driver, that is, in the first direction DR1 toward the other side of the first direction DR1. The second wiring portion BCLa may be electrically connected to the driver and may transmit an electrical signal applied from the driver (see FIG. 9). In some embodiments, the second wiring portion BCLa and the pad electrode portion BCLb may be integrally formed, but the disclosure is not limited thereto.

The second pad PAD2 may include the first portion PAD2a overlapping the side wiring 200 in the third direction DR3, and the second portion PAD2b spaced apart from the first portion PAD2a in the second direction and non-overlapping the side wiring 200 in the third direction DR3.

The first portion PAD2a of the second pad PAD2 may be a portion in contact with, and electrically connected to, the side wiring 200, as shown in FIG. 15. The first portion PAD2a may be located on the bottom connection wiring BCL, and may be electrically connected to the bottom connection wiring BCL. Accordingly, the first portion PAD2a may receive a signal, which is applied from the driver, from the bottom connection wiring BCL, and may transmit the signal to the side wiring 200.

The first portion PAD2a may include a second contact portion PAD2aa, which covers the bottom connection wiring BCL, and a second peeling portion PAD2ab protruding from one side of the second contact portion PAD2aa in the first direction DR1 and extending in a direction toward the second chamfered surface 100d2, that is, in the first direction DR1 toward one side of the first direction DR1.

As shown in FIG. 15, the second contact portion PAD2aa may electrically connect the side wiring 200 to the pad electrode portion BCLb of the bottom connection wiring BCL.

An irregular second peeling pattern PLA2 may be formed at an end of one side of the second peeling portion PAD2ab in the first direction DR1 as a result of the process of forming the second chamfered surface 100d2 in the display device manufacturing method, which will be described below. In other words, the second peeling pattern PLA2 may be a pattern that is formed by tearing off a portion of the second peeling portion PAD2ab and may have an irregular shape. In FIG. 14, the second peeling pattern PLA2 is illustrated as having a wave shape having a plurality of uneven portions, but the shape of the second peeling pattern PLA2 is not limited thereto.

A width W4 of the second contact portion PAD2aa in the second direction DR2 may be greater than a width W5 of the second peeling portion PAD2ab in the second direction DR2. This may increase a contact area between the second contact portion PAD2aa and the bottom connection wiring BCL. Meanwhile, the width W5 of the second peeling portion PAD2ab in the second direction DR2 is less than the width W4 of the second contact portion PAD2aa in the second direction DR2. This may reduce or minimize the peeling of the second pad PAD2 by reducing or minimizing friction that acts to form the second chamfered surface 100d2 in the display device manufacturing process, which will be described below. A detailed description thereof will be described below.

As shown in FIG. 16, a third pad opening POP3, to which an inspection device (e.g., for checking whether the second pad PAD2 and the driver are electrically connected) may be connected, may be formed in the second portion PAD2b of the second pad PAD2. As described above, because the pad electrode portion BCLb of the bottom connection wiring BCL electrically connects the first portion PAD2a and the second portion PAD2b, as shown in FIG. 17, it is possible to check whether the second pad PAD2 is connected to the driver using the inspection device.

Hereinafter, a method of manufacturing the display device 10 according to one or more embodiments will be described.

FIGS. 18 to 28 are a flowchart and views for describing a method of manufacturing the display device according to one or more embodiments.

Figure 18:
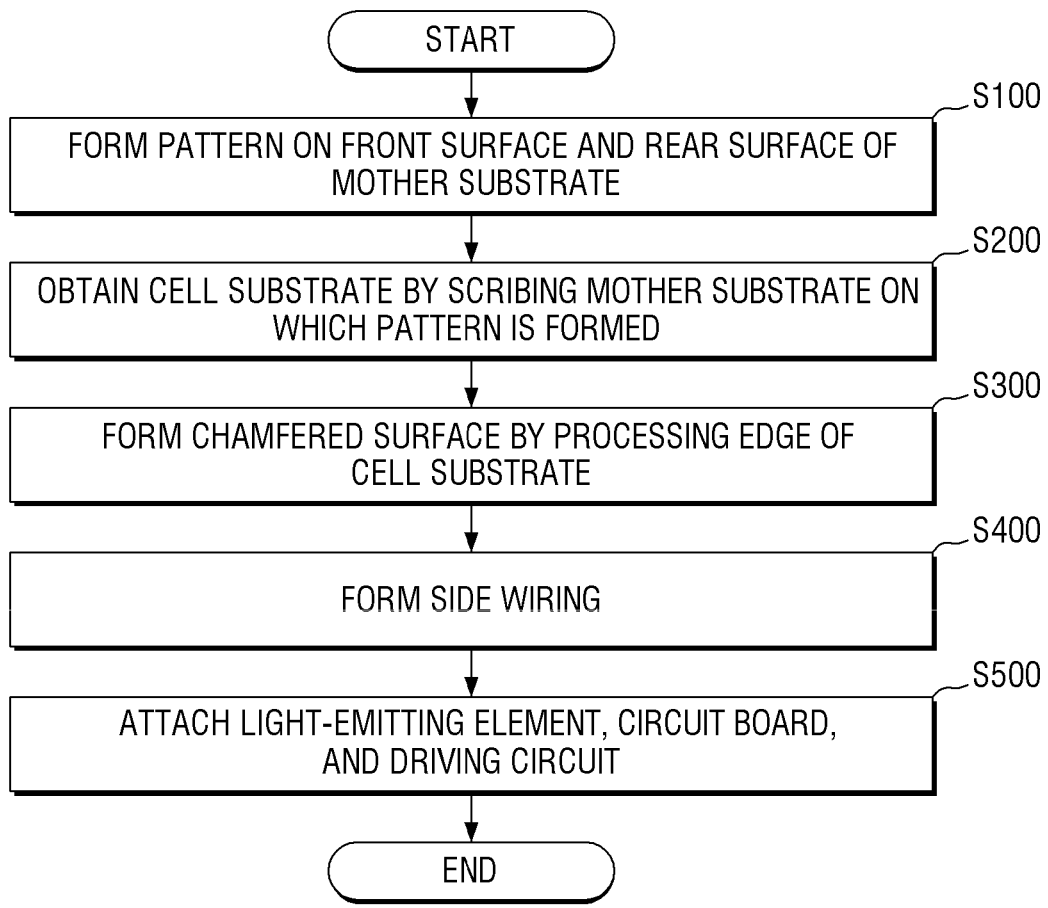
Figure 19:
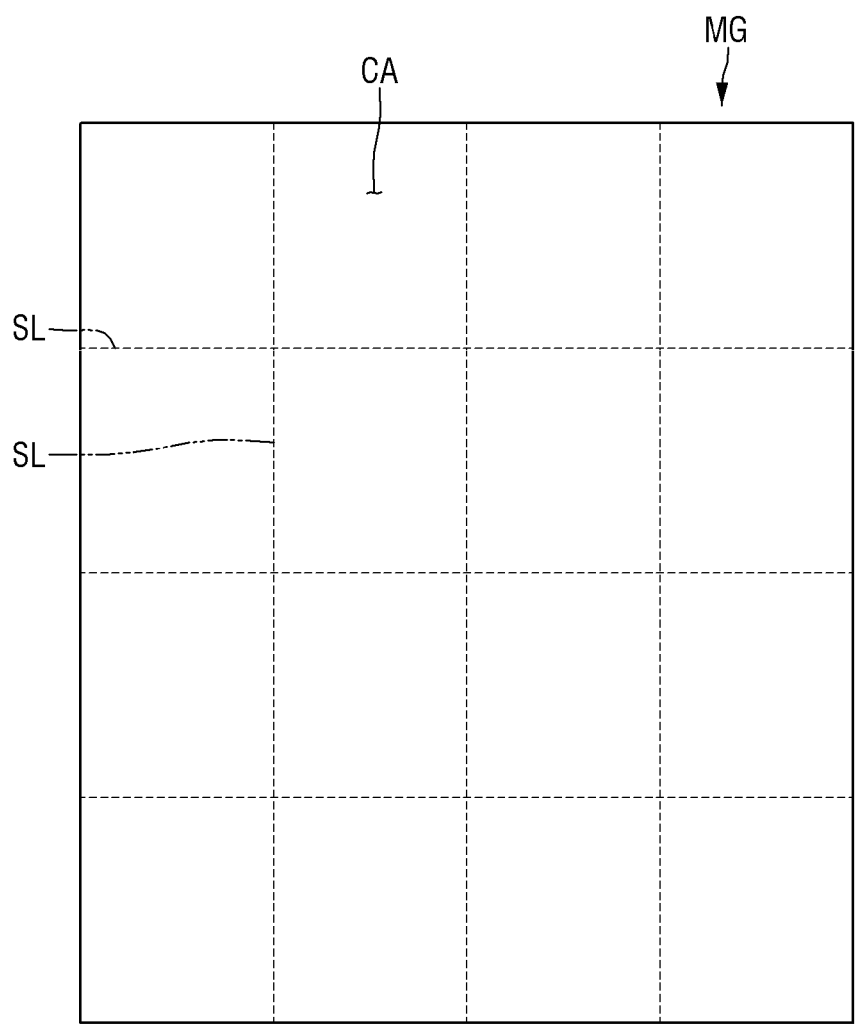
Figure 20:
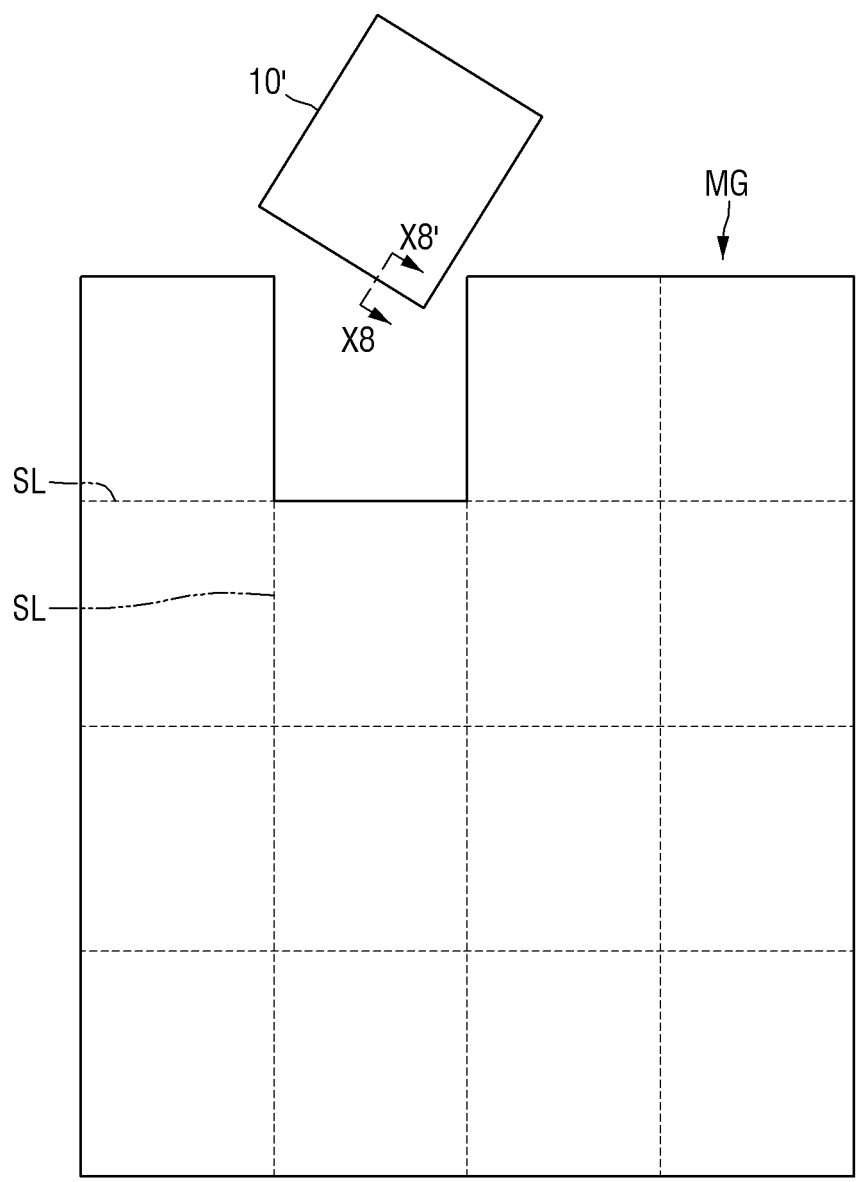

Referring to FIG. 18, the method of manufacturing the display device 10 according to one or more embodiments may include forming patterns on a front surface and a rear surface of a mother substrate MG (see FIG. 19) (S100), obtaining a cell substrate 100' (see FIG. 21) by scribing the mother substrate MG on which the patterns are formed (S200), forming chamfered surfaces 100d1 and 100d2 by processing edges of the cell substrate 100' (S300), forming side wirings (S400), and attaching a light-emitting element LE, a circuit board CB, and a driving circuit DC (S500).

First, referring to FIGS. 19 to 23, the patterns are formed on the front surface and the rear surface of the mother substrate MG (S100), and the mother substrate MG on which the patterns are formed is scribed to obtain cells 10' (S200).

The mother substrate MG is a base substrate in which scribing lines SL, which are configured to divide a plurality of cell areas CA, are defined. The cell areas CA are arranged in a matrix form, and the scribing lines SL may define the cell areas CA by crossing a transverse direction (a horizontal direction with reference to FIG. 19) and a longitudinal direction (a vertical direction with reference to FIG. 19). The cell area CA may be an area corresponding to the cell 10' obtained through the scribing process for cutting along the scribing line SL of the mother substrate MG. In other words, when the scribing process is performed on the cell area CA, the cell 10' may be obtained.

The scribing line SL of the mother substrate MG may define the edge of the cell substrate 100' included in the cell 10'. In other words, when cutting is performed along the scribing line SL of the mother substrate MG, a side surface 100c' of the cell substrate 100' of the cell 10' may be formed. The cell 10' may include the cell substrate 100', and may include the patterns remaining on a front surface 100a' and a rear surface 100b' of the cell substrate 100' that are obtained by scribing the patterns formed on the front surface and the rear surface of the mother substrate, which will be described below.

The patterns formed on the front surface and the rear surface of the mother substrate MG may mean a state in which all elements except for the light-emitting element and the driver are formed, with reference to FIG. 9. For example, the patterns may mean a state in which patterns, which include an active layer ACT, a first gate metal layer GTL1, a second gate metal layer GTL2, a first data metal layer DTL1, a second data metal layer DTL2, a third data metal layer DTL3, a fourth data metal layer DTL4, and a fifth data metal layer DTL5 as a plurality of conductive layers, and which include a buffer layer BF, a gate insulating layer 110, a first interlayer insulating layer 130, a second interlayer insulating layer 150, and an upper via layer as a plurality of insulating layers, wherein the upper via layer includes a first via layer 160, a second via layer 170, a third via layer 180, and a fourth via layer 190, are formed in each cell area CA of the upper surface of the mother substrate MG, and in which patterns including a second pad PAD2, a third pad PAD3, a bottom connection wiring BCL, a lower via layer 120, and a lower protective layer 140 are formed in each cell area CA of the bottom surface of the mother substrate MG.

Because a method of forming the above-described patterns is well known in the art, a detailed description thereof will be omitted.

Figure 24:
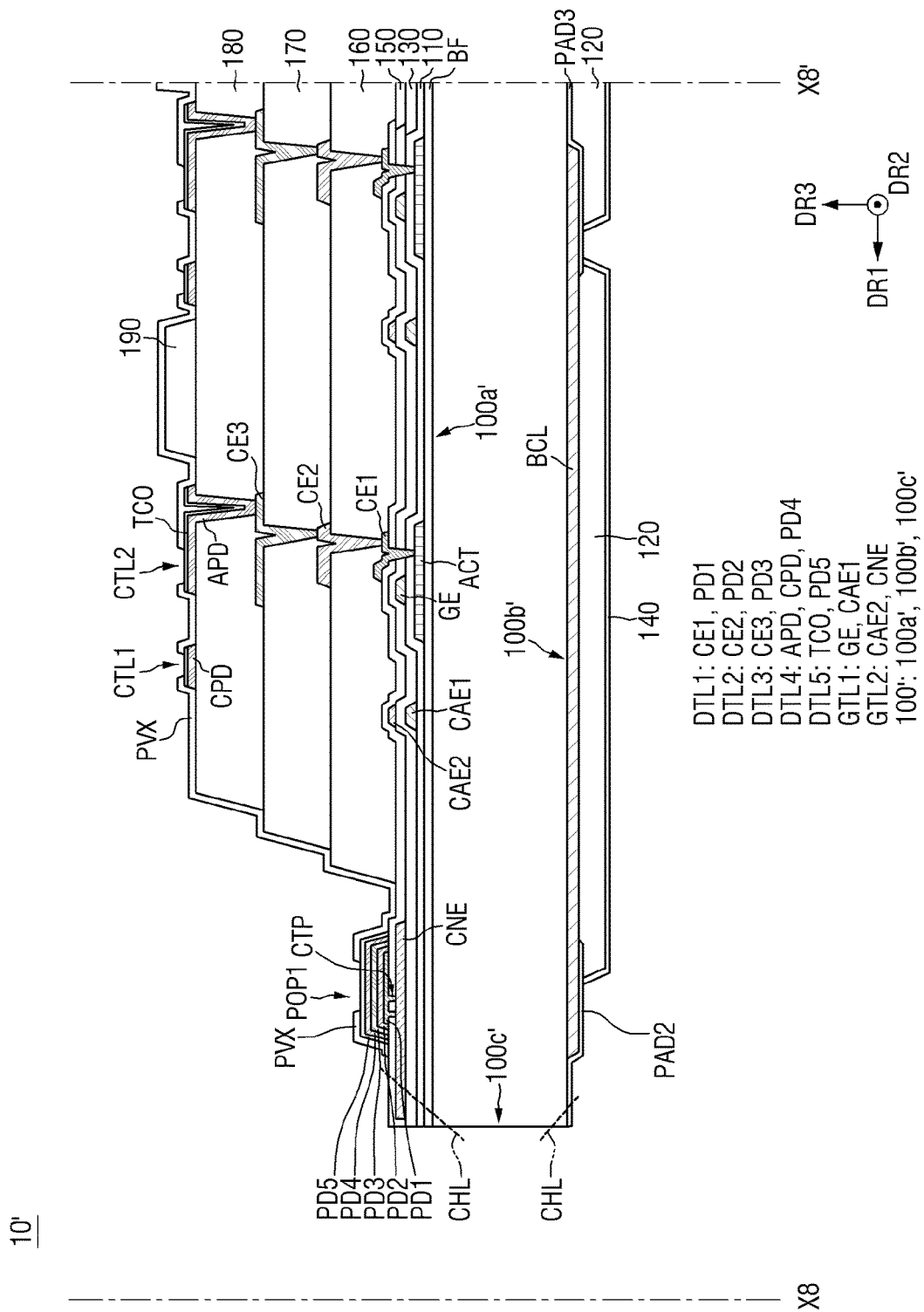

Once the scribing process for cutting along the scribing line SL is performed, the mother substrate MG is divided into a plurality of cell substrates 100', and the patterns on the mother substrate MG may remain on the plurality of cell substrates 100' to correspond to each of the plurality of cell substrates 100'. The cell substrate 100' may have a three-dimensional structure of a rectangular parallelepiped, or a three-dimensional structure similar to a rectangular parallelepiped. In other words, as shown in FIG. 24, the cell substrate 100' may have a rectangular parallelepiped shape composed of the front surface 100a', the rear surface 100b', and a plurality of side surfaces. The plurality of side surfaces of the cell substrate 100' may include a first side surface 100c', a second side surface, a third side surface, and a fourth side surface. In this case, the front surface 100a' of the cell substrate 100' may correspond to the first surface 100a of the substrate 100 of the above-described display device 10, the rear surface 100b' of the cell substrate 100' may correspond to the second surface 100b of the substrate 100 of the above-described display device 10, and the first side surface 100c' of the cell substrate 100' may correspond to the first side surface 100c of the substrate 100 of the display device 10, but the cell substrate 100' might not have surfaces corresponding to the plurality of chamfered surfaces of the substrate 100 of the display device 10. In other words, the cell substrate 100' may refer to a cell substrate in a state in which the plurality of chamfered surfaces are not formed on the substrate 100, that is, a chamfered-surface-forming process as will be described below might not be performed.

Meanwhile, the patterns formed on the upper and bottom surfaces of the mother substrate MG may include an upper connection wiring pattern CNE' and a second pad pattern PAD2'. The upper connection wiring pattern CNE' and the second pad pattern PAD2' may be located in each of the plurality of cell areas CA defined in the mother substrate MG. In other words, the plurality of upper connection wiring patterns CNE' and the second pad pattern PAD2' located in the cell area CA of the mother substrate MG may respectively correspond to the plurality of upper connection wirings CNE and the second pad PAD2 located in the display device 10.

The upper connection wiring pattern CNE' may include a first contact portion CNEb, a first wiring portion CNEa, and a first peeling portion pattern CNEc'. There is a difference between the upper connection wiring pattern CNE' in the cell area CA and the upper connection wiring CNE of the display device 10 in the presence or absence of the first peeling pattern PLA1, and the other configurations thereof may be substantially the same or similar. For example, in comparison with the first peeling portion CNEc of the upper connection wiring CNE of FIG. 10, the difference is that the first peeling pattern PLA1 is not formed in the first peeling portion pattern CNEc' of the upper connection wiring pattern CNE', and the other configurations are substantially the same or similar. In other words, the first peeling portion pattern CNEc' may be a pattern having a portion that is not peeled by the chamfered-surface-forming process to be described below.

Figure 21:
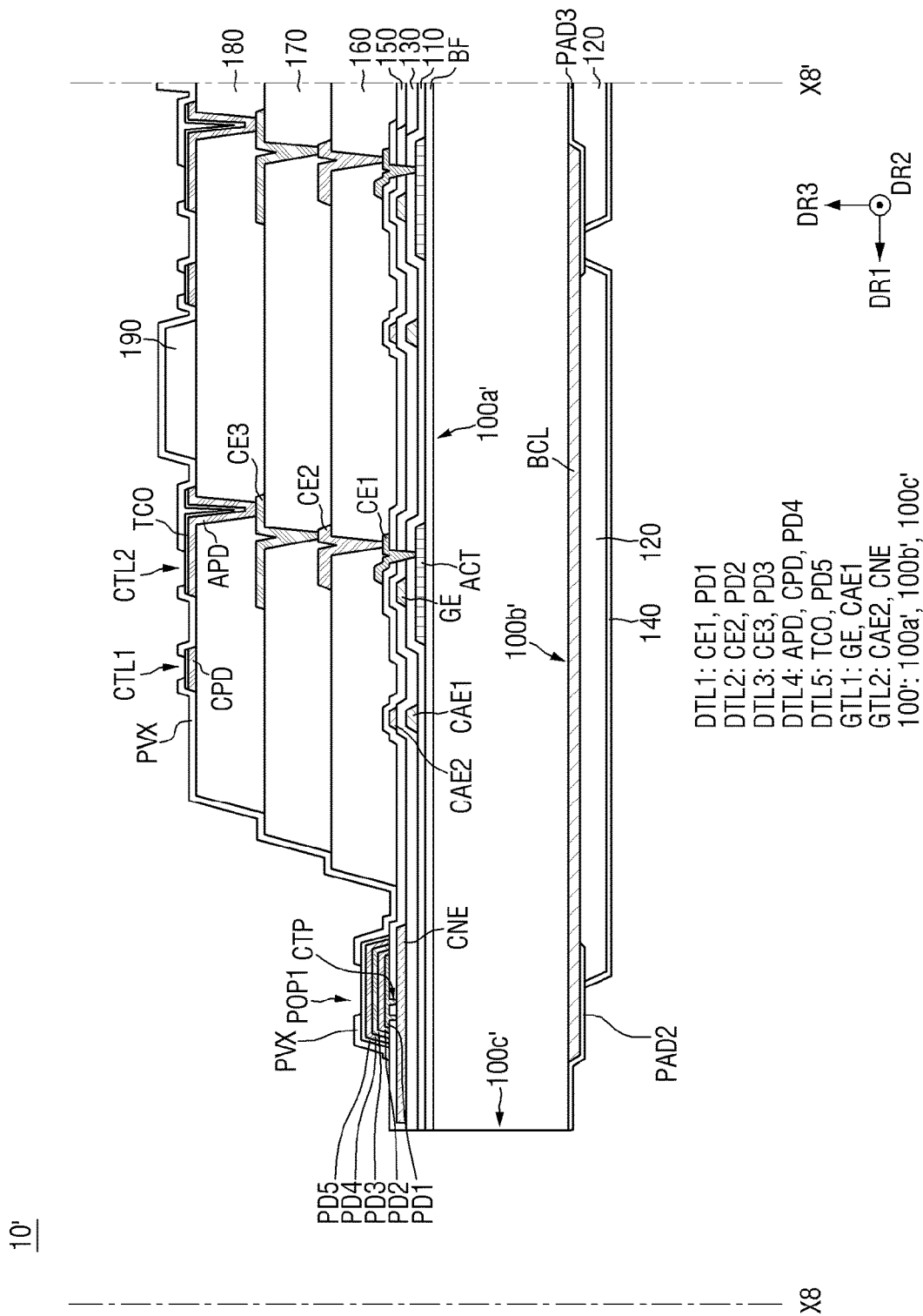

With reference to FIG. 21, an end of one side of the first peeling portion pattern CNEc' in the first direction DR1 may extend to an edge of the cell area CA. In other words, the first peeling portion pattern CNEc' has a shape that extends across the scribing line SL toward the scribing line SL on the mother substrate MG in a state before the scribing process is performed. After the scribing process is performed, because a portion of the first peeling portion pattern CNEc' on the mother substrate MG, which crosses the scribing line SL, is also scribed while the scribing line SL is scribed, the first peeling portion pattern CNEc' has a shape that extends toward the first side surface 100c' of the cell substrate 100' that is formed by the scribing process, and comes into contact with the end of the front surface 100a' of the cell substrate 100'.

The second pad pattern PAD2' may include a first pattern portion PAD2a' and a second portion PAD2b. The first pattern portion PAD2a' may include a second contact portion PAD2aa and a second peeling portion pattern PAD2ab'. The first pattern portion PAD2a' in the cell area CA is different from the first portion PAD2a of the display device 10 in that whether the second peeling pattern PLA2 is present, and the other configurations may be substantially the same or similar. For example, in comparison with the second peeling portion PAD2ab of the first portion PAD2a of FIG. 14, the difference is that the second peeling pattern PLA2 is not formed in the second peeling portion pattern PAD2ab' of the first pattern portion PAD2a', and the other configurations are substantially the same or similar. In other words, the second peeling portion pattern PAD2ab' may be a pattern having a portion that is not peeled by the chamfered-surface-forming process to be described below.

Figure 22:
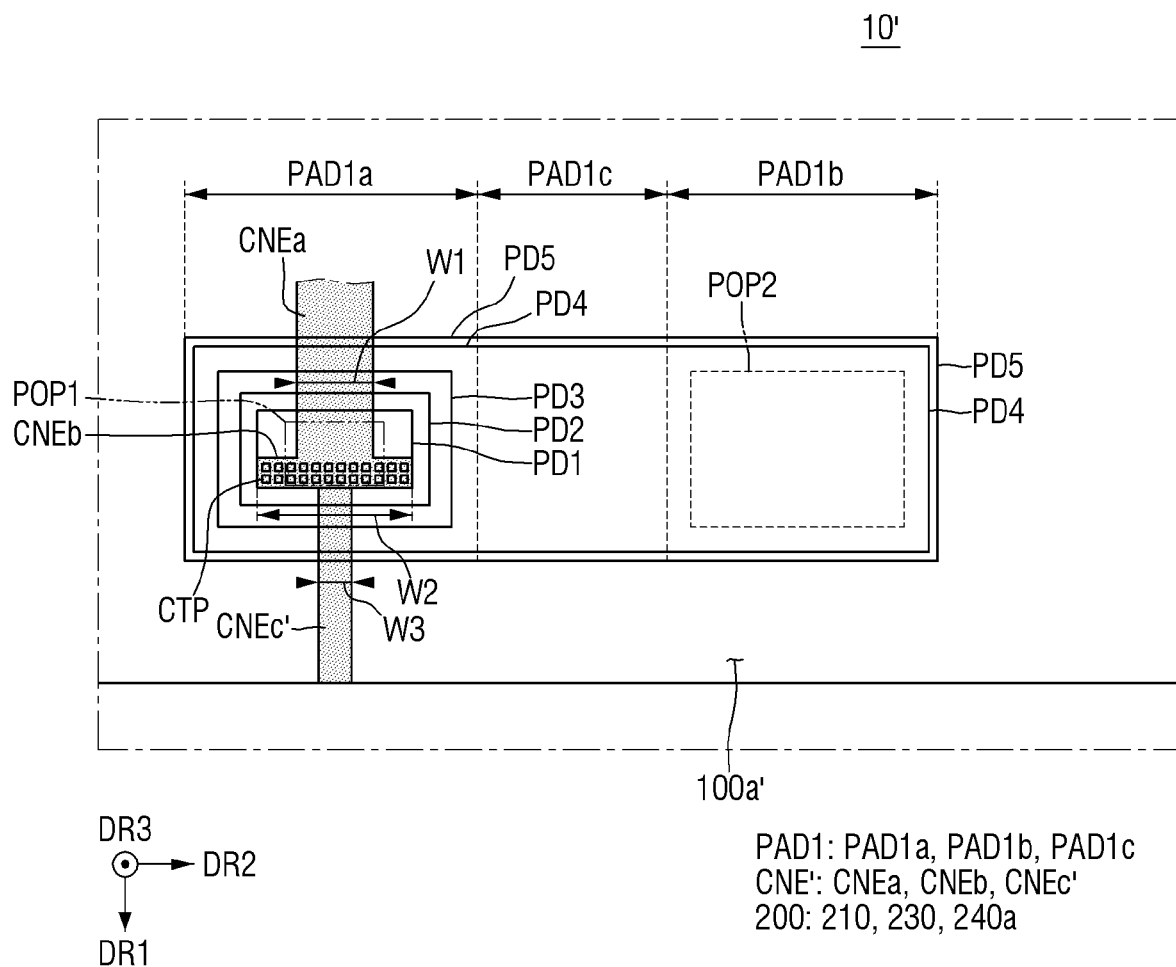
Figure 23:
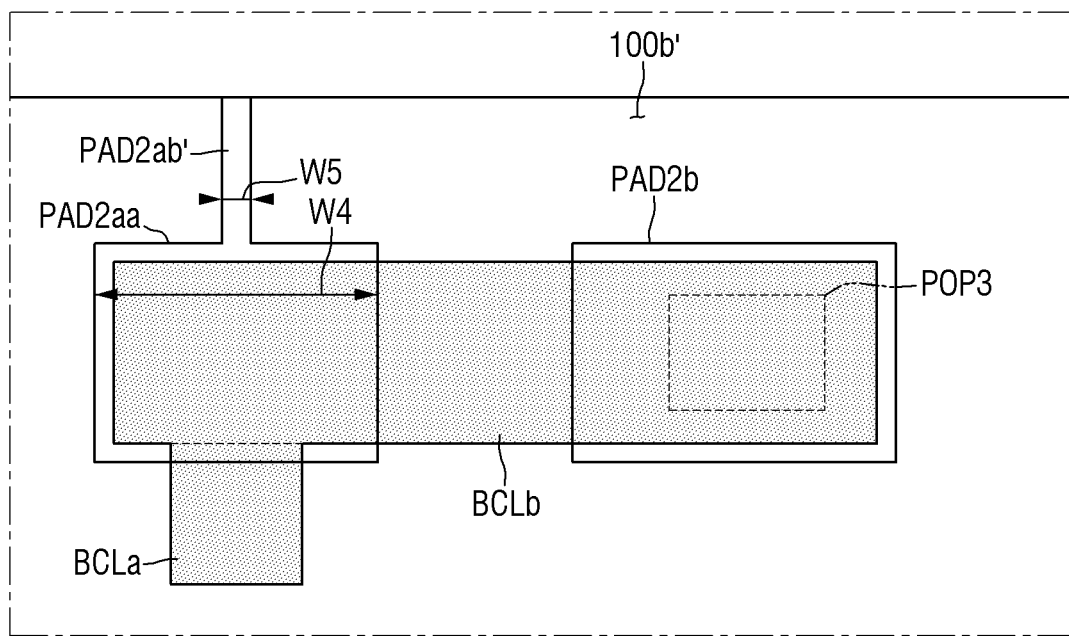

With reference to FIG. 22, an end of one side of the second peeling portion pattern PAD2ab' in the first direction DR1 may extend to the edge of the cell area CA. In other words, the second peeling portion pattern PAD2ab' has a shape that extends across the scribing line SL toward the scribing line SL on the mother substrate MG in a state before the scribing process is performed, and after the scribing process is performed, because a portion of the second peeling portion pattern PAD2ab' on the mother substrate MG, which crosses the scribing line SL, is also scribed while the scribing line SL is scribed, the second peeling portion pattern PAD2ab' has a shape that extends toward the first side surface 100c' of the cell substrate 100' formed by the scribing process, and also comes into contact with the end of the front surface 100a' of the cell substrate 100'.

Subsequently, referring to FIGS. 24 to 27, the edge of the cell substrate 100' of the cell 10' is processed to form a chamfered surface. For example, the process of forming the chamfered surface may be performed using physical friction.

Figure 25:
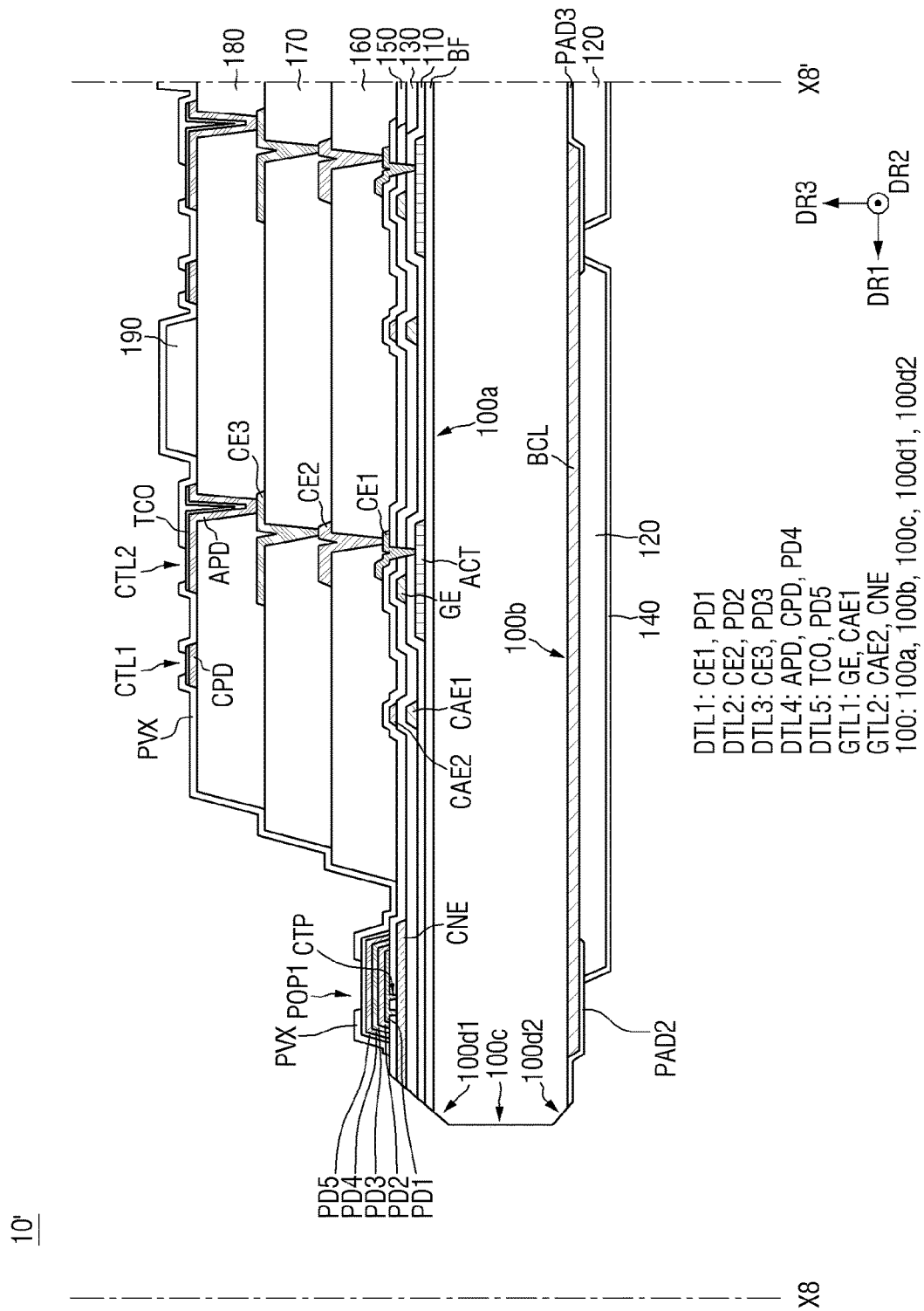

As shown in FIGS. 24 and 25, the cell substrate 100' may be processed into the substrate 100, on which the plurality of chamfered surfaces are formed, by removing a portion of the edge of the cell substrate 100' by applying physical friction along a virtual chamfering line CHL in the vicinity of the edge of the cell substrate 100'. In this case, the cell 10' includes the substrate 100.

Meanwhile, when physical friction is applied along the chamfering line CHL in the vicinity of the edge of the cell substrate 100', some element layers located on the front surface 100a' of the cell substrate 100' and some element layers located on the rear surface 100b' may be removed along the chamfering line CHL together with the portion of the edge of the cell substrate 100'.

Figure 26:
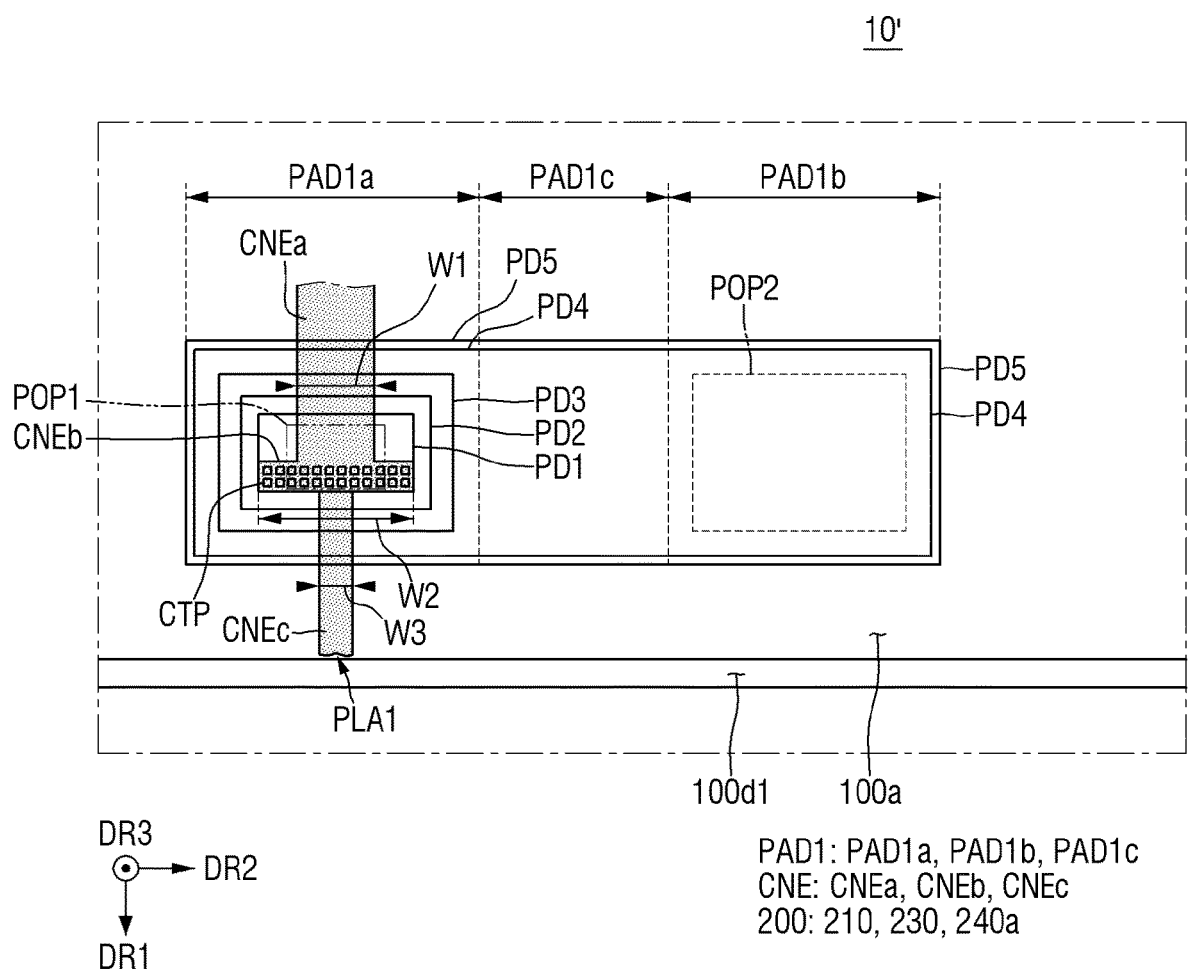

Accordingly, because one end of the first peeling portion pattern CNEc' and one end of the second peeling portion pattern PAD2ab' are peeled off, the one end of the first peeling portion pattern CNEc' and the one end of the second peeling portion pattern PAD2ab' may be respectively processed into the first peeling portion CNEc including the first peeling pattern PLA1 and the second peeling portion PAD2ab including the second peeling pattern PLA2, as shown in FIGS. 26 and 27.

In this case, because a width W3 of the first peeling portion pattern CNEc' is less than a width W2 of the first contact portion CNEb, it may be less affected by the physical friction used in forming the chamfered surface. The influence of the physical friction used in forming the chamfered surface has a correlation proportional to the width W3 of the first peeling portion pattern CNEc', and accordingly, when the width W3 of the first peeling portion pattern CNEc' is substantially the same as or similar to the width W2 of the first contact portion CNEb, it may be relatively greatly affected by the physical friction used in forming the chamfered surface, and thus there is a risk that the first peeling portion pattern CNEc' may not be properly in contact with the first upper pad electrode PD1 because the first peeling portion pattern CNEc' is peeled off up to the vicinity of the first contact portion CNEb. Accordingly, the influence of the physical friction used in forming the chamfered surface may be reduced by forming the width W3 of the first peeling portion pattern CNEc' to be less than the width W2 of the first contact portion CNEb, so that the likelihood of the first peeling portion pattern CNEc' being peeled off up to the first contact portion CNEb may be reduced or prevented.

Similarly, because a width W5 of the second peeling portion pattern PAD2ab' is less than a width W4 of the second contact portion PAD2aa, it may be less affected by the physical friction used in forming the chamfered surface.

The influence of the physical friction used in forming the chamfered surface has a correlation proportional to the width W5 of the second peeling portion pattern PAD2ab', and accordingly, when the width W5 of the second peeling portion pattern PAD2ab' is substantially the same as or similar to the width W4 of the second contact portion PAD2aa, it is relatively greatly affected by the physical friction used in forming the chamfered surface, and thus there is a risk that the second peeling portion pattern PAD2ab' may not be properly in contact with the bottom connection wiring BCL because the second peeling portion pattern PAD2ab' is peeled off up to the vicinity of the second contact portion PAD2aa. Accordingly, the influence of the physical friction used in forming the chamfered surface may be reduced by forming the width W5 of the second peeling portion pattern PAD2ab' to be less than the width W4 of the second contact portion PAD2aa, so that the likelihood of second peeling portion pattern PAD2ab' being peeled off up to the second contact portion PAD2aa may be reduced or prevented.

Figure 28:
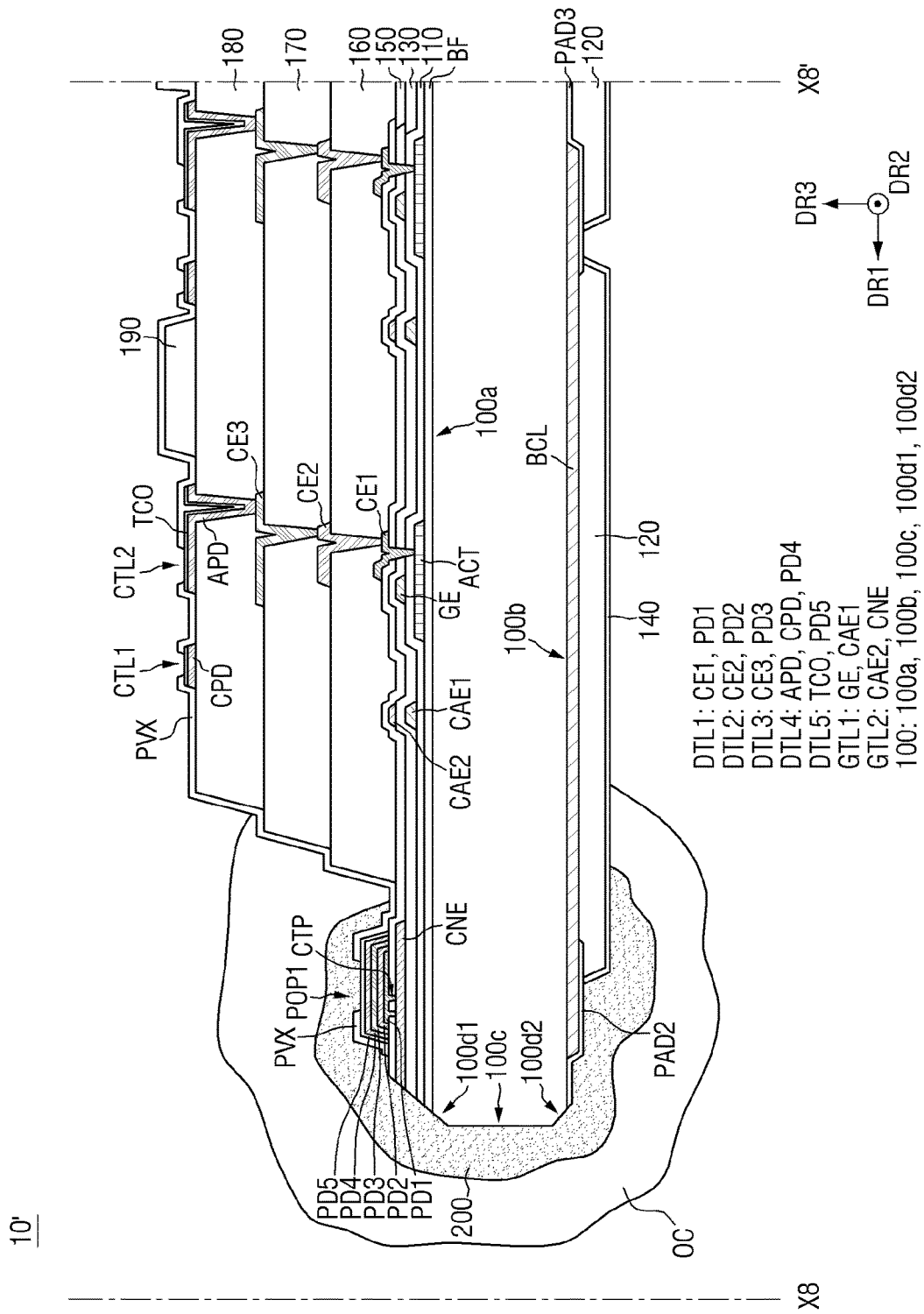

Subsequently, referring to FIG. 28, a side wiring 200 and an overcoat layer OC are formed on one side of the substrate 100 on which a plurality of chamfered surfaces are formed. A process of forming the side wiring 200 may be performed, for example, by printing a metal pattern in a Si-mold so that the Si-mold is in contact with one side of the substrate 100 on which the plurality of chamfered surfaces are formed and transferring the metal pattern.

In comparison with a state in which the plurality of chamfered surfaces are not formed, in the substrate 100 on which the plurality of chamfered surfaces are formed, a bending angle of the side wiring 200 may be gentle due to the plurality of chamfered surfaces, so that it is possible to reduce or prevent the likelihood of chipping or cracks occurring in the side wiring 200.

Thereafter, the light-emitting element LE, the circuit board CB, and the driving circuit DC are located in the cell 10' to manufacture the display device 10.

Hereinafter, a structure of a tiled display including the display device according to one or more embodiments will be described.

Figure 29:
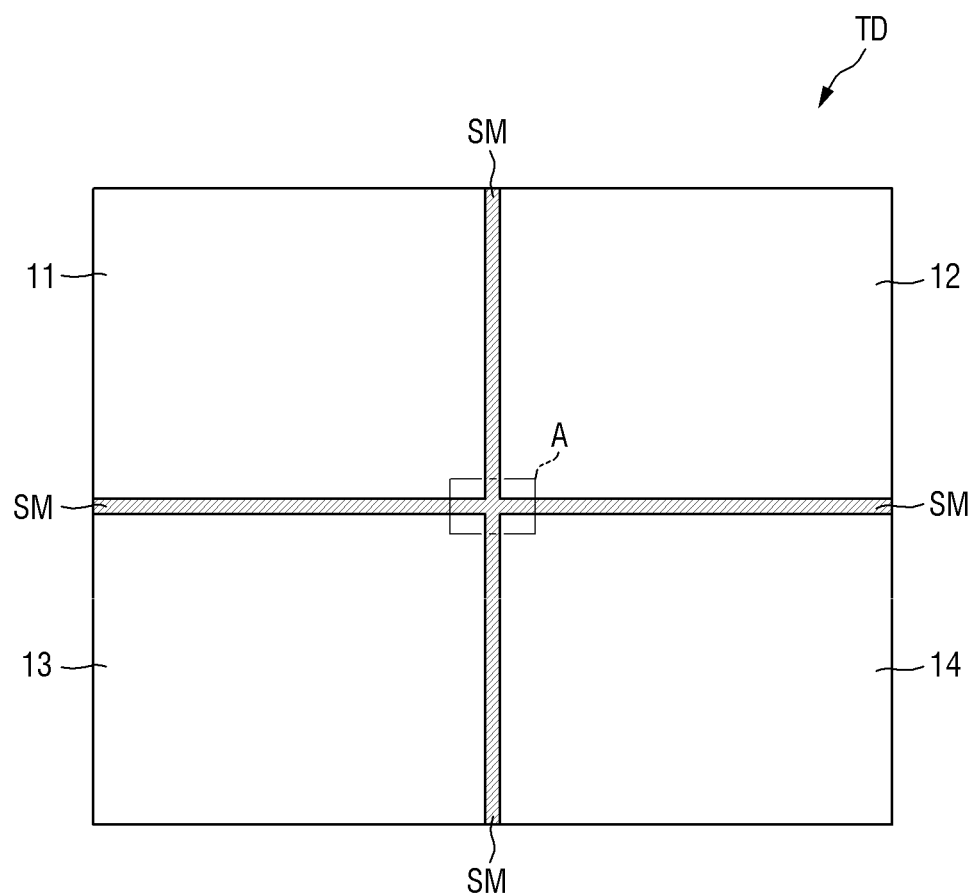
FIG. 29 is a view schematically illustrating a tiled display using the display device according to one or more embodiments.
Figure 30:
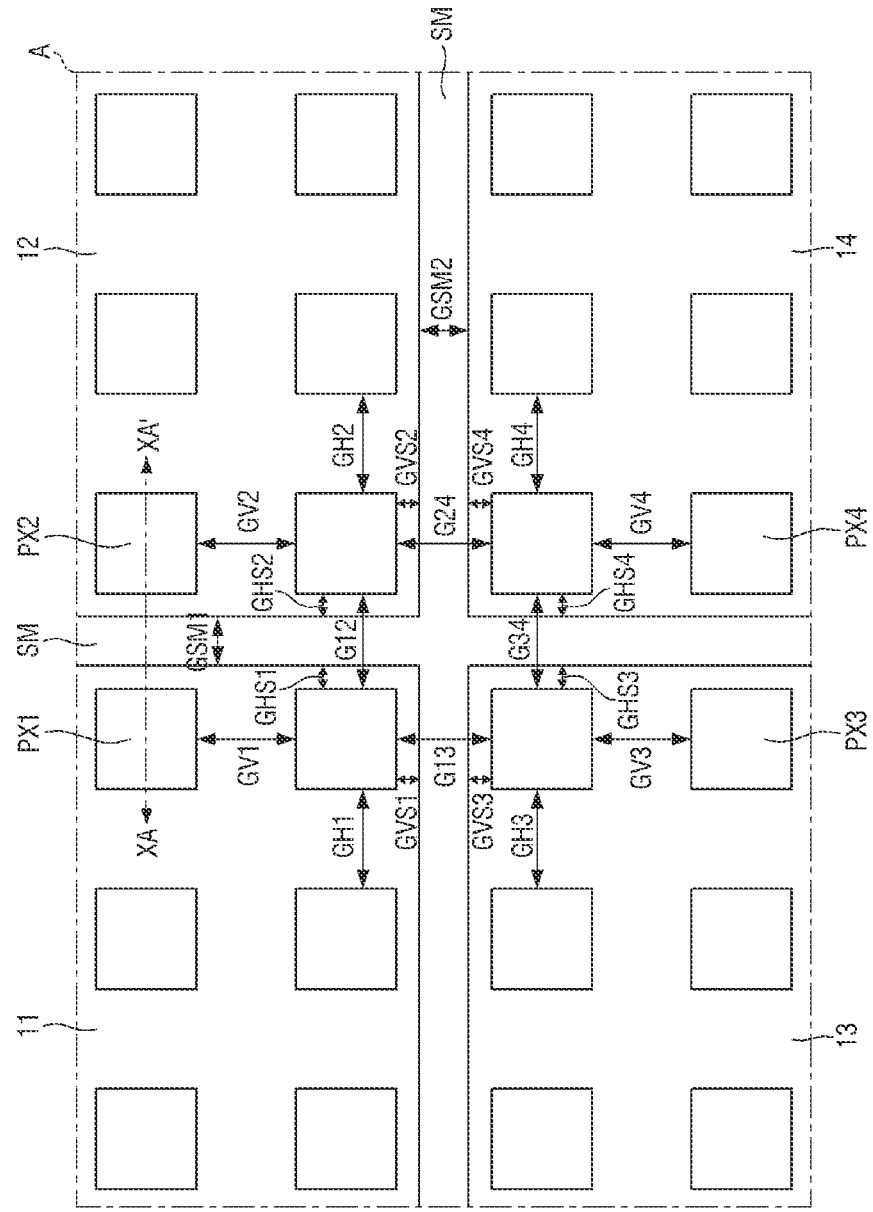
FIG. 30 is an enlarged view illustrating area A of FIG. 29.
Figure 31:
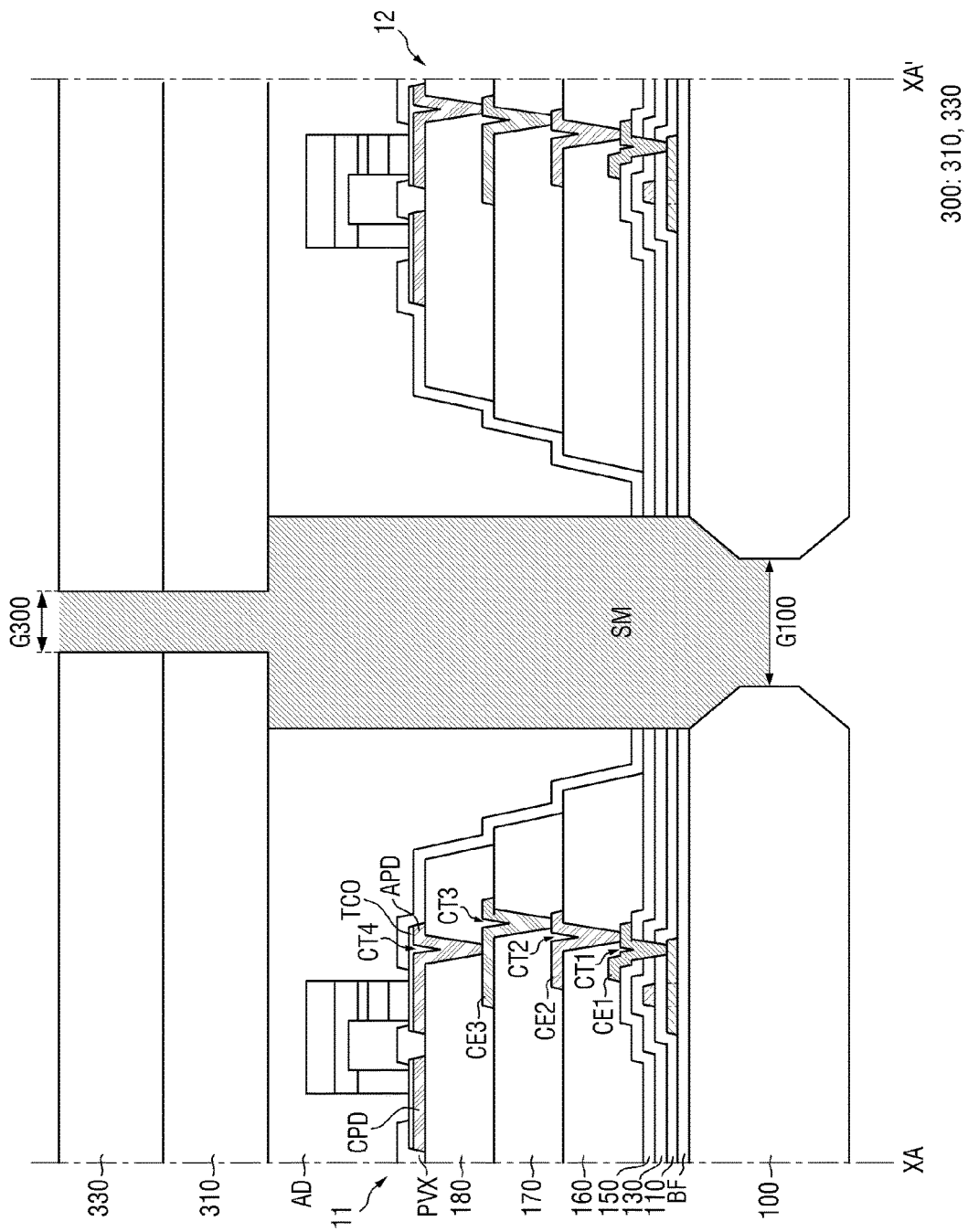
FIG. 31 is a cross-sectional view illustrating a cross section taken along the line X2-X2' of FIG. 30.

FIG. 29 is a view schematically illustrating the tiled display using the display device according to one or more embodiments. FIG. 30 is an enlarged view illustrating area A of FIG. 29. FIG. 31 is a cross-sectional view illustrating a cross section taken along the line X2-X2' of FIG. 30.

Referring to FIGS. 29-31, a tiled display TD may include a plurality of display devices 10, a seam part SM, and a front cover 300. For convenience of description, in each of the plurality of display devices 10 shown in FIG. 29, according to a relative positional relationship, the display device 10 positioned at an upper left side will be referred to as a first display device 11, the display device 10 positioned at an upper right side will be referred to as a second display device 12, the display device 10 positioned at a lower left side will be referred to as a third display device 13, and the display device 10 positioned at a lower right side will be referred to as a fourth display device 14. Although the tiled display device 10 is illustrated in FIG. 29 as including four display devices 10 of the first display device 11, the second display device 12, the third display device 13, and the fourth display device 14, the number of the display devices 10 that may be included in the tiled display TD is not limited thereto. In the present specification, the tiled display TD may be referred to as a tiled display device.

The plurality of display devices 11, 12, 13, and 14 may be arranged in a grid form. The plurality of display devices 11, 12, 13, and 14 may be arranged in the form of a matrix having M rows (where M is a positive integer) and N columns (where N is a positive integer). In FIG. 29, it is illustrated that the first display device 11 and the second display device 12 are adjacent to each other in the first direction DR1, the first display device 11 and the third display device 13 are adjacent to each other in the second direction DR2, the third display device 13 and the fourth display device 14 are adjacent to each other in the first direction DR1, and the second display device 12 and the fourth display device 14 are adjacent to each other in the second direction DR2, but the arrangement of the plurality of display devices constituting the tiled display TD is not limited thereto. That is, the number and arrangement of the display devices in the tiled display TD may be determined according to the size of each of the display device 10 and the tiled display TD and the shape of the tiled display TD. Hereinafter, for convenience of description, it will be mainly described that the tiled display TD includes four display devices, and each of the plurality of display devices 11, 12, 13, and 14 is located in two rows and two columns.

The plurality of display devices 11, 12, 13, and 14 constituting the tiled display TD may have the same size, but the disclosure is not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be arranged such that the long sides or short sides thereof are connected to each other. Some or the entirety of the plurality of display devices 11, 12, 13, and 14 may be located at an edge of the tiled display TD and may form one side of the tiled display TD. At least one display device 10 among the plurality of display devices 11, 12, 13, and 14 may be located on at least one corner of the tiled display TD and may form two adjacent sides of the tiled display TD. At least one display device among the plurality of display devices 11, 12, 13, and 14 may be surrounded by the other display devices.

Each of the plurality of display devices 11, 12, 13, and 14 may be substantially the same as the display device 10 described with reference to FIG. 1. Thus, a repeated description of each of the plurality of display devices 11, 12, 13, and 14 is omitted.

The seam part SM may include a coupling member or an adhesive member. In this case, the plurality of display devices 11, 12, 13, and 14 may be connected to each other through the coupling member or adhesive member of the seam part SM. The seam part SM may be located between the first display device 11 and the second display device 12, between the first display device 11 and the third display device 13, between the second display device 12 and the fourth display device 14, and between the third display device 13 and the fourth display device 14.

Referring to FIG. 30, the seam part SM may have a planar shape that is cross-shaped (+), of a cross, or of a plus sign in a central area of the tiled display TD, at which the first display device 11, the second display device 12, the third display device 13, and the fourth display device 14 are adjacent to each other. The seam part SM may be located between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form along a row direction (a horizontal direction with reference to FIG. 30), and a column direction (a vertical direction with reference to FIG. 30) crossing the row direction to display an image. The second display device 12 may include second pixels PX2 arranged in a matrix form along the row direction and the column direction to display an image. The third display device 13 may include third pixels PX3 arranged in a matrix form along the row direction and the column direction to display an image. The fourth display device 14 may include fourth pixels PX4 arranged in a matrix form along the row direction and the column direction to display an image. Because each of the first pixel PX1, the second pixel PX2, the third pixel PX3, and the fourth pixel PX4 is substantially the same as the pixel PX of the display device 10, a detailed description of a structure of each of the first pixel PX1, the second pixel PX2, the third pixel PX3, and the fourth pixel PX4 will be omitted.

A minimum distance between the first pixels PX1 adjacent in the first direction DR1 is defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The seam part SM may be located between the first pixel PX1 and the second pixel PX2 adjacent in the row direction. A minimum distance G12 between the first pixel PX1 and the second pixel PX2 adjacent in the row direction may be a sum of a minimum distance GHS1 between the first pixel PX1 and the seam part SM in the row direction, a minimum distance GHS2 between the second pixel PX2 and the seam part SM in the row direction, and a width GSM1 of the seam part SM in the row direction.

The minimum distance G12 between the first pixel PX1 and the second pixel PX2 adjacent in the row direction, the first horizontal separation distance GH1, and the second horizontal separation distance GH2 may be substantially the same. To this end, the minimum distance GHS1 between the first pixel PX1 and the seam part SM in the row direction may be less than the first horizontal separation distance GH1, and the minimum distance GHS2 between the second pixel PX2 and the seam part SM in the row direction may be less than the second horizontal separation distance GH2. In addition, the width GSM1 of the seam part SM in the row direction may be less than the first horizontal separation distance GH1 or the second horizontal separation distance GH2.

A minimum distance between third pixels PX3 adjacent in the row direction may be defined as a third horizontal separation distance GH3, and a minimum distance between the fourth pixels PX4 adjacent in the row direction may be defined as a fourth horizontal separation distance GH4. The third horizontal separation distance GH3 and the fourth horizontal separation distance GH4 may be substantially the same.

The seam part SM may be located between the third pixel PX3 and the fourth pixel PX4 adjacent in the row direction. A minimum distance G34 between the third pixel PX3 and the fourth pixel PX4 that are adjacent in the row direction may be a sum of a minimum distance GHS3 between the third pixel PX3 and the seam part SM in the row direction, a minimum distance GHS4 between the fourth pixel PX4 and the seam part SM in the row direction, and the width GSM1 of the seam part SM in the row direction.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the seam part SM in the row direction may be less than the third horizontal separation distance GH3, and the minimum distance GH4 between the fourth pixel PX4 and the seam part SM in the row direction may be less than the fourth horizontal separation distance GH4. In addition, the width GSM1 of the seam part SM in the row direction may be less than the third horizontal separation distance GH3 or the fourth horizontal separation distance GH4.

A minimum distance between the first pixels PX1 adjacent in the column direction may be defined as a first vertical separation distance GV1, and a minimum distance between the third pixels PX3 adjacent in the column direction may be defined as a third vertical separation distance GV3. The first vertical separation distance GV1 and the third vertical separation distance GV3 may be substantially the same.

The seam part SM may be located between the first pixel PX1 and the third pixel PX3 adjacent in the column direction. A minimum distance G13 between the first pixel PX1 and the third pixel PX3 that are adjacent in the column direction may be a sum of a minimum distance GVS1 between the first pixel PX1 and the seam part SM in the column direction, a minimum distance GVS3 between the third pixel PX3 and the seam part SM in the column direction, and a width GSM2 of the seam part SM in the column direction.

The minimum distance G13 between the first pixel PX1 and the third pixel PX3 adjacent in the column direction, the first vertical separation distance GV1, and the third vertical separation distance GV3 may be substantially the same. To this end, the minimum distance GVS1 between the first pixel PX1 and the seam part SM in the column direction may be less than the first vertical separation distance GV1, and the minimum distance GVS3 between the third pixel PX3 and the seam part SM in the column direction may be less than the third vertical separation distance GV3. In addition, the width GSM2 of the seam part SM in the column direction may be less than the first vertical separation distance GV1 or the third vertical separation distance GV3.

A minimum distance between the second pixels PX2 adjacent in the column direction may be defined as a second vertical separation distance GV2, and a minimum distance between the fourth pixels PX4 adjacent in the column direction may be defined as a fourth vertical separation distance GV4. The second vertical separation distance GV2 and the fourth vertical separation distance GV4 may be substantially the same.

The seam part SM may be located between the second pixel PX2 and the fourth pixel PX4 adjacent in the column direction. A minimum distance G24 between the second pixel PX2 and the fourth pixel PX4 adjacent in the column direction may be a sum of a minimum distance GVS2 between the second pixel PX2 and the seam part SM in the column direction, a minimum distance GVS4 between the fourth pixel PX4 and the seam part SM in the column direction, and the width GSM2 of the seam part SM in the column direction.

The minimum distance G24 between the second pixel PX2 and the fourth pixel PX4 adjacent in the column direction, the second vertical separation distance GV2, and the fourth vertical separation distance GV4 may be substantially the same. To this end, the minimum distance GVS2 between the second pixel PX2 and the seam part SM in the column direction may be less than the second vertical separation distance GV2, and the minimum distance GVS4 between the fourth pixel PX4 and the seam part SM in the column direction may be less than the fourth vertical separation distance GV4. In addition, the width GSM2 of the seam part SM in the column direction may be less than the second vertical separation distance GV2 or the fourth vertical separation distance GV4.

To reduce or prevent the likelihood of the seam part SM being observed between images displayed by the plurality of display devices 11, 12, 13, and 14, the minimum distance between the pixels PX of the adjacent display devices 10 may be substantially the same as the minimum distance between the pixels PX of each of the display devices 10, as shown in FIG. 30.

Referring to FIG. 31, a plurality of front covers 300 may be respectively located on upper portions of the plurality of display devices 11, 12, 13, and 14. For convenience of description, the front cover 300 located on the first display device 11 is referred to as a first front cover, the front cover 300 located on the second display device 12 is referred to as a second front cover, the front cover 300 located on the third display device 13 is referred to as a third front cover, and the front cover 300 located on the fourth display device 14 is referred to as a fourth front cover. The plurality of display devices 11, 12, 13, and 14 and the plurality of front covers 300 corresponding to the plurality of display devices 11, 12, 13, and 14 may be respectively bonded to each other through adhesive members AD. FIG. 31 illustrates an arrangement structure of the first display device 11 and the second display device 12, and the first front cover and the second front cover respectively corresponding to the first display device 11 and the second display device 12. Because an arrangement structure of the third display device 13 and the third front cover and the fourth display device 14 and the fourth front cover is substantially the same as the arrangement structure of the first display device 11 and the second display device 12 and the first front cover and the second front cover corresponding to the first display device 11 and the second display device 12, hereinafter, the first front cover and the second front cover will be mainly described, and similar detailed descriptions of the third front cover and the fourth front cover will be omitted.

The first front cover may be located on the first display device 11 and may protrude more than the substrate 100 of the first display device 11. Thus, a gap G100 between the substrate 100 of the first display device 11 and the substrate 100 of the second display device 12 may be greater than a gap G300 between the first front cover and the second front cover.

Each of the plurality of front covers 300 may include a light transmittance control layer 310 and an anti-glare layer 320.

As described above, each of the plurality of front covers 300 may be bonded to the corresponding display device 10 by the adhesive member AD. The adhesive member AD may be a transparent adhesive member capable of transmitting light. For example, the adhesive member AD may be an optically cleared adhesive film or an optically cleared resin.

The light transmittance control layer 310 may be located on the adhesive member AD. The light transmittance control layer 310 may be designed to reduce the transmittance of external light or of light reflected by the first display device 11 and the second display device 12. In addition, as described above, because the front cover 300 protrudes more than the substrate 100, the light transmittance control layer 310 included in the front cover 300 may also protrude more than the substrate 100. Accordingly, observability of the gap G100 between the substrate 100 of the first display device 11 and the substrate 100 of the second display device 12 from the outside may be reduced or prevented.

The anti-glare layer 320 may be located on the light transmittance control layer 310. The anti-glare layer 320 may be designed to diffusely reflect external light to reduce or prevent visibility of an image being deteriorated as the external light is reflected as it is. Accordingly, a contrast ratio of an image displayed by the first display device 11 and the second display device 12 may be increased due to the anti-glare layer 320.

The anti-glare layer 320 may be implemented as a polarizing plate, and the light transmittance control layer 310 may be implemented as a phase retardation layer, but the embodiments of the present specification are not limited thereto.

Hereinafter, a driving method of the tiled display TD according to one or more embodiments will be described.

Figure 32:
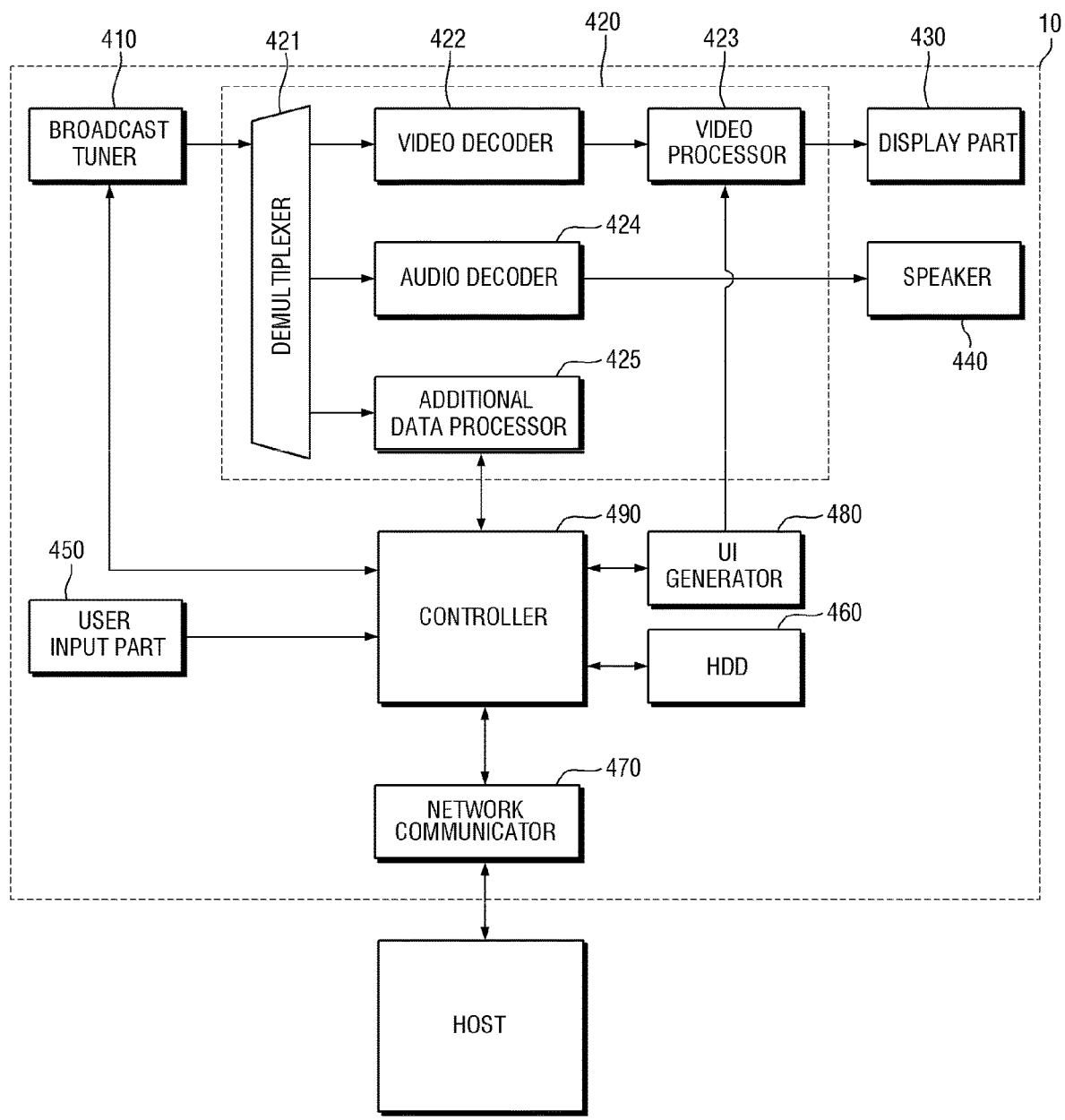
FIG. 32 is a block diagram illustrating a structure of the tiled display according to one or more embodiments.
Figure 33:
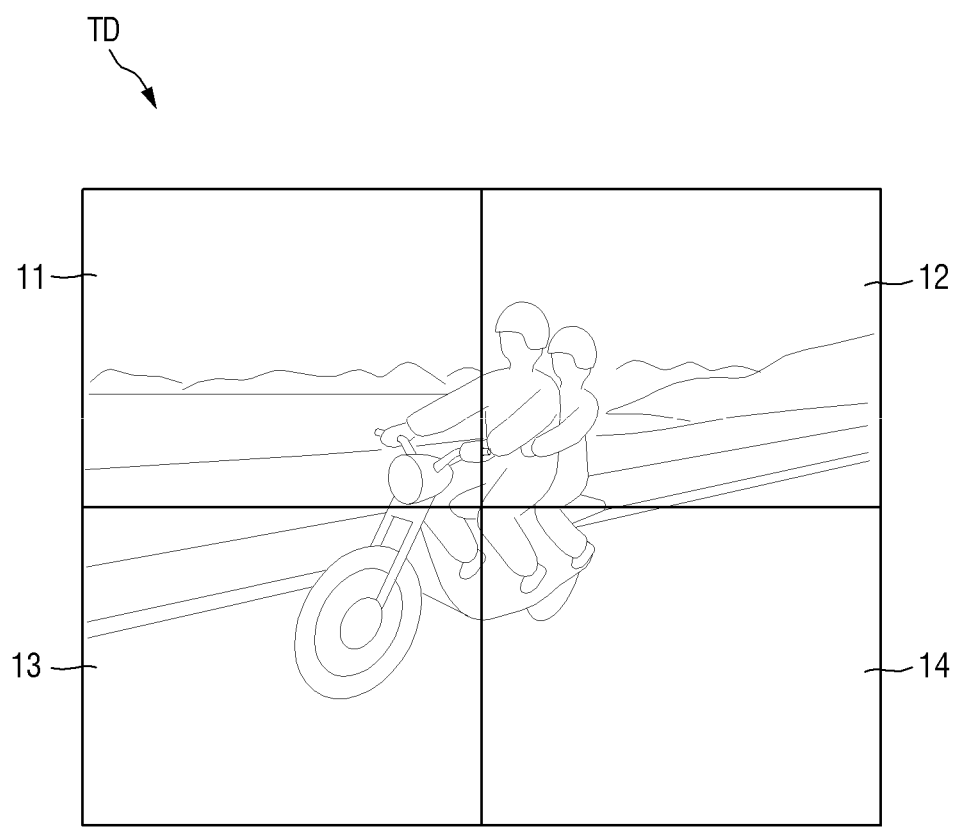
FIG. 33 is a diagram illustrating a state in which the tiled display using the display device according to one or more embodiments is driven.

FIG. 32 is a block diagram illustrating a structure of the tiled display according to one or more embodiments. FIG. 33 is a diagram illustrating a state in which the tiled display using the display device according to one or more embodiments is driven.

Referring to FIGS. 32 and 33, the tiled display TD according to one or more embodiments may include a host system HOST and a broadcast tuner 410, a signal processor 420, a display part 430, a speaker 440, a user input part 450, a hard-disk drive (HDD) 460, a network communicator 470, a user interface (UI) generator 480, and a controller 490 that are included in each of the plurality of display devices 11, 12, 13, and 14. In FIG. 32, the host system HOST and the first display device 11 are illustrated as an example.

The host system HOST may be implemented as any one of a television system, a home theater system, a set-top box, a navigation system, a digital video disk (DVD) player, a Blu-ray player, a PC, a mobile phone system, and a tablet.

A user command may be input into the host system HOST in various formats. For example, a command by a user's touch input may be input to the host system HOST. Alternatively, a user command may be input to the host system HOST by a keyboard input or a button input of a remote controller.

The host system HOST may receive original video data ODATA corresponding to an original image from the outside. The host system HOST may divide the original video data ODATA into a number equal to the number of the display devices 10. For example, the host system HOST may divide the original video data ODATA into first video data DATA1 corresponding to a first image, second video data DATA2 corresponding to a second image, third video data DATA3 corresponding to a third image, and fourth video data DATA4 corresponding to a fourth image to respectively correspond to the first display device 11, the second display device 12, the third display device 13, and the fourth display device 14. The host system HOST may transmit the first video data DATA1 to the first display device 11, transmit the second video data DATA2 to the second display device 12, transmit the third video data DATA3 to the third display device 13, and transmit the fourth video data DATA4 to the fourth display device 14.

The first display device 11 may display the first image according to the first video data DATA1, the second display device 12 may display the second image according to the second video data DATA2, the third display device 13 may display the third image according to the third video data DATA3, and the fourth display device 14 may display the fourth image according to the fourth video data DATA4. Accordingly, the user may watch the original image in which the first to fourth images, which are displayed respectively on the first to fourth display devices 10 to 14, are combined as shown in FIG. 33.

Each of the plurality of display devices 11, 12, 13, and 14 constituting the tiled display TD may further include the broadcast tuner 410, the signal processor 420, the display part 430, the speaker 440, the user input part 450, the HDD 460, the network communicator 470, the UI generator 480, and the controller 490. Because a configuration included in each of the plurality of display devices 11, 12, 13, and 14 is substantially the same, hereinafter, for convenience of description, the configuration included in the first display device 11 will be mainly described, and the description of the configuration included in each of the second display device 12, the third display device 13, and the fourth display device 14 will be omitted.

The broadcast tuner 410 may tune a channel frequency (e.g., a predetermined channel frequency) according to control of the controller 490 to receive a broadcast signal of a corresponding channel through an antenna. The broadcast tuner 410 may include a channel detection module and a radio frequency (RF) demodulation module.

The broadcast signal demodulated by the broadcast tuner 410 is processed by the signal processor 420 and output to the display part 430 and the speaker 440. Here, the signal processor 420 may include a demultiplexer 421, a video decoder 422, a video processor 423, an audio decoder 424, and an additional data processor 425.

The demultiplexer 421 separates the demodulated broadcast signal into a video signal, an audio signal, and additional data. The separated video signal, audio signal, and additional data are respectively restored by the video decoder 422, the audio decoder 424, and the additional data processor 425. In this case, the video decoder 422, the audio decoder 424, and the additional data processor 425 restore the separated video signal, audio signal, and additional data in a decoding format corresponding to an encoding format used to transmit the broadcasting signal.

Meanwhile, the decoded video signal is converted to fit a vertical frequency, resolution, screen aspect ratio, or the like by the video processor 423 according to an output standard of the display part 430, and the decoded audio signal is output to the speaker 440.

The display part 430 is a device on which an image is displayed, and includes the above-described pixels PX, driver, and the like.

The user input part 450 may receive a signal transmitted by the host system HOST. The user input part 450 may be provided such that data about user selection and input of commands related to communication with other display devices 12 to 14, as well as data about channel selection and UI menu selection and operation transmitted by the host system HOST may be input.

The HDD 460 stores various software programs including an operating system (OS) program, recorded broadcast programs, videos, pictures, and other data, and may be composed of a storage medium, such as a hard disk or a non-volatile memory.

The network communicator 470 is for near-field communication with the host system HOST and the other display devices 12 to 14, and may be implemented as a communication module including an antenna pattern capable of implementing mobile communication, data communication, Bluetooth® (BLUETOOTH® is a registered trademark of Bluetooth Sig, Inc., Kirkland, WA), RF, Ethernet, and the like.

The network communicator 470 may transmit and receive wireless signals to/from at least one of a base station, an external terminal, and a server in a mobile communications network established according to technical standards or communications methods for mobile communications (for example, global system for mobile communications (GSM), code division multi access (CDMA), code division multi access 2000 (CDMA2000™), enhanced voice-data optimized or enhanced voice-data only (EV-DO), wideband CDMA (WCDMA), high speed downlink packet access (HSDPA), high speed uplink packet access (HSDPA), long term evolution (LTE), long term evolution-advanced (LTE-A), fifth generation (5G), and the like) through the antenna pattern to be described below.

The network communicator 470 may also transmit and receive wireless signals in a communication network according to wireless Internet technologies through the antenna pattern to be described below. The wireless Internet technologies may include, for example, wireless LAN (WLAN), wireless fidelity (Wi-Fi), Wi-Fi direct, Digital Living Network Alliance (DLNA), wireless broadband (Wi-Bro), Worldwide Interoperability for Microwave Access (WiMAX), High Speed Downlink Packet Access (HSDPA), High Speed Uplink Packet Access (HSUPA), Long Term Evolution (LTE), Long Term Evolution-Advanced (LTE-A), and like, and the antenna pattern may transmit and receive data in accordance with at least one wireless Internet technology within a range including Internet technologies that are not described above.

The UI generator 480 generates a UI menu for communication with the host system HOST and the other display devices 12 to 14, and may be implemented by an algorithm code and an on-screen-display (OSD) IC. The UI menu for communication with the host system HOST and the other display devices 12 to 14 may be a menu for specifying a counterpart digital TV with which communication is desired and selecting a desired function.

The controller 490 may be in charge of overall control of the first display device 11 and in charge of communication control of the host system HOST and the second to fourth display devices 12 to 14, may store a corresponding algorithm code for the control, and may be implemented by a micro controller unit (MCU) to execute the stored algorithm code.

The controller 490 controls such that a corresponding control command and data are transmitted to the host system HOST and the second to fourth display devices 12 to 14 through the network communicator 470 according to the input and selection by the user input part 450. When a control command (e.g., a predetermined control command) and data are input from the host system HOST and the second to fourth display devices 12 to 14, the operation is performed according to the corresponding control command.

Hereinafter, other embodiments of the display device 10 will be described. In the following embodiments, components that are the same as those in the above-described embodiments will be referred to with the same reference numerals, and duplicate descriptions thereof will be omitted or simplified, and differences will be mainly described.

Figure 34:
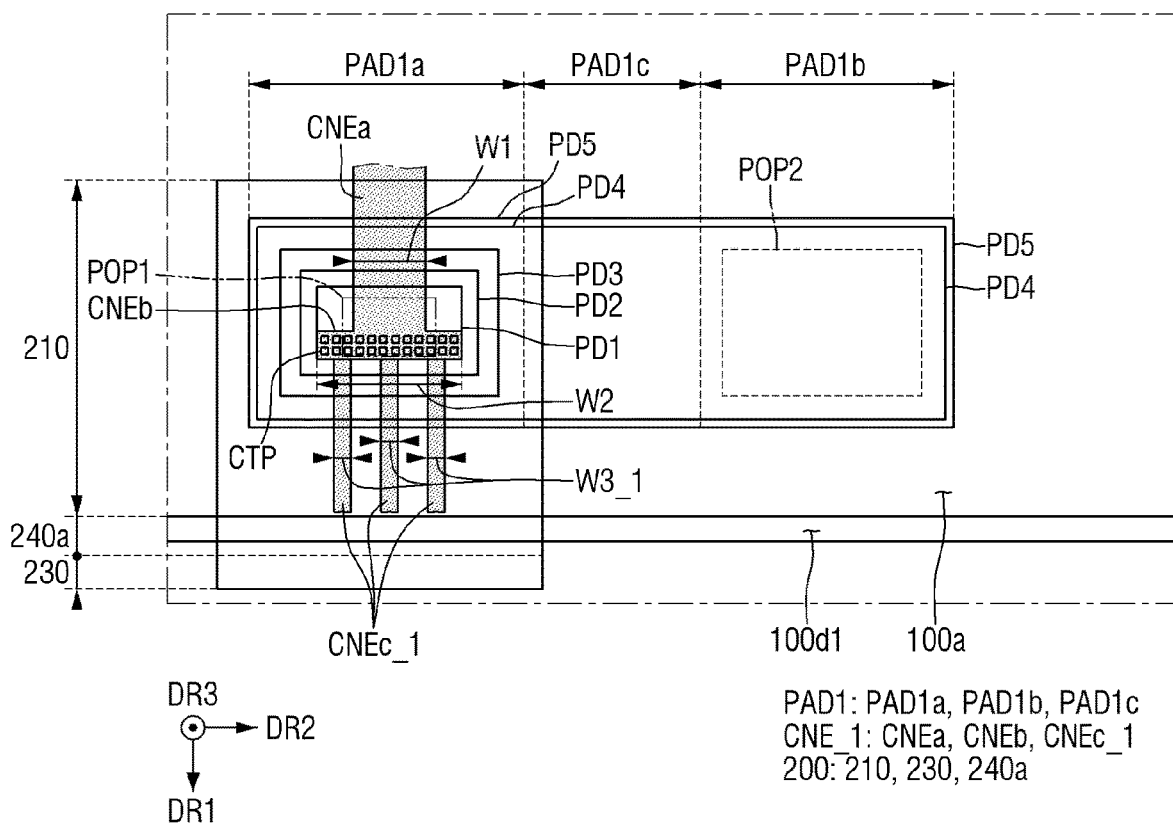
FIG. 34 is a layout diagram illustrating a structure of a first pad and an upper connection wiring of a display device according to one or more other embodiments.

FIG. 34 is a layout diagram illustrating a structure of a first pad and an upper connection wiring of a display device according to one or more other embodiments.

Referring to FIG. 34, it is shown that a plurality of first peeling portions CNEc_1 may be located in a display device 10_1. For example, the plurality of first peeling portions CNEc_1 may be arranged in parallel to be spaced apart from each other in the second direction DR2.

As described above, physical friction acting in a process of forming a chamfered surface of a display device manufacturing method has a relation proportional to a width W3_1 of the first peeling portion CNEc_1, and accordingly, the physical friction acting in the process of forming the chamfered surface of the display device manufacturing method may be reduced or minimized by making the width W3_1 of the first peeling portion CNEc_1 of the display device 10_1 less than the width W3 of the first peeling portion CNEc of the display device 10 according to one or more previously described embodiments.

However, in general, when a width of a wiring becomes narrow, a resistance value acting on the wiring increases, and thus the flow of current may be interrupted. In other words, when one first peeling portion CNEc_1 is located, the flow of current may be interrupted due to a resistance value that increases as the width W3_1 of the first peeling portions CNEc_1 decreases.

Accordingly, the plurality of first peeling portions CNEc_1 may be located so that a resistance value applied to each of the first peeling portions CNEc_1 may be lowered, while also physical friction acting in the process of forming the chamfered surface of the display device manufacturing method may be reduced or minimized. The above-described structure may also be applied to a second pad PAD2.

Figure 35:
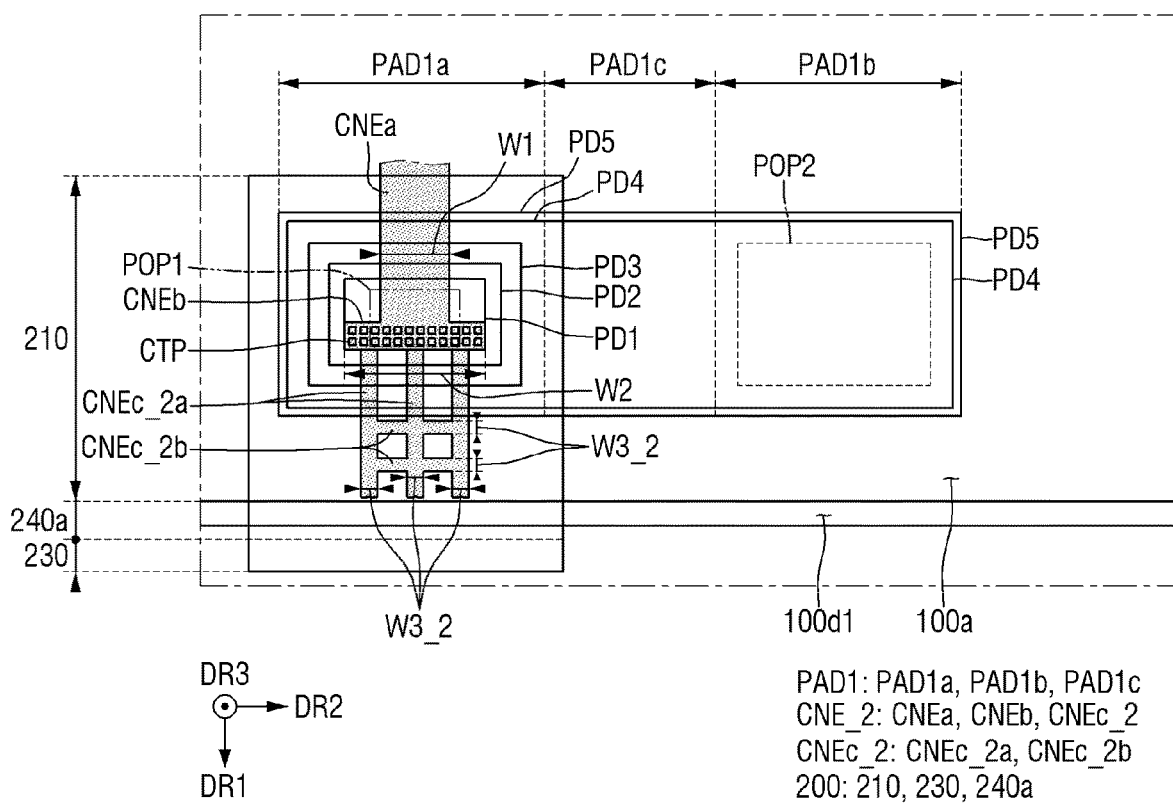
FIG. 35 is a layout diagram illustrating a structure of a first pad and an upper connection wiring of a display device according to still one or more other embodiments.

FIG. 35 is a layout diagram illustrating a structure of a first pad and an upper connection wiring of a display device according to still one or more other embodiments.

Referring to FIG. 35, it is shown that a first peeling portion CNEc_2 may be formed in a mesh type in a display device 10_2. For example, the first peeling portion CNEc_2 of the display device 10_2 may include a vertical peeling portion CNEc_2a extending in the first direction DR1 and a horizontal peeling portion CNEc_2b extending in the second direction DR2.

As described above, physical friction acting in a process of forming a chamfered surface of a display device manufacturing method has a relation proportional to a width W3_2 of the first peeling portion CNEc_2, and accordingly, the physical friction acting in the process of forming the chamfered surface of the display device manufacturing method may be reduced or minimized by making the width W3_2 of the first peeling portion CNEc_2 less than the width W3 of the first peeling portion CNEc, while also a resistance value applied to the first peeling portion CNEc_2 may be reduced by forming the first peeling portion CNEc_2 in a mesh type. The above-described structure may also be applied to a second pad PAD2.

In some embodiments, the width of the vertical peeling portion CNEc_2a and the width of the horizontal peeling portion CNEc_2b may be substantially the same, but the disclosure is not limited thereto. For example, the horizontal peeling portion CNEc_2b may have a greater width than the vertical peeling portion CNEc_2a.

Figure 36:
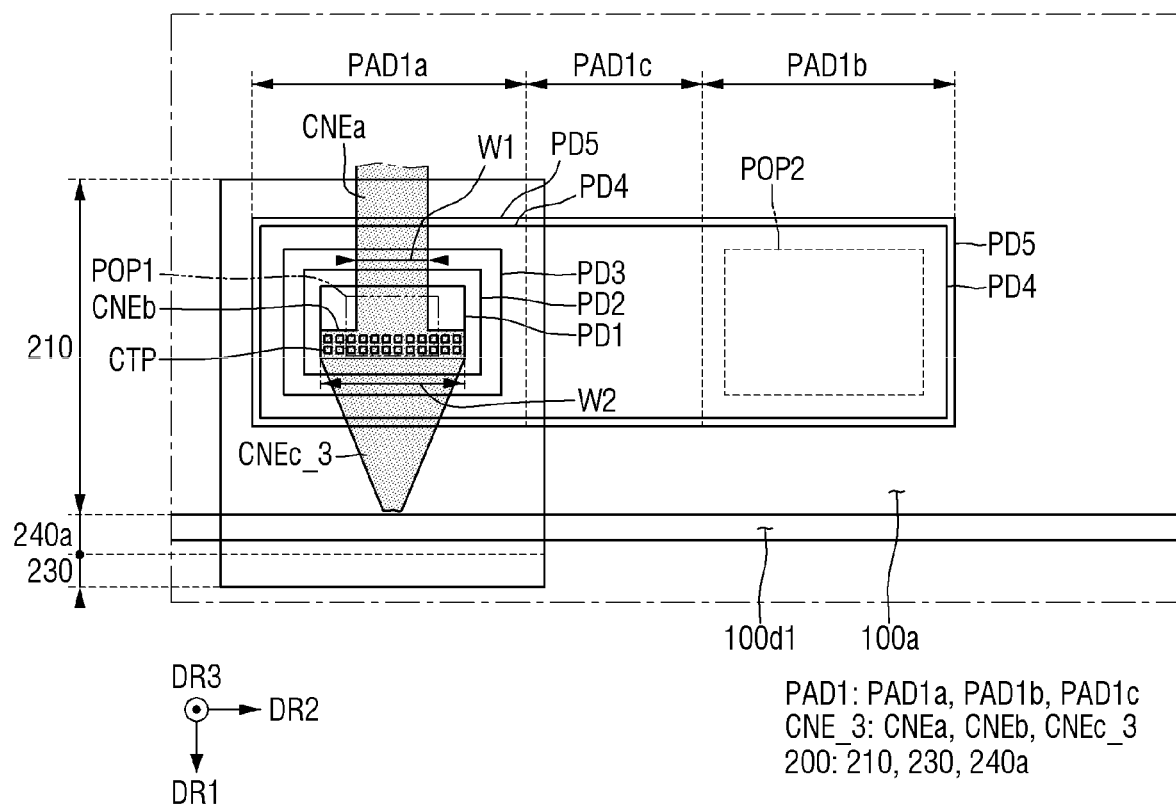
FIG. 36 is a layout diagram illustrating a structure of a first pad and an upper connection wiring of a display device according to yet one or more other embodiments.

FIG. 36 is a layout diagram illustrating a structure of a first pad and an upper connection wiring of a display device according to yet one or more other embodiments.

Referring to FIG. 36, it is shown that a display device 10_3 may have a shape in which a width of a first peeling portion CNEc_3 decreases in a direction toward a first chamfered surface 100d1, that is, toward one side of the first direction DR1. For example, the first peeling portion CNEc_3 of the display device 10_3 may have a width that is substantially the same as a width W2 of a first contact portion CNEb at a portion in contact with the first contact portion CNEb, and may have a reduced or minimum width at a portion adjacent to a first chamfered surface 100d1.

Accordingly, a resistance value applied to the first peeling portion CNEc_3 may be decreased as an area of the first peeling portion CNEc_3 is secured, while also physical friction acting in a process of forming a chamfered surface of a display device manufacturing method may be reduced or minimized as the first peeling portion CNEc_3 has a reduced or minimum width in a portion adjacent to the first chamfered surface 100d1. The above-described structure may also be applied to a second pad PAD2.

Accordingly, a display device according to one or more embodiments can improve device reliability. Further, a display device manufacturing method according to one or more embodiments can provide a display device with improved device reliability.

In concluding the detailed description, those skilled in the art will appreciate that many variations and modifications can be made to the embodiments without substantially departing from the aspects of the present disclosure. Therefore, the disclosed embodiments of the disclosure are used in a generic and descriptive sense only and not for purposes of limitation.

What is claimed is:

1. A display device comprising:
a substrate comprising a first surface, a second surface opposite to the first surface, a first chamfered surface extending from one side of the first surface, a second chamfered surface extending from one side of the second surface, and a first side surface between the first chamfered surface and the second chamfered surface;
a first pad on the first surface of the substrate; and
an upper connection wiring on the first surface of the substrate, between the substrate and the first pad, electrically connected to the first pad, and comprising:
a first contact portion electrically connected to the first pad; and
a first peeling portion extending from the first contact portion in a direction toward the first chamfered surface, and having a width that is less than a width of the first contact portion.

2. The display device of claim 1, wherein the first peeling portion extends toward a boundary between the first surface and the first chamfered surface.

3. The display device of claim 1, further comprising flip-chip type micro light-emitting diode (LED) elements on the first surface of the substrate.

4. The display device of claim 2, wherein the first surface comprises a display area in which pixels are located, and a pad area positioned on one side of the display area, in which the first pad is located, and more adjacent to the first chamfered surface than the display area, and
wherein the upper connection wiring further comprises a first wiring portion extending from the first contact portion in a direction toward the display area and electrically connected to the pixels.

5. The display device of claim 2, further comprising first peeling portions that comprise the first peeling portion and that are spaced apart from each other.

6. The display device of claim 5, further comprising a bottom connection wiring comprising a second peeling portion extending in the direction in which the first peeling portion extends.

7. The display device of claim 2, further comprising:
a second pad on the second surface; and
a side wiring on the first surface, the first chamfered surface, the first side surface, the second chamfered surface, and the second surface, and configured to electrically connect the first pad and the second pad.

8. The display device of claim 7, wherein the second pad comprises a first portion overlapping the side wiring, and a second portion that is spaced apart from the first portion and does not overlap the side wiring,
wherein the first portion of the second pad comprises:
a second contact portion in contact with the side wiring; and
a second peeling portion extending from the second contact portion in a direction toward the second chamfered surface, and having a width that is less than a width of the second contact portion.

9. The display device of claim 8, further comprising a bottom connection wiring between the second pad and the second surface of the substrate, and electrically connecting the first portion and the second portion of the second pad.

10. A tiled display device comprising:
display devices; and
a seam part between the display devices,
wherein a first display device among the display devices comprises:
a substrate comprising a first surface, a second surface opposite to the first surface, a first chamfered surface extending from one side of the first surface, a second chamfered surface extending from one side of the second surface, and a first side surface connecting the first chamfered surface and the second chamfered surface;
a light-emitting element on the first surface;
a first pad on the first surface and spaced from the light-emitting element; and
an upper connection wiring on the first surface between the substrate and the first pad, configured to electrically connect the first pad and the light-emitting element, and comprising a first contact portion electrically connected to the first pad, and a first peeling portion extending from the first contact portion in a direction toward the first chamfered surface and having a width that is less than a width of the first contact portion.

11. The tiled display device of claim 10, wherein the light-emitting element comprises a flip-chip type micro light-emitting diode (LED) element.

12. The tiled display device of claim 10, wherein the substrate comprises glass.

13. The tiled display device of claim 10, wherein the first display device further comprises a side wiring that is on the first surface, the second surface, and the first side surface of the substrate, and that is connected to the first pad.

14. The tiled display device of claim 13, wherein the first display device further comprises:
a bottom connection wiring on the second surface of the substrate; and
a flexible film connected to the bottom connection wiring through a conductive adhesive member, and
wherein the side wiring is connected to the bottom connection wiring.

15. The tiled display device of claim 10, wherein the display devices are arranged in matrix form.

16. A display device manufacturing method comprising:
preparing a mother substrate in which a scribing line defining cell areas is defined;
forming an upper connection wiring pattern on an upper surface of the cell areas;
forming a first pad on, and electrically connected to, the upper connection wiring pattern;
scribing one of the cell areas from the mother substrate to obtain a cell substrate; and
forming a chamfered surface by processing an edge of the cell substrate,
wherein the upper connection wiring pattern comprises a first contact portion electrically connected to the first pad, and a first peeling portion pattern extending from the first contact portion in a direction toward the scribing line and having a width that is less than a width of the first contact portion.

17. The display device manufacturing method of claim 16, wherein the forming of the chamfered surface comprises forming a first peeling pattern at an end of the first peeling portion pattern by processing the end of the first peeling portion pattern.

18. The display device manufacturing method of claim 17, wherein the forming of the first peeling pattern at the end of the first peeling portion pattern is performed concurrently with the processing of the edge of the cell substrate.

19. The display device manufacturing method of claim 18, wherein the forming of the upper connection wiring pattern and the forming the first pad comprise forming a second pad pattern on a bottom surface of the cell areas of the mother substrate,
wherein the second pad pattern comprises a second peeling portion pattern extending in a direction toward the scribing line.

20. The display device manufacturing method of claim 19, wherein the forming of the chamfered surface further comprises forming a second peeling pattern at an end of the second peeling portion pattern by processing the end of the second peeling portion pattern.

* * * * *